United States Patent [19]

Shimoyashiro et al.

[11] Patent Number: 5,536,128
[45] Date of Patent: Jul. 16, 1996

[54] METHOD AND APPARATUS FOR CARRYING A VARIETY OF PRODUCTS

[75] Inventors: Sadao Shimoyashiro, Fujisawa; Takemasa Iwasaki, Yokohama; Hiroyuki Kawaji, Yokohama; Toyohide Hamada, Yokohama; Minoru Ikeda, Yokohama; Hiroshi Kikuchi, Hiratsuka; Hiroto Nagatomo, Tokyo, all of Japan

[73] Assignee: Hitachi, Ltd., Tokyo, Japan

[21] Appl. No.: 76,190

[22] Filed: Jun. 14, 1993

Related U.S. Application Data

[63] Continuation-in-part of Ser. No. 425,411, Oct. 20, 1989, abandoned.

[30] Foreign Application Priority Data

Oct. 21, 1988 [JP] Japan .................................. 63-263903

[51] Int. Cl.$^6$ .................................... B65G 1/04
[52] U.S. Cl. .......................... 414/273; 414/222; 414/939; 414/940; 414/935; 414/217; 364/468.28; 29/469; 198/347.4; 118/719
[58] Field of Search .................................. 414/222, 225, 414/226, 416, 417, 331, 273, 286, 271, 277, 744.2, 935, 744.8, 939, 940, 283, 786; 118/500, 719, 728, 729, 730, 50, 50.1; 204/298.23, 298.25; 364/468, 478, 403; 198/347.1, 347.4, 349.1, 341; 29/469

[56] References Cited

U.S. PATENT DOCUMENTS

| | | | |
|---|---|---|---|
| 3,796,327 | 3/1974 | Meyer et al. | 414/222 |
| 4,027,246 | 5/1977 | Caccoma et al. | 364/468 |
| 4,268,219 | 5/1981 | Nakagawa et al. | 414/222 X |
| 4,405,435 | 9/1983 | Tateishi et al. | 414/217 X |
| 4,550,242 | 10/1985 | Uehara et al. | 414/331 X |
| 4,719,694 | 1/1988 | Herberich et al. | 414/222 X |
| 4,833,306 | 5/1989 | Milbrett | 414/331 X |
| 4,845,843 | 7/1989 | Babcock | 414/225 X |
| 4,851,018 | 7/1989 | Lazzari et al. | 414/217 X |
| 4,867,629 | 9/1989 | Iwasawa et al. | 414/217 X |
| 4,932,828 | 6/1990 | Katae et al. | 414/331 X |
| 4,951,601 | 8/1990 | Maydan et al. | 414/217 X |
| 4,958,292 | 9/1990 | Kaneko et al. | 364/468 |

FOREIGN PATENT DOCUMENTS

| | | | |
|---|---|---|---|
| 19635 | 12/1981 | Japan . | |
| 56-169343 | 12/1981 | Japan . | |
| 36001 | 2/1984 | Japan | 414/331 |
| 143623 | 7/1985 | Japan . | |
| 48038 | 3/1987 | Japan . | |
| 107944 | 5/1987 | Japan | 364/468 |
| 121106 | 6/1987 | Japan | 414/416 |
| 185336 | 8/1987 | Japan . | |
| 213259 | 9/1987 | Japan | 414/286 |
| 299022 | 12/1987 | Japan | 364/468 |
| 29923 | 2/1988 | Japan . | |
| 105877 | 5/1988 | Japan | 364/468 |
| 8606245 | 10/1986 | WIPO | 414/225 |

*Primary Examiner*—Frank E. Werner
*Attorney, Agent, or Firm*—Fay, Sharpe, Beall, Fagan, Minnich & McKee

[57] ABSTRACT

An apparatus for carrying a variety of products for effectively processing and carrying plural kinds of works such as semiconductor wafers includes a plurality of processing stations for processing plural kinds of works, a carriage system for carrying plural kinds of works, and a transfer system for delivering works between the carriage system and a processing station. A method for carrying a variety of products is realized in which the carriage system simultaneously carries plural kinds of works between the plurality of processing stations and stops at a predetermined position of the transfer system, whereas the transfer system identifies and delivers the desired kind of work to and from the carriage system.

4 Claims, 51 Drawing Sheets

FIG. 14

| ORDER OF PROCESS / PRODUCT | 1 | 2 | 3 | 4 | --- |
|---|---|---|---|---|---|
| $a_1$ | a | b | c | d | --- |
| $b_1$ | r | s | t | u | --- |
| $a_2$ | a | b | c | d | --- |
| ⋮ | ⋮ | ⋮ | ⋮ | ⋮ | ⋮ |

| ORDER OF PROCESS / PRODUCT GROUP | 1 | 2 | 3 | 4 | --- |
|---|---|---|---|---|---|
| A $\begin{pmatrix} a_1 \\ a_2 \\ \vdots \end{pmatrix}$ | a | b | c | d | --- |
| B $\begin{pmatrix} b_1 \\ b_2 \\ \vdots \end{pmatrix}$ | r | s | t | u | --- |
| C $\begin{pmatrix} c_1 \\ c_2 \\ \vdots \end{pmatrix}$ | m | n | o | p | --- |
| ⋮ | ⋮ | ⋮ | ⋮ | ⋮ | ⋮ |

| PRODUCT GROUP \ ORDER OF PROCESS | 1 | 2 | 3 | 4 | --- |
|---|---|---|---|---|---|
| A | 2 | 4 | 1 | 3 | --- |
| B | 1 | 3 | 2 | 7 | --- |
| C | 4 | 6 | 5 | 4 | --- |
| ⋮ | ⋮ | ⋮ | ⋮ | ⋮ | ⋮ |

| PRODUCT GROUP \ ORDER OF PROCESS | 1 | 2 | 3 | 4 | --- |
|---|---|---|---|---|---|
| A | 2 | 4 | 0 | 5 | --- |
| B | 1 | 3 | 5 | 8 | --- |
| C | 3 | 5 | 4 | 4 | --- |
| ⋮ | ⋮ | ⋮ | ⋮ | ⋮ | ⋮ |

~123

(I) — · · — · · — ACCUMULATED LIMIT LOAD (II) — — — — — — ACCUMULATED CONSTANT LOAD (III) — · — · — · — ACCUMULATED MOST DELAYED LOAD (IV) ——————— AVERAGE LOAD

| TERMS | SYMBOL | FORMULA | DEFINITION |
|---|---|---|---|
| DEMAND | $P_{ji}$ |  | DEMAND OF PRODUCT i OF PRODUCT GROUP j |
| TOTAL DE-MANDED PRODUC-TION | X | $X = \sum_{j=1, i=1}^{M, N(j)} P_{ji}$<br>(j = 1, 2,...,M,<br>i = 1, 2, ..., N(j)) | GRAND TOTAL OF DEMAND |
| INTERVAL | $\ell_j$ | — | INTERVAL FROM CHARGE OF PRODUCT GROUP j TO RE-CHARGE OF PRODUCT GROUP j. HERE, PROCESSING TIME FOR ONE WAFER IS NOT DIFFERENT DEPENDING ON PRODUCTS, AND UNIT LENGTH OF THE INTERVAL IS EQUAL TO THE PROCESSING TIME FOR ONE WAFER. THEREFORE, IF WAFERS OF THE SAME PRODUCT GROUP ARE CONTINUOUSLY CHARGED, THE INTERVAL IS 1. FOR THE FIRST TIME OF A PLANNING PERIOD, THE INTERVAL OF ALL PRODUCTS IS 1. |
|  | $\ell_{ji}$ | — | INTERVAL FROM CHARGE OF PRODUCT i OF PRODUCT GROUP j TO RE-CHARGE OF PRODUCT i OF PRODUCT j, SUPPOSING THAT THE PRODUCT GROUP j IS CONTINUOUSLY CHARGED, TAKING THE CLOSURE INTO CONSIDERATION WITHIN THE GROUP, IN THE CASE WHERE THE CHARGE ORDER BY PRODUCT IS DETERMINED IN THE PRODUCT GROUP j. |
| INTERVAL REFER-ENCE | $\ell_{oj}$ | $\ell_{oj} = \dfrac{X}{\sum_{i=1}^{N(j)} P_{ji}}$ | INTERVAL IN THE CASE WHERE THE PRODUCT GROUP j IS CHARGED ON AN AVERAGE IN AN OBJECT PERIOD, NAMELY, IN THE CASE WHERE THE PRODUCT GROUP j ARE CHARGED AT EQUI-INTERVALS. |
|  | $\ell_{oji}$ | $\ell_{oji} = \dfrac{\sum_{i=1}^{N(j)} P_{ji}}{P_{ji}}$ | INTERVAL IN THE CASE WHERE THE PRODUCT i ARE CHARGED AT EQU-INTERVALS, SUPPOSING THAT THE PRODUCT GROUP j IS CONTINUOUSLY CHARGED, TAKING THE CLOSURE INTO CONSIDERATION IN THE PRODUCT GROUP j. |
| NORMAL-IZED INTERVAL | $Z_{oj}$ | $Z_{oj} = \dfrac{\ell_j}{\ell_{oj}}$ | NORMALIZED INTERVAL IN PRODUCT GROUP j. ONE HAVING A LARGER VALUE IS FIRST PROCESSED. |
|  | $Z_{oji}$ | $Z_{oji} = \dfrac{\ell_{ji}}{\ell_{oji}}$ | NORMALIZED INTERVAL IN PRODUCT i OF PRODUCT GROUP j. ONE HAVING A LARGER VALUE IS FIRST PROCESSED. |

*FIG. 29*

| DELIVERY TERM (DAY) | DEMAND (PCS) | | | | | | | | | | | TOTAL DEMAND PER DAY (PCS) | ACCUMULATED LOAD |
|---|---|---|---|---|---|---|---|---|---|---|---|---|---|
| | A | | | | B | | | | C | | | | |
| | a1 | a2 | a3 | a4 | b1 | b2 | b3 | b4 | c1 | c2 | c3 | | |
| 1 | 2 | 1 | 1 | 1 | 1 | 2 | 2 | 0 | 1 | 1 | 0 | 12 | 12 |
| 2 | 0 | 1 | 1 | 0 | 0 | 0 | 1 | 1 | 0 | 1 | 2 | 7 | 19 |
| 3 | 1 | 1 | 0 | 1 | 2 | 0 | 1 | 0 | 1 | 1 | 0 | 8 | 27 |
| 4 | 0 | 1 | 1 | 2 | 0 | 0 | 1 | 2 | 1 | 2 | 2 | 12 | 39 |
| 5 | 1 | 1 | 3 | 0 | 2 | 0 | 0 | 1 | 2 | 1 | 0 | 11 | 50 |
| 6 | 0 | 3 | 0 | 0 | 1 | 3 | 0 | 0 | 0 | 1 | 1 | 9 | 59 |

(I) —··—··— ACCUMULATED LIMIT LOAD (II) ———— ACCUMULATED CONSTANT LOAD (III) —·—·— ACCUMULATED MOST DELAY LOAD (IV) ——— STANDARDIZED LOAD

FIG. 32

| DATE OF DEMAND (DAY) | 1 | 2 | 3 | 4 | 5 | 6 |
|---|---|---|---|---|---|---|
| STANDARDIZED DEMAND (PCS) | 12 | 9 | 10 | 9 | 10 | 9 |

FIG. 33

| DELIVERY TERM | PRODUCT GROUP | DEMAND OF STANDARD SCHEDULE | STANDARDIZED DEMAND | ORDER OF DEMAND |||||||||||||
|---|---|---|---|---|---|---|---|---|---|---|---|---|---|---|---|
| | | | | 1 | 2 | 3 | 4 | 5 | 6 | 7 | 8 | 9 | 10 | 11 | 12 |
| 1 | A | 5 | 12 | A | B | A | B | A | C | B | A | B | A | B | C |
| 1 | B | 5 | | | | | | | | | | | | | |
| 1 | C | 2 | | | | | | | | | | | | | |
| 2 | A | 2 | 9 | A | C | B | C | A | C | B | | | | | |
| 2 | B | 2 | | | | | | | | | | | | | |
| 2 | C | 3 | | | | | | | | | | | | | |
| 3 | A | 3 | 10 | A | B | C | A | B | C | A | B | | | | |
| 3 | B | 3 | | | | | | | | | | | | | |
| 3 | C | 2 | | | | | | | | | | | | | |
| 4 | A | 4 | 9 | C | A | C | B | A | C | B | A | C | B | A | C |
| 4 | B | 3 | | | | | | | | | | | | | |
| 4 | C | 5 | | | | | | | | | | | | | |
| 5 | A | 5 | 10 | A | B | A | C | A | B | A | C | A | B | A | C |
| 5 | B | 3 | | | | | | | | | | | | | |
| 5 | C | 3 | | | | | | | | | | | | | |
| 6 | A | 3 | 9 | A | B | A | B | C | A | B | B | C | B | C | |
| 6 | B | 4 | | | | | | | | | | | | | |
| 6 | C | 2 | | | | | | | | | | | | | |

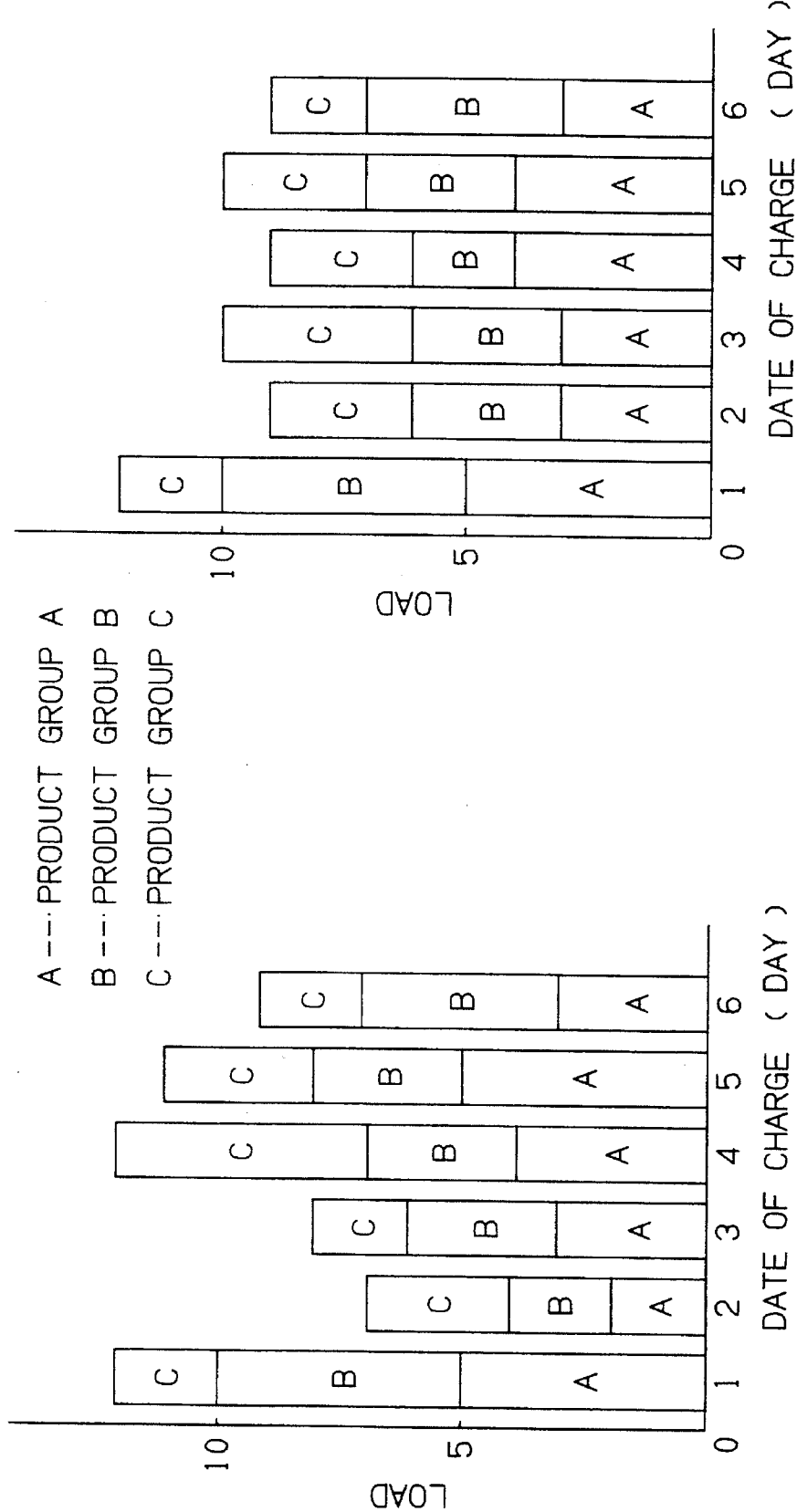

FIG. 36

| DATE OF DEMAND | CLASSIFICATION OF PRODUCTS | STANDARDIZED DEMAND | ORDER OF DEMAND ||||||||||||
|---|---|---|---|---|---|---|---|---|---|---|---|---|---|---|
| | | | 1 | 2 | 3 | 4 | 5 | 6 | 7 | 8 | 9 | 10 | 11 | 12 |
| 1 | PRODUCT GROUP | 12 | A | B | A | B | A | C | B | A | B | A | B | C |
| | PRODUCT | | a1 | b2 | a1 | b3 | a2 | c1 | b1 | a3 | b2 | a4 | b3 | c2 |
| 2 | PRODUCT GROUP | 9 | A | C | B | C | A | C | B | A | B | | | |
| | PRODUCT | | a2 | c3 | b4 | c2 | a3 | c3 | b3 | a1 | b2 | | | |
| 3 | PRODUCT GROUP | 10 | C | A | B | C | A | B | C | A | C | B | | |
| | PRODUCT | | c1 | a4 | b1 | c2 | a2 | b3 | c3 | a3 | c2 | b4 | | |
| 4 | PRODUCT GROUP | 9 | A | C | B | A | C | B | A | C | A | | | |
| | PRODUCT | | a4 | c1 | c1 | a2 | c3 | b4 | a4 | c2 | a3 | | | |
| 5 | PRODUCT GROUP | 10 | B | A | A | B | B | A | C | A | B | C | | |
| | PRODUCT | | b1 | a1 | c1 | a3 | b1 | a2 | c1 | a3 | b4 | c2 | | |
| 6 | PRODUCT GROUP | 9 | A | B | A | B | C | A | B | B | C | | | |
| | PRODUCT | | a2 | b2 | a2 | b2 | c3 | a2 | b1 | b2 | c2 | | | |

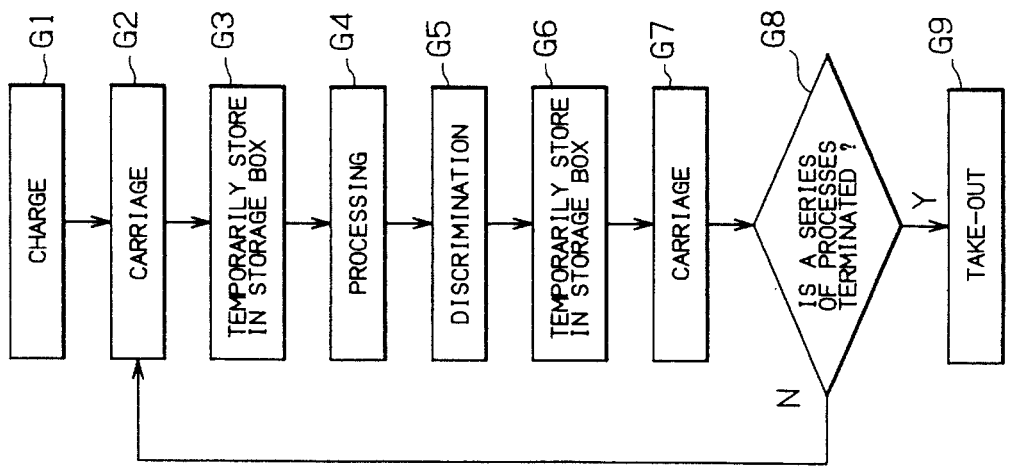
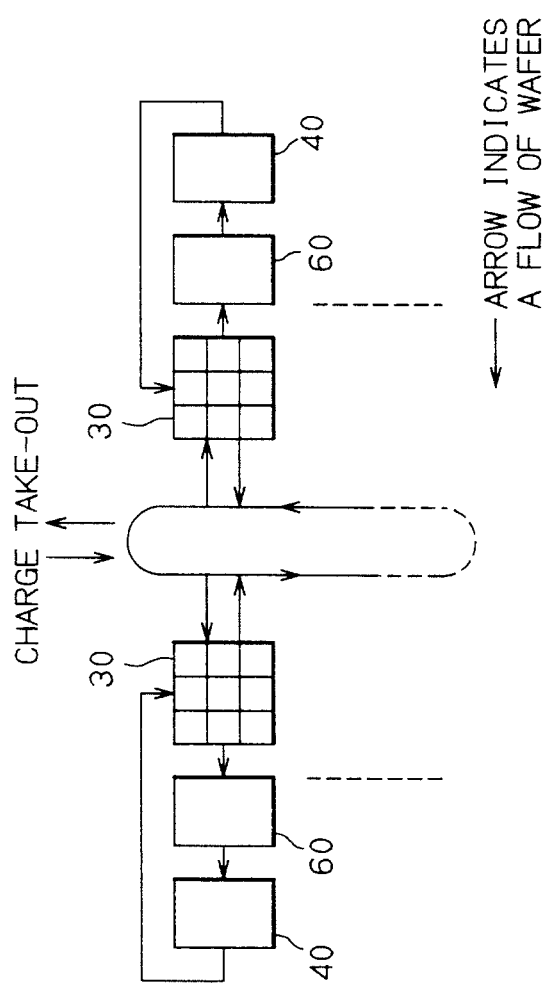

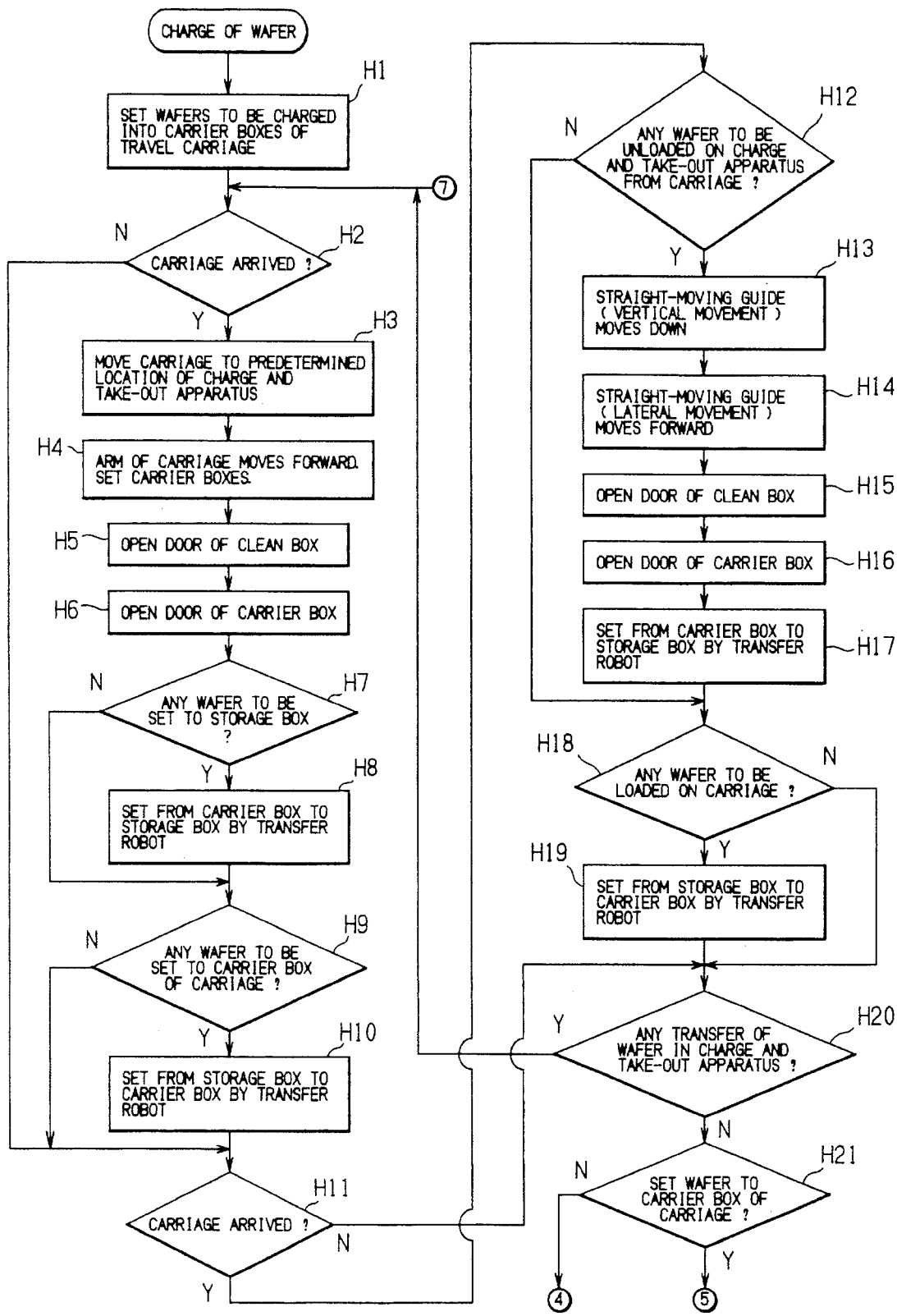

METHOD AND APPARATUS FOR CARRYING A VARIETY OF PRODUCTS

This application is a continuation-in-part of application Ser. No. 07/425,411, filed Oct. 20, 1989, now abandoned.

BACKGROUND OF THE INVENTION

1. Field of the Invention

The present invention relates to a system for the production of semiconductors or the like, and more particularly to a method and apparatus for carrying a variety of products and for controlling the flow of articles to be processed by the structure of carriage equipment. The invention further relates to the structure of the processing apparatus and the control thereof in order to realize a carriage system suitable for a production line for a variety of flexible products.

2. Description of the Related Art

In the past, a production line in a semiconductor manufacturing factory has been divided into a working area which requires a clean atmosphere in which processing apparatuses for processing, carrying and storing wafers are installed, and a preservation area, which has less stringent requirements for cleanliness, in which accessory equipment and utilities are installed, as disclosed in Japanese Patent Application Laid-Open No. 19635/1981 and the like. Therefore, there has been employed a construction called a bay system in which working areas and preservation areas are alternately provided to the left and right of a central passage in order to effectively arrange the aforementioned apparatuses. The arrangement of the processing apparatuses relies upon a so-called job shop system in which the same kind of processing apparatuses are arranged in one bay in the bay system.

The carriage of wafers has been carried out by putting wafers into a cassette (sometimes called a carrier) and receiving the cassette into a cassette case, as shown in Japanese Patent Application Laid-Open No. 29923/1988.

In the bay system, the carriage of wafers between the processing apparatuses consists of a carriage in the bay and a carriage between bays, with a stocker for receiving cassettes provided at an exit of the bay constituting a connection point therebetween. Namely, the carriage in the bay is to carry the cassette from the stocker for the cassette provided at the inlet of the bay, and the carriage between the bays is to carry the cassettes from the stocker for one bay to the stocker for another bay. Therefore, the carriage of wafers from one processing apparatus to the other has been generally carried out in the course of the carriage in the bay→stocker→carriage between the bays→stocker→carriage in the bay.

An example of a railless carriage is a carriage called an AGV (Automatic Guided Vehicle), which carries several cassettes loaded at a low speed. An example of a rail-carriage that carries several cassettes loaded thereon as shown in Japanese Patent Application Laid-Open No. 185336/1987.

The charging of a wafer into the processing apparatus has been carried out in a manner such that a self-propelled robot handles one cassette as disclosed in Japanese Patent Application Laid-Open No. 48038/1987. Namely, when wafers are processed, the self-propelled robot takes out a cassette from the stocker and travels to a position in front of the processing apparatus to deliver the cassette to a loader portion to charge a wafer into the apparatus. When all the wafers stored in the cassette have been processed, the self-propelled robot travels to a position in front of the processing apparatus to remove the cassette from the loader portion and travels to the stocker to store cassettes in the stocker.

For the purpose of cleanliness, generally, the preservation area in which the accessory equipment and utilities are installed and the working area in which the processing apparatus is installed are alternately provided to left and right of the central passage. As a further example, the accessory equipment and utilities are provided on the first floor and the processing apparatus is installed on the second floor so that the processing apparatus can be laid out freely. Alternatively, there has been proposed a system for providing a partial clean room as disclosed in Japanese Patent Application Laid-Open No. 143623/1985. This system is done by setting a box containing a cassette to an interface provided on the processing apparatus in advance of when a wafer is charged into the processing apparatus in order to keep the clean area space to a minimum. In this manner, the wafer is delivered in a clean state, cutting off the atmosphere from the outside.

However, the conventional production systems possess the following problems.

First, the semiconductor process has many process steps, and many of the same steps are repeated. Therefore, in the conventional bay system, the carriage course between the bays becomes complicated and slow. In addition, since the state of the apparatus in pre-process and of that in post-process is known, the apparatuses are difficult to synchronize. Therefore, the quantity of inventory increases in each bay, as a consequence of which the term of work becomes extended. Even if the production line is of the flow shop system variety, the process flow differs by product, and therefore, it cannot cope with the production of a variety of products. In addition, since the process often changes and products are frequently switched, it is contemplated that the lay-out has to be frequently changed.

Furthermore, in charging wafers into the processing apparatus, wafers have to be charged into the processing apparatus arranged within one bay by one and the same self-propelled robot. However, in the current apparatus for manufacturing semiconductors, the height and depth of position at which a cassette is charged and the direction of cassette travel differ for each processing apparatus, only the processing apparatus in which the self-propelled robot traveling within the bay can charge the cassette is installed in one bay, and selection and lay-out of the processing apparatus are subjected to many restrictions. Moreover, where a processing apparatus is newly introduced, there is a possibility that the apparatus cannot be used in terms of restriction of the self-propelled robot.

Furthermore, since the processing apparatus is distanced form the stocker for storing cassettes, it takes time to some extent to charge a cassette into the processing apparatus. Since one self-propelled robot is provided for several processing apparatuses, cassettes cannot be simultaneously charged into a plurality of processing apparatuses. The availability factor of the processing apparatuses is thus suppressed to a lower level due to these factors.

With respect to a bay system which is maintained at high cleanliness, the space for requiring cleanliness is large, and it requires a huge investment to maintain high cleanliness, thus increasing operating costs. In addition, since the wafers are not separated from an operator in terms of atmosphere, it is very difficult to maintain the interior of a clean room at high cleanliness.

On the other hand, in the system for setting the cassette box to the interface, wafers are received into the cassette and closed, and therefore it is difficult to handle them one by one. In addition, since the atmosphere surrounding the wafer is still, once dust occurs, it cannot be removed and the dust may adhere to the wafers.

In semiconductors, a variety of products are required in a small quantity for each product as represented by ASIC. The trend is that production demand of a variety of products in small quantities will likely increase in the future. Therefore, the lot size may become so small that only ten sheets or so are received in a cassette having a capacity for 25 sheets. Also, the lot size differs with the products. Therefore, the number of cassettes which have to be carried increases despite the same production quantity as for the prior art, thus requiring higher carriage capability than in the prior art.

Moreover, there is a growing need for the diameter of a semiconductor wafer to increase from 4 inches to five inches, and to six inches as compared with the prior art. There is further a possibility that the diameter of a wafer will increase to eight inches in the future. Therefore, the carriage of wafers by cassette unit will become increasingly complex.

Furthermore, current processing apparatuses utilize single-wafer processing which processes wafers sheet by sheet.

As described above, it is expected that the trend of the production of a variety of products in a small quantity, the increasing diameter of wafers and the employment of apparatus for processing a single wafer will continue. Under these circumstances, it is very difficult to collectively manage about 25 wafers by cassette unit in the light of the optimum lot size and the weight of a cassette for the production of a variety of products in small quantities.

SUMMARY OF THE INVENTION

It is an object of the present invention to provide a method and apparatus for carrying a variety of products which can simultaneously carry plural kinds of workpieces and can effect processing operations according to the kinds of workpieces.

It is a further object of the present invention to provide a method and apparatus for carrying a variety of products which can control workpieces one by one.

It is another object of the present invention to provide a method and apparatus for carrying a variety of products, which method and apparatus can provide a threshold cleanliness level.

It is still another object of the present invention to provide a method and apparatus for carrying a variety of products, which method and apparatus can make an interface between a carrying unit and a processing unit common to each other so as to meet a change in various processes.

It is another object of the present invention to provide a method and apparatus for carrying a variety of products, including control of a flow of workpieces and improved availability of the processing unit.

To achieve the aforementioned objects, the present invention realizes a method for carrying a variety of products comprising a plurality of processing means for processing plural kinds of workpieces, carrying means for carrying plural kinds of workpieces and transfer means for delivering workpieces between said carrying means and said processing means, said carrying means simultaneously carrying plural kinds of workpieces between said plurality of processing means and stopping at a predetermined position of said transfer means, said transfer means recognizing the desired kind of workpieces at said carrying means to deliver the workpieces.

The present invention further realizes an apparatus for carrying a variety of products comprising carrying means which travels between a plurality of processing means while being simultaneously loaded with plural kinds of workpieces, stops at a predetermined position relative to transfer means for workpieces provided in connection with said processing means, and transfer means which recognizes the desired kind of workpieces carried by said carrying means to deliver the workpieces.

First, as a processing apparatus for processes which often include continuous processing operations (for example, resist-coating →exposure→development and cleaning→diffusion) among the semiconductor processes, an apparatus (for example, a transfer robot) for transferring a wafer from a first processing apparatus to a second processing apparatus is installed between the processing apparatuses to integrate the processing apparatuses (hereinafter, such a connected apparatus is also called an integrated processing apparatus) into a flow shop. These integrated processing apparatuses are arranged around a track-like carrying passage (for example, film-forming→photoetching →film-forming→. . . ) for manufacturing semiconductors. In the case where a plurality of integrated processing apparatuses of the same kind are required in view of the line balance, the same kind of integrated processing apparatuses are gathered at one place in order to effectively operate the processing apparatuses. Each integrated processing apparatus is provided with a device having a function for storing wafers and a function for delivering wafers between the carriage and the processing apparatus. That is, each integrated processing apparatus is provided with a transfer robot corresponding to a method for charging wafers and a device provided with storage boxes for controlling and storing wafers one by one that are carried by the carriage.

Only the wafers are carried between the integrated processing apparatuses. That is, wafers are not put into a cassette, and the cassette into a cassette case. Instead, a mechanism for holding wafers similar to the cassette is mounted on a part of the carriage to carry only the wafers. Each box is provided with a sensor for confirming the presence or absence of a wafer, and products and processing records are stored for each box. The carriage moves around to all the integrated processing apparatuses, and when the carriage arrives in front of an integrated processing apparatus, it picks up a processed wafer from the processing apparatus and unloads a wafer to be processed by the processing apparatus.

Since wafers are preferably controlled one by one, a wafer number comprising a product and a serial number by product group is noted on each wafer, and wafers are controlled according to the wafer number. The processing records for wafers are controlled by a computer for use with the entire process-control. In automation, the wafer number of a wafer is discriminated after processing to make sure that the wafer was not erroneously processed by the processing apparatus or defective.

Wafers are received and completely sealed during carriage for the purpose of cleanliness. When wafers are charged from the carriage into the processing apparatus, the circumference of the processing apparatus is isolated from the clean atmosphere in order to maintain only the atmosphere at high cleanliness, and only the transfer robot, storage boxes and a part of the processing apparatus are cleaned. For this cleanliness, a dust-removing filter such as a HEPA filter and a blower are provided on the upper surface, and the floor surface is of a grating construction so as to provide a vertical laminar flow.

In the construction of the line, the same classes of product group and process group are grouped, and storage boxes are provided in front of processing equipment to store wafers to be charged into the processing apparatus by product group and process group one by one, or wafers processed by and moved out of the processing apparatus. The processing apparatuses are connected by carriage equipment for carrying wafers loaded thereon to control a flow of wafers according to what product group and what process group of wafers are charged from the storage boxes into the processing apparatus, or whether processed wafers are carried out. Thereby, the order of the flow can be controlled between the processing apparatuses, suitable wafers are carried so as to maintain the order and quantity of wafers based on the plan, and the wafers flow as if on an exclusive line by product group.

A wafer number, which is a serial number representing a product and a product group of wafers, is attached to a wafer itself before the wafer is processed, whereby wafers can be controlled one by one and wafers are discriminated by a discriminator so that the wafer can be confirmed by the wafer itself. The processes to which the charged wafer has been subjected can thus be accurately known at a single wafer unit.

In the processing apparatus, several devices corresponding to processes which are often carried out in a particular order are provided whereby when wafers are charged, the wafers are so processed by the devices in quantity and moved out. Therefore, the processes to be controlled are reduced, and the total carrying distance and times of carriage between the processing apparatuses are reduced.

In the delivery of wafers between the carrying equipment and the processing apparatus, there are provided a transfer robot for transferring wafers between the carrying equipment and the processing apparatus, storage boxes for temporarily storing wafers charged into or processed by the processing apparatus to be loaded on the carriage to control them by product group and process group, and a discriminator to discriminate what wafer was processed by the processing apparatus. The transfer of a wafer between the carriage and the processing apparatus may be accomplished in a clean state by a wafer deliver unit surrounded by a clean box, progress of wafers one by one can be accurately grasped and flow of wafers can be faithfully grasped.

In the clean structure, where wafers are stored one by one in a carriage box and closed and carried, or wafers are temporarily stored for processing or carrying, they are put into a clean box, whereby the required clean area can be reduced.

With respect to the wafer carrying unit, every single wafer is carried and controlled, and therefore, control of one wafer as a reference can be easily made.

In the carrying equipment, a single wafer can be loaded at a predetermined station on the carriage which travels around a track-like rail. A single wafer is stored during carriage, and the carrying equipment can be effectively used.

With respect to the flow of wafers, the products for which the process order is the same are grouped whereby the required amount of control is reduced, and the order of charging wafers from the storage box and the order of carrying wafers by the carriage are controlled to flow wafers so that the rate of the flow of wafers between the product groups is constant from the charging to the discharging. Production of wafers in accordance with the order and quantity of demand can thus be made.

BRIEF DESCRIPTION OF THE DRAWINGS

FIG. 14 is a view showing process flow data;

FIG. 15 is a view showing process flow data by product group;

FIG. 16 is a view showing inventory data by product group;

FIG. 17 is a view showing standard inventory data;

FIG. 29 is a view showing a table for definition of terms for deciding the order of charge;

FIG. 32 is a view showing a standardized demand for an exemplary embodiment;

FIG. 33 is a view showing the order of charge by product group;

FIG. 34 is a view showing the demand prior to standardization for an exemplary embodiment;

FIG. 35 is a view showing the demand after standardization for an exemplary embodiment;

FIG. 36 is a view showing the order of charge by product;

FIG. 38 is a schematic view showing a flow of a wafer;

FIG. 39 is a flow chart showing a flow of a wafer;

DETAILED DESCRIPTION OF THE PREFERRED EMBODIMENTS

Contents of Embodiments (1. Structure)
  (1.1 Entire structure)
  (1.2 Structure of apparatuses)
  (1.3 Structure of controller)
  (1.4 Structure of data)
(2. Operation of controller)
  (2.1 Data structure of discriminator)
  (2.2 Communication procedure for controller)
(3. Production system)
  (3.1 Charge-order deciding system)
  (3.2 Circle line system)
  (3.3 Progress control)
(4. Flow of wafer and operation of apparatuses)
(5. Modified embodiments)
  (5.1 to 5.20 Modified embodiments 1 to 20)

(1. Structure)
  (1.1 Entire structure)

One embodiment of the present invention will be described with reference to FIGS. 1 to 40.

Figure 1:
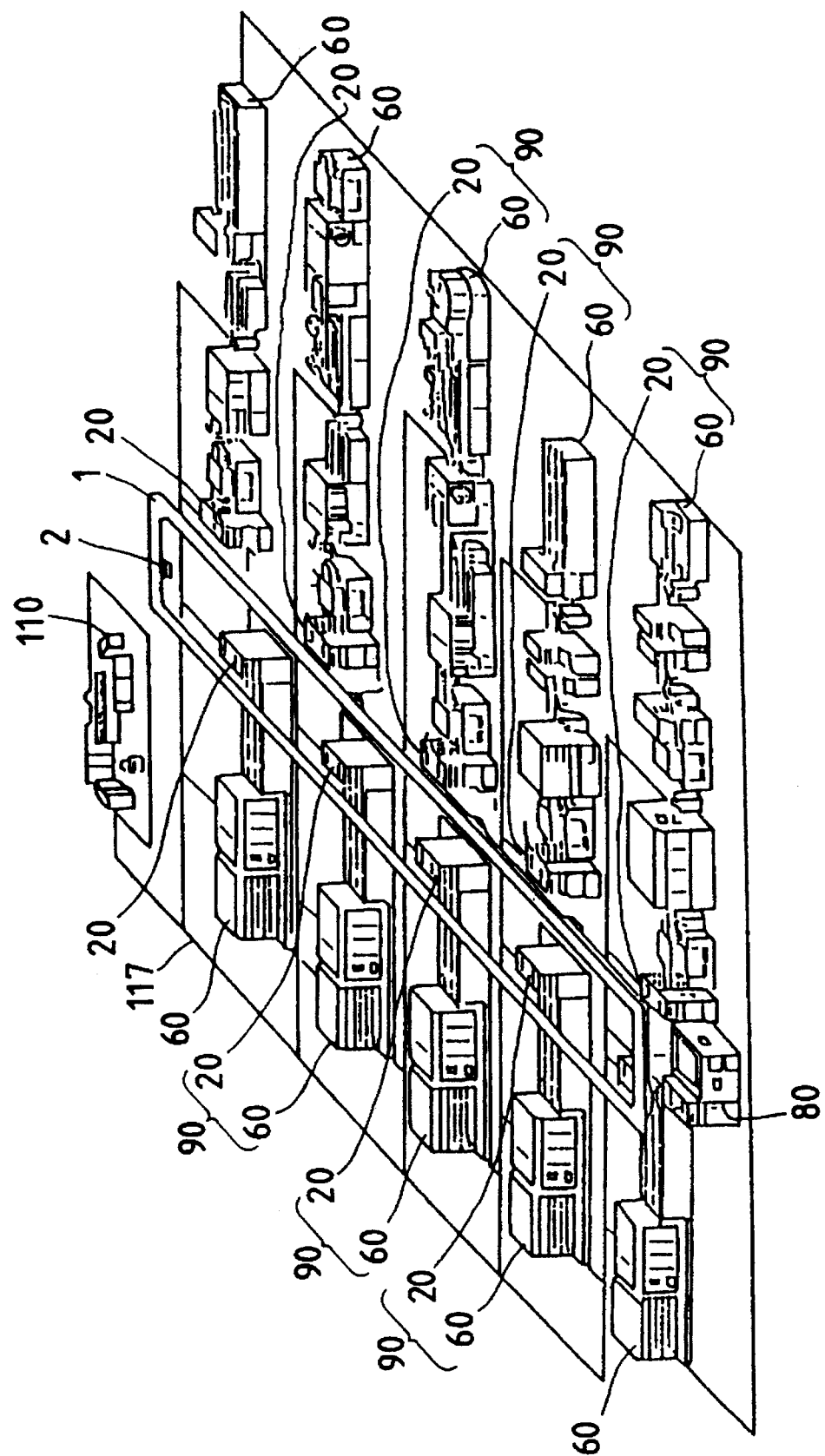
FIG. 1 is an entire structural view showing one embodiment of an apparatus for carrying a variety of products according to the present invention.

FIG. 1 shows an entire structural view, which will be described.

A track-like carriage rail 1 is provided on the ceiling in the central portion, and a carriage 2 is installed which travels along the carriage rail 1. A processing apparatus 60 having devices arranged so as to effect several processes for a wafer is provided around the carriage 2. A wafer deliver unit 20 is installed in front of the processing apparatus 60 to deliver a wafer in a clean atmosphere with respect to the carriage 2 for carrying a wafer. An equipment module 90, which is a combination of the processing apparatus 60 and the wafer delivery unit 20, is provided as a fundamental unit. When a wafer has been processed by the processing apparatus 60, the carriage 2 carries the wafer loaded thereon to the next processing apparatus 60, and processes are thus successively completed to finish a wafer processing series. In the structure as described, a charge and removal device 80 is provided in the vicinity of the carriage rail 1 to charge a wafer to be processed and discharge a wafer for which a series of processes has been terminated. A host controller 110 is connected to the charge-removal device 80, carriage 2, wafer delivery unit 20 and processing apparatus 60 via communication cable 117 for management and control.

With the structure as described above, a wafer is first charged from the charge-removal device 80. That is, the carriage 2 moves to and stops at the charge-removal device 80. A wafer is transferred from the charge-removal device 80 to the carriage 2. If at that time, the carriage 2 contains a wafer that has been processed, that wafer is transferred from the carriage 2 to the charge-removal device 80.

When the wafer is placed on the carriage 2, the carriage 2 moves to a predetermined process station along the carriage rail 1, and the wafer delivery unit 20 receives the wafer to temporarily store it. If at that time, the wafer delivery unit 20 contains a wafer that has been processed and is to be carried to the next process station, the wafer is transferred from the wafer delivery unit 20 to the carriage 2. The wafer delivery unit 20 is capable of managing wafers by product group (the same kind of products are grouped according to required processing) and process, and of charging any wafer into the processing apparatus 60. In accordance with the command of the host controller 110, the designated wafer is charged into the processing apparatus 60 by the wafer delivery unit 20, and when the wafer has been processed, a wafer number (a serial number by product and product group) is discriminated, and the wafer is temporarily stored until it is carried to the next process. When the carriage 2 arrives, the wafer is transferred thereto by the wafer delivery unit 20 and carried to the next process. In this manner, this operation is repeated until a series of processings is terminated. Upon termination of a series of processings, the wafer is carried to the charge-removal device 80 by the carriage 2 and then transferred to the charge-removal device 80.

(1.2 Explanation of apparatuses)

Figure 2:
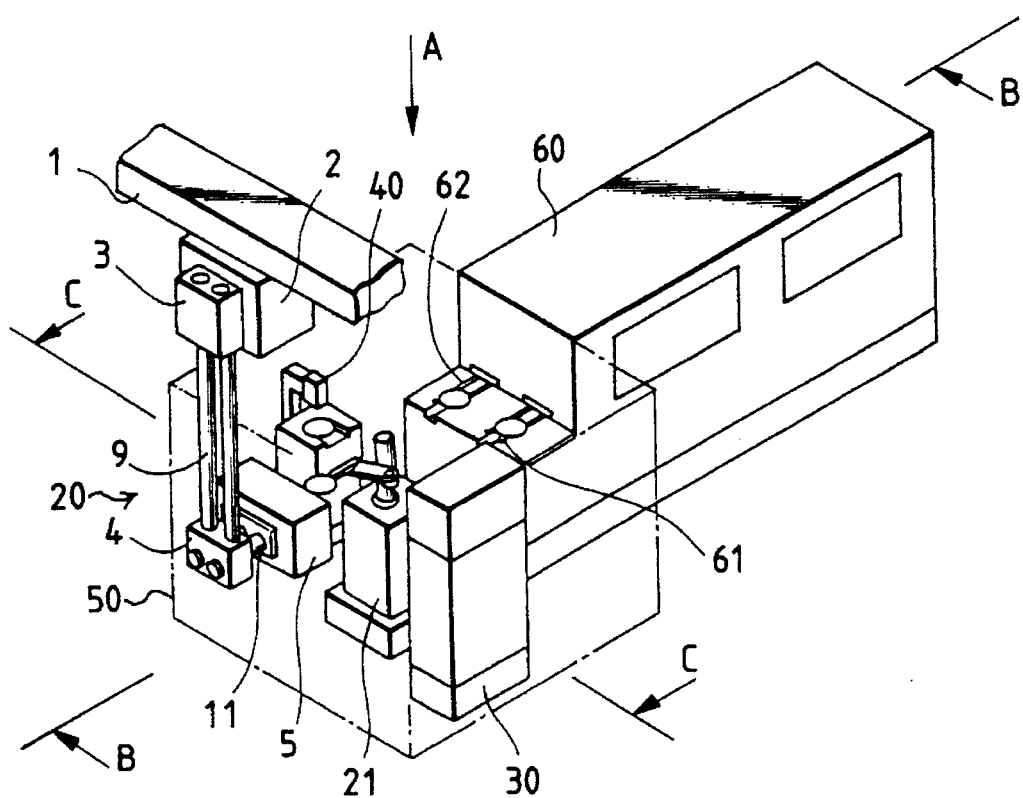
FIG. 2 is a structural view of a wafer delivery unit shown in FIG. 1.
Figure 3:
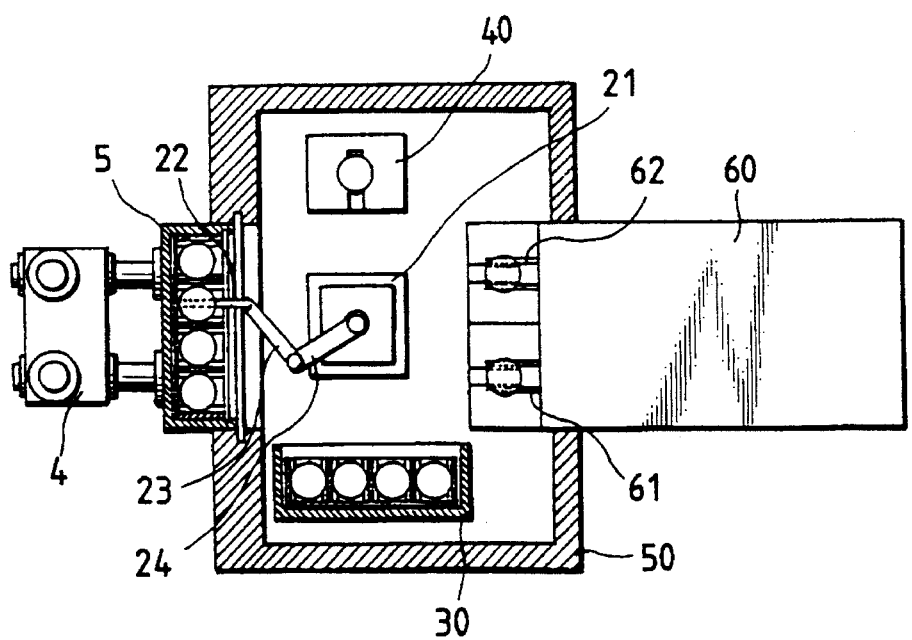
FIG. 3 is a view taken at arrow A in FIG. 2.
Figure 4:
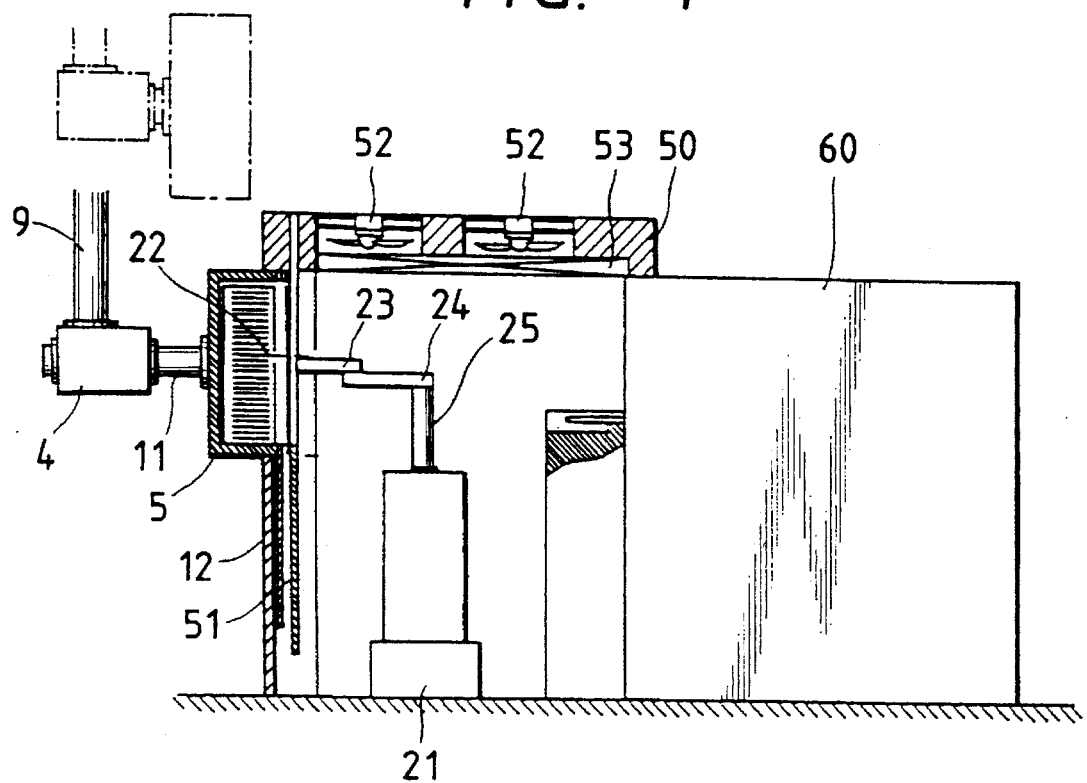
FIG. 4 is a sectional view taken on line B—B of FIG. 2.
Figure 5:
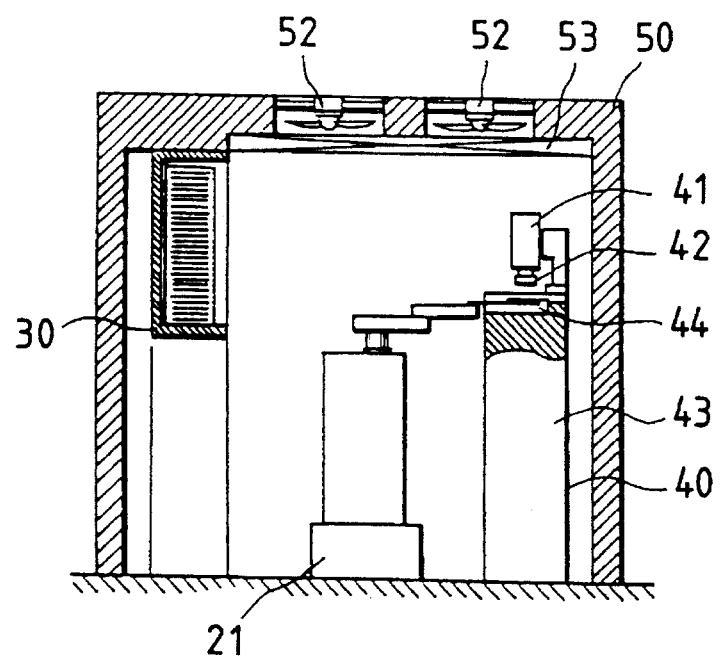
FIG. 5 is a sectional view taken on line C—C of FIG. 2.
Figure 6:
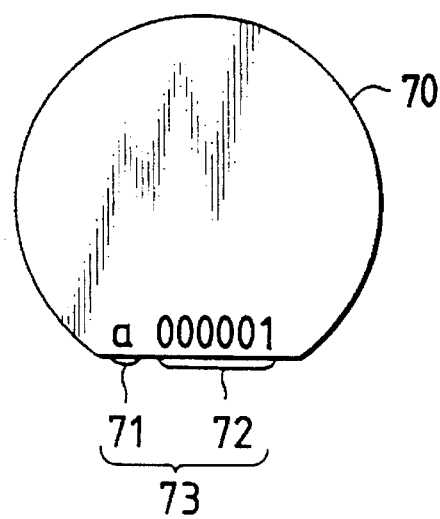
FIG. 6 is a structural view of a wafer.
Figure 7:
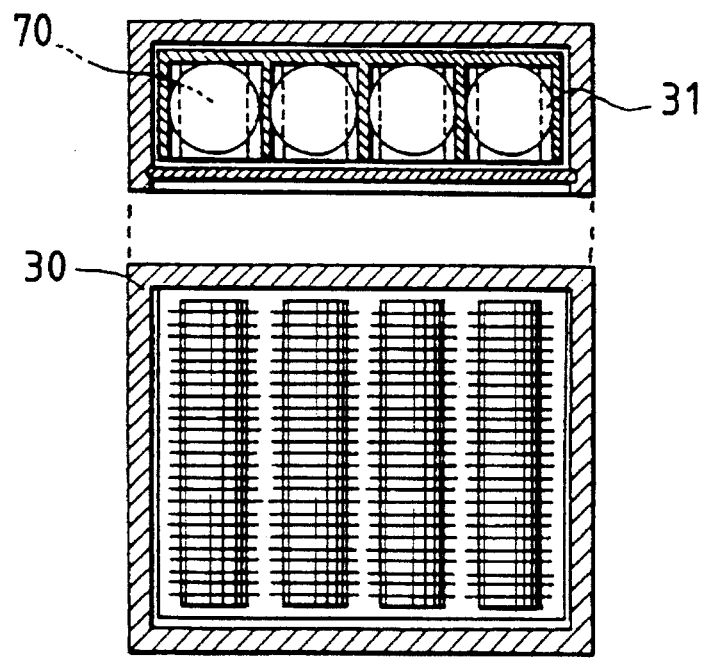
FIG. 7 is a structural view of a storage box.
Figure 8:
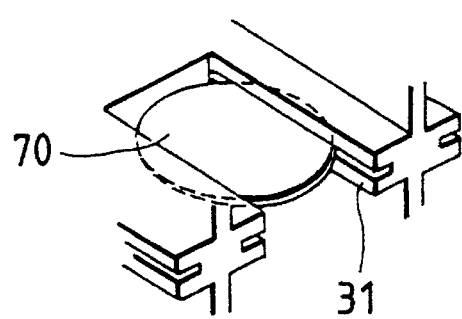
FIG. 8 is a detailed view of a wafer holding portion of the storage box.

The wafer delivery unit 20 shown in FIG. 1 is shown in FIG. 2. FIG. 3 is a view taken at arrow A; FIG. 4 is a sectional view taken on line B—B of FIG. 2; FIG. 5 is a sectional view taken on line C—C; FIG. 6 is a structural view of a wafer; FIG. 7 is a structural view of a storage box; and FIG. 8 is a detailed view of a wafer holding portion of the storage box shown in FIG. 7.

The wafer delivery unit 20 receives a wafer of predetermined product and process from the carriage 2 traveling along the track-like carriage rail 1, charges the wafer into the processing apparatus 60 and again transfers the processed wafer to the carriage 2.

The wafer delivery unit 20 comprises, as shown in FIG. 2, a storage box 30 for storing a wafer, a transfer robot 21 for handling a wafer, a discriminator 40 for reading a wafer number showing a serial number of product and product group described on the wafer, and a clean box 50 for maintaining the aforesaid devices as well as a loader portion 61 and an unloader portion 62 of the processing apparatus 60 in a clean atmosphere. The storage box 30 is provided with a holding portion 31 for holding wafers 70 one by one as shown in FIG. 8, each holding portion 31 being provided with a sensor (for example, a photoelectric switch) for confirming the presence or absence of the wafer 70. A wafer delivery unit controller for managing and controlling the wafer delivery unit 20 confirms the presence or absence of the wafer.

The transfer robot 21 is arranged in the central portion of the wafer delivery unit 20 as shown in FIG. 3 to transfer a wafer between the carriage box 5 and the storage box 30, between the storage box 30 and the loader 61, between the unloader portion 62 and the discriminator 40, and between the discriminator 40 and the storage box 30. The structure of the transfer robot 21 is explained with reference to FIG. 4.

The transfer robot 21 comprises a gripper 22, a front arm 23 and an upper arm 24, which arms are moved up and down by a vertical shaft 25. A controller for the transfer robot 21 receives a command of transfer from the wafer delivery unit controller to control the transfer robot 21 so that the wafer is transferred, and transmits to the wafer delivery unit controller upon the termination of transfer of the wafer.

The structure of the discriminator 40 will be explained with reference to FIG. 5. The discriminator 40 comprises an illumination light source 42, a television camera 41 and a data processing portion 43. Light is applied by the illumination light source 42 to the wafer set to the stage portion 44 of the discriminator 40 by the transfer robot 21, and the wafer number clearly indicated on the wafer is imaged by the television camera 41, which wafer number is incorporated as image data. The image data are analyzed by a data processor 43 to determine the wafer number.

With additional reference to FIG. 6, a wafer 70 is provided with a wafer number 73 comprising a product name 71 indicative of the product of the wafer and a serial number 72 indicative of the product group. The wafer number 73 is read by the discriminator 40. Thereby, wafers can be managed one by one.

The clean box 50 is provided to maintain the atmosphere to be clean so as not to contaminate a wafer when it is delivered between the carriage box 5 and the processing apparatus 60, and houses therein the storage box 30, transfer robot 21, discriminator 40, and loader portion 61 and unloader portion 62 of the processing apparatus, as shown in FIG. 3.

As shown in FIGS. 4 and 5, the clean box 50 is provided on the upper surface thereof with at least one blower 52 for forming inside air into a laminar flow and a HEPA filter 53 for removing dust caused by the blower, and provided on the lower surface with a grating structure for allowing air to be passed through. The clean box 50 is further provided on the side thereof with a clean box door 51 to be opened and closed so that a wafer may be delivered to and from the carriage box 5. This clean box door 51 is normally closed and when the carriage box 5 of the carriage 2 is set, it opens.

Figure 10:
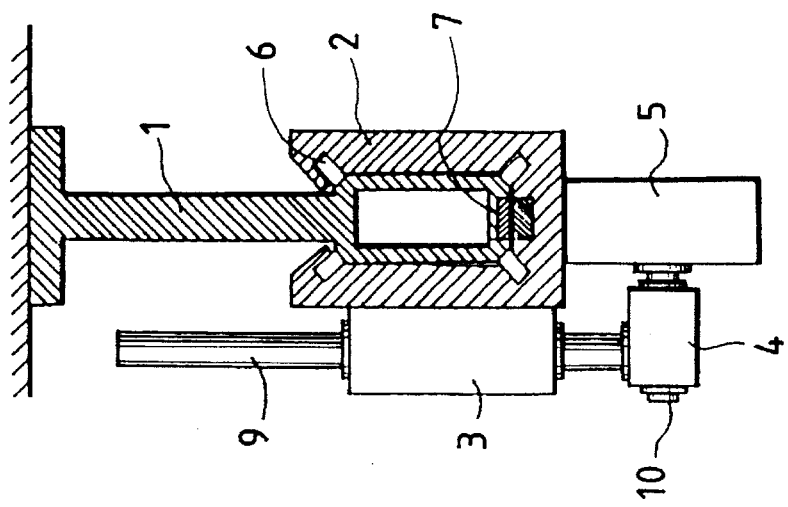
FIG. 10 is a side view showing the structure of a carriage.
Figure 9:
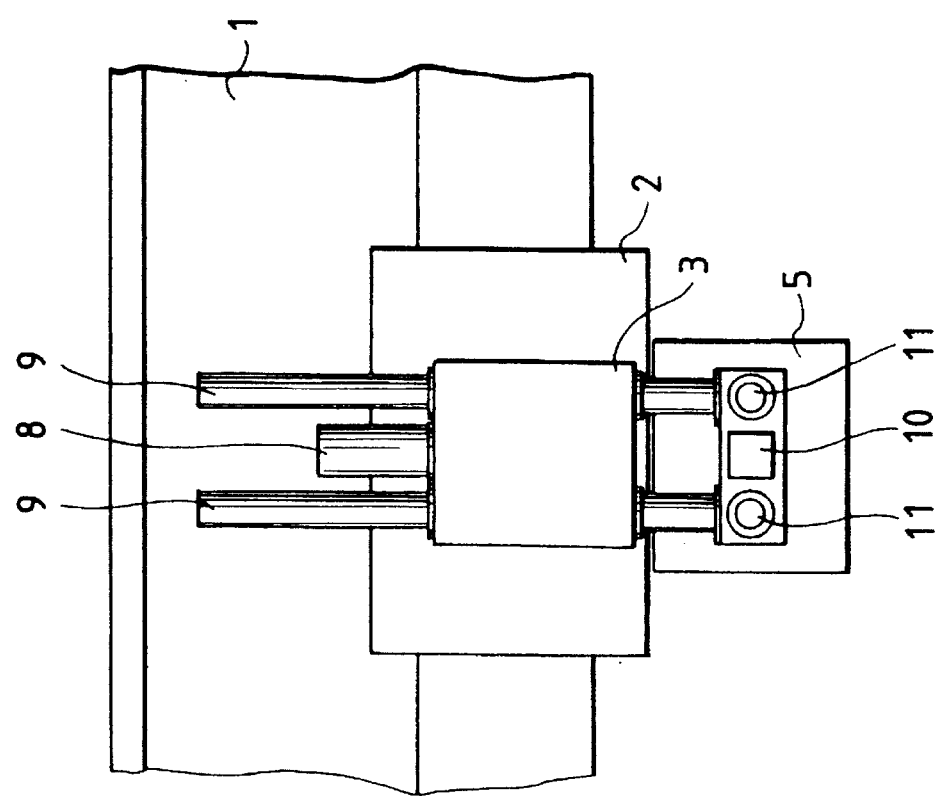
FIG. 9 is a front view showing the structure of a carriage.

FIG. 9 is a front view of the carriage 2, and FIG. 10 is a side view thereof. For example, a similar embodiment is shown in the 4th International Conference on Assembly Automation Proceeding (pp. 303 to 313).

A guide wheel 6 and a drive device 7 (for example, a linear motor) are mounted on the carriage 2, which is moved along the carriage rail 1. There are provided an elevating device 3 and an elevating head 4 for setting the carriage box 5 to the clean box 50. The elevating head 4 is moved up and down along a vertically moving guide 9 by means of a vertical movement drive device 8 (for example, such as a motor and ball threads). The carriage box 5 is moved laterally by a lateral movement drive device 10 (for example, a motor and ball threads). The operation will be described with additional reference to FIGS. 2 and 4. The carriage 2 travels while being hung on the track-like carriage rail 1 installed in advance. When the carriage 2 stops in front of the wafer delivery unit 20, the elevating head 4 is moved down to the position of the clean box door 51, and the carriage box 5 is then moved into the clean box 50. After the clean box door 51 has been opened, the carriage box 12 opens. When the transfer of the wafer is terminated by the gripper 22 of the transfer robot 21, the carriage box door 12 closes and the clean box door 51 closes. Then, the carriage box 5 is returned by the lateral movement guide 11 to return the elevating head 4 to its original height.

Figure 11:
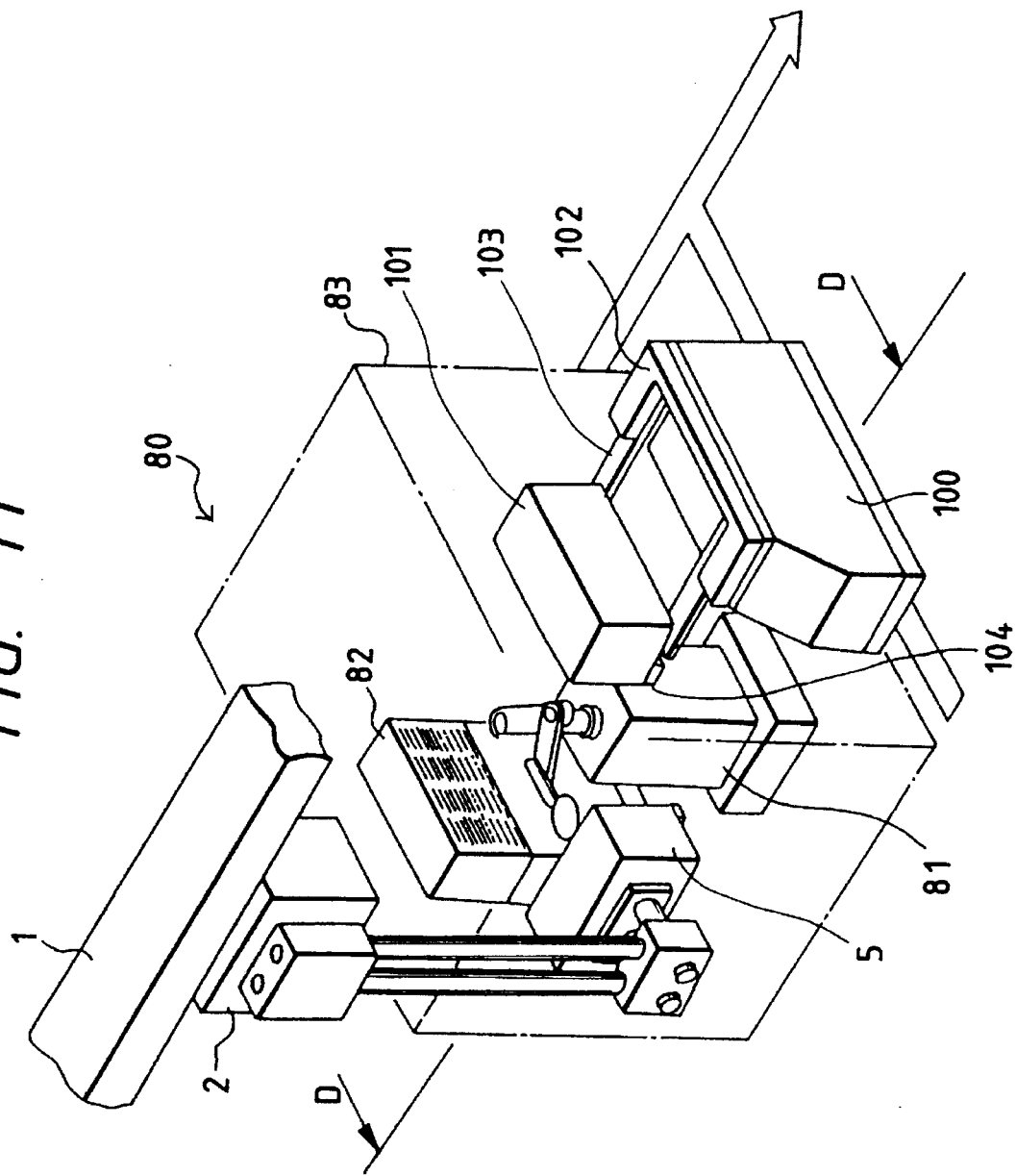
FIG. 11 is a structural view of a charging and removing device.
Figure 12:
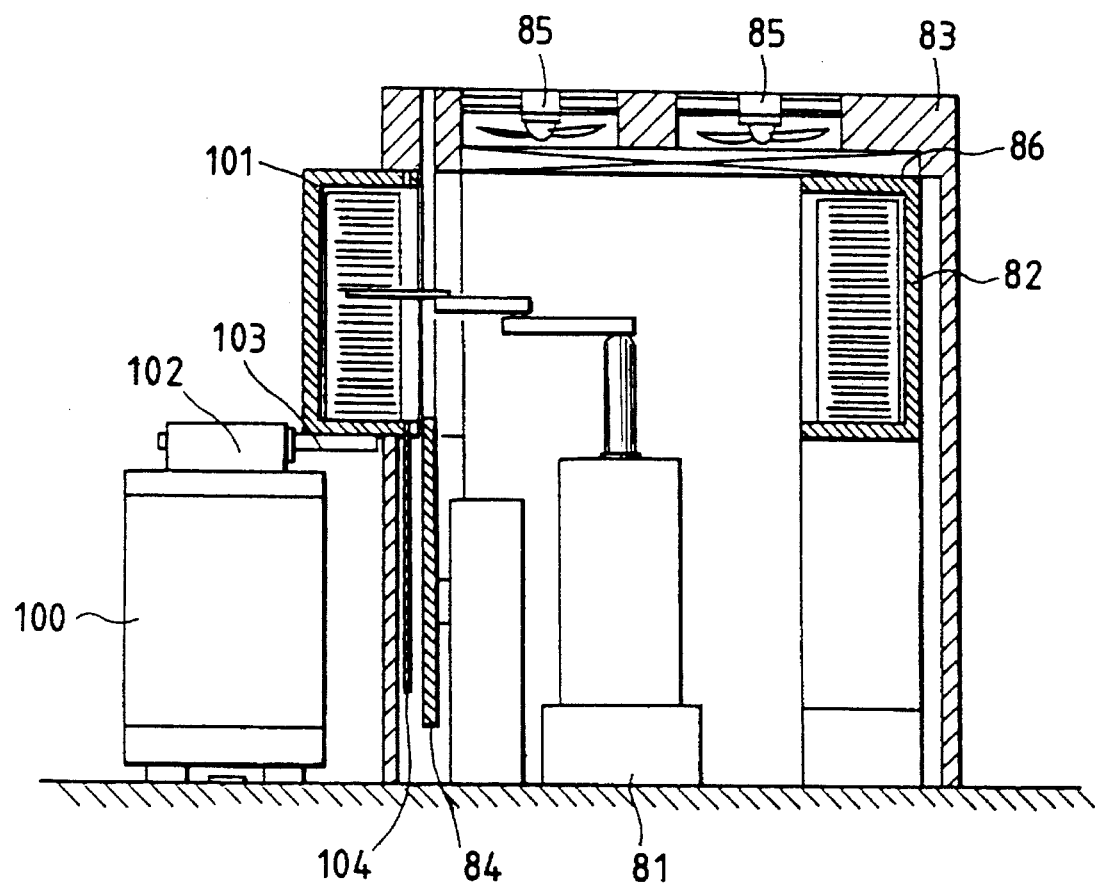
FIG. 12 is a sectional view taken on line D—D of FIG. 10.

FIG. 11 shows the structure of the charge-removal device 80. FIG. 12 is a sectional view taken on line D—D of FIG. 11.

In FIG. 11 the charge-removal device 80 comprises a transfer robot 81 for handling a wafer, a storage box 82 for storing a wafer, and a clean box 83 for maintaining these devices in a clean atmosphere. In FIG. 12, the clean box 83 has at least one blower 85 and a HEPA filter for removing dust caused by the blower mounted thereon, and a grating construction at the lower surface thereof to pass air therethrough, as previously described in connection with the wafer delivery unit. The clean box 83 is further provided on the side thereof with a door capable of delivering a wafer to and from the carriage box 5 loaded on the carriage 2 (similar to the clean box door 51 shown in FIG. 4) and a carriage box door 104 to be opened and closed to charge a wafer to be processed or to remove a processed wafer.

Since the carriage box 101 charges and removes a wafer from the charge-removal device 80 from the vehicle 100, the vehicle 100 is provided with a slide guide (for example, a motor and ball threads) for driving forwardly an arm 103 holding the carriage box 101. The vehicle 100 stops at a predetermined position from the charge-removal device 80 to move the arm 103 forward to set the carriage box 101 into the clean box 83. The clean box door 84 and carriage box door are opened, and the wafer in the carriage box 101 is removed by the transfer robot 81 and stored in the storage box 82.

At this time, when the processed wafer is present, the operation of transferring a wafer from the storage box 82, to the carriage box 101 is also continuously carried out. When during this transfer, the carriage 2 arrives and the carriage box 5 is set to the charge-removal device 80, as shown in FIG. 11, the transfer between the storage box 82 and the carriage box 5 is simultaneously carried out. When the transfer of the carriage box 101 has been terminated, the carriage box door 104 and the clean box door 84 are closed to return the arm 103, and carried to the next process by the vehicle 100.

(1.3 Structure of controller)

Figure 13:
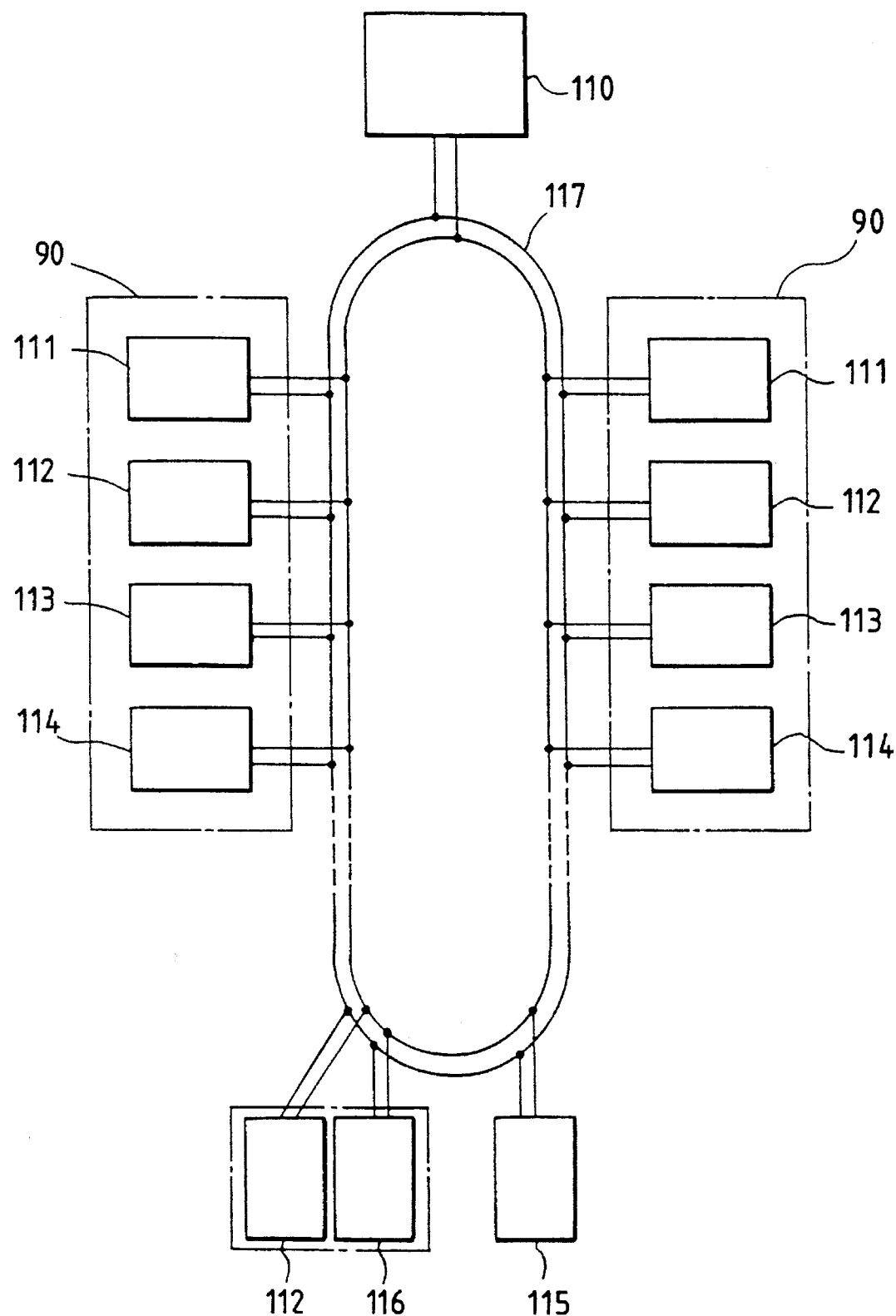
FIG. 13 is a structural view of a controller.

FIG. 13 shows a control system for use in the FIG. 1 embodiment. A host controller 110 uses, as a constituent unit of a control system, an equipment module 90 comprising a wafer delivery unit 20 and a processing apparatus 60 shown in FIG. 2, and is provided with a wafer delivery unit controller 113 which is a controller for the wafer delivery unit 20, a discriminator controller 111 which is a controller for the discriminator 40, a robot controller 112 which is a controller for the transfer robot 21, and a processing-apparatus controller 114 which is a controller for the processing apparatus 60. There are further provided a charge-removal device controller 116 which is a controller for the wafer charge-removal device 80, a robot controller 112 which is a controller for a transfer robot for transferring a wafer, and a carriage controller 115 which is a controller for the carriage 2.

The host controller 110 holds data for advancing and managing wafers by product group and process group to provide command and confirmation while being associated with other controllers to control operation so that a wafer may flow smoothly.

The wafer delivery unit controller 113 manages the kinds of wafers stored in the storage box 30 and communicates with the robot controller 112 to control the wafer delivery unit 20.

The discriminator controller 111 transmits a wafer number of a wafer identified by the discriminator 40 to the wafer delivery unit controller 113.

The robot controller 112 controls the start, stop and other operations of the transfer robot 21.

The processing apparatus controller 114 manages the processing state of the processing apparatus 60 and recipe to control the processing apparatus 60.

The carriage controller 115 controls the start, stop and travel of the carriage 2 to manage what product group and what process of wafer is held with respect to a box number of the carriage box 5.

The charge-removal device controller 116 manages what product group and what process of wafer is stored in what box with respect to the storage box 82 of the charge-removal device 80, and communicates with the robot controller 112 to control the charge-removal device 80.

These controllers are connected by a photo LAN of token ring structure, and the device controllers are connected by two communication cables 117. The connections between the device controllers are designed to avoid troubles by switching according to a system trouble to prevent a communication trouble resulting from disconnection of the cable and controller from the devices.

With this arrangement, high speed communication can be made, and transreceive time can be computed from a point-to-point system and therefore data communication can be made in real time. Consumption of communication time between the controllers is small, and preference of signal is easily given. Therefore, control is easily accomplished.

(1.4 Structure of data)

Necessary data structures are shown in FIGS. 14 to 22 in accordance with the controller structure shown in FIG. 13.

Figure 18:
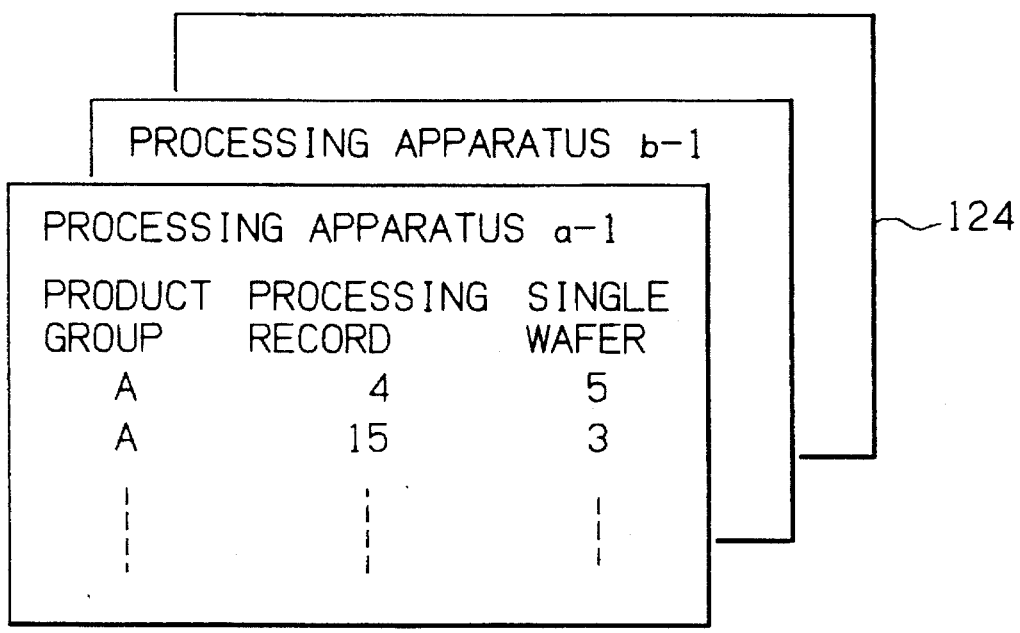
FIG. 18 is a view showing an inventory data apparatus.
Figure 19:
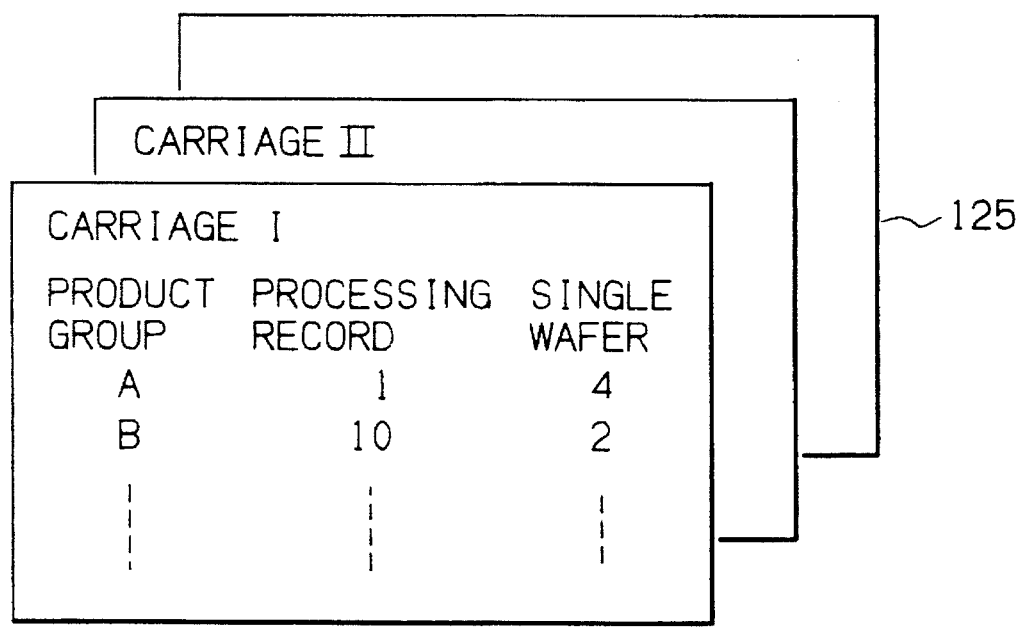
FIG. 19 is a view showing carriage data.

The host controller 110 prepares product group A, B, . . . obtained by grouping products $a_1, a_2, \ldots$ of which process order and recipe are of the same category, as shown in FIG. 15, from process flow data 120 for each product $a_1, b_1, \ldots$ shown in FIG. 14, to determine process flow data 121 of a product group. The host controller 110 further manages inventory data 122 by product group showing the quantity of inventory by product group and process, as shown in FIG. 16, and standard inventory data 123 noting the standard quantity of inventory on processes by product group, as shown in FIG. 17. The host controller further manages inventory data by device showing the quantity of inventory on the processing apparatuses as shown in FIG. 18, and manages carriage data 125 showing the kind of wafers carried by the carriage and processing records, as shown in FIG. 19.

Figure 20:
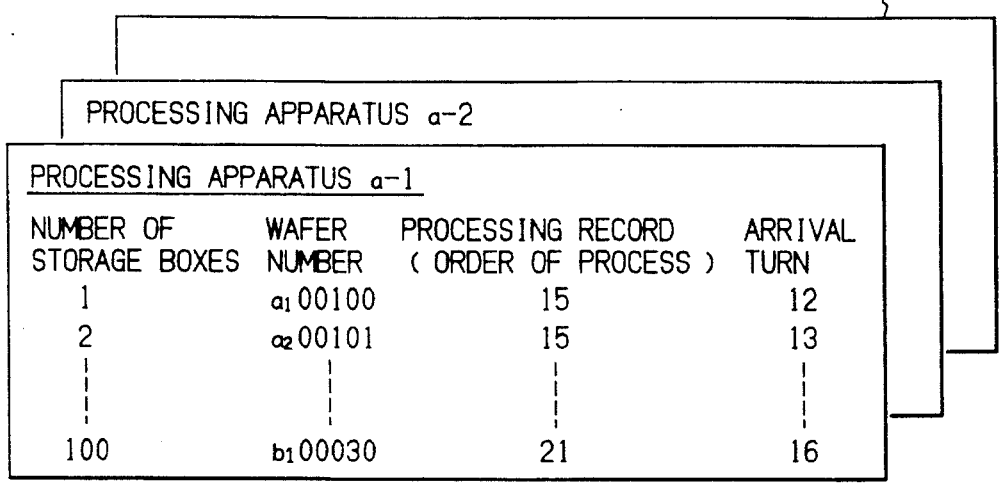
FIG. 20 is a view showing storage box data.

The wafer delivery unit controller 113 manages the information of wafers stored as storage box data 126, as shown in FIG. 20, in order to manage wafers stored in the storage boxes.

Figure 21:
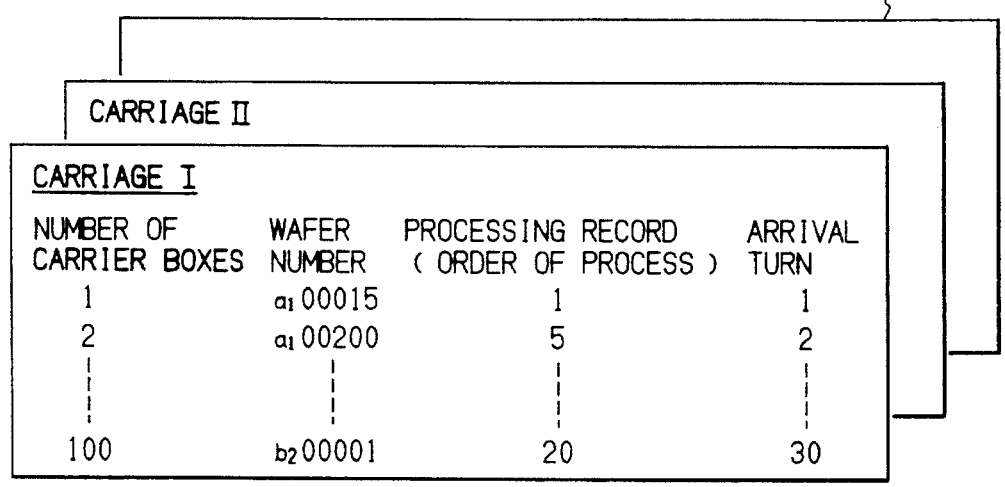
FIG. 21 is a view showing carriage box data.

The carriage controller 115 manages information of wafers in the carriage box as carriage box data 127, as shown in FIG. 21, in order to manage wafers stored in the carriage boxes.

Figure 22:
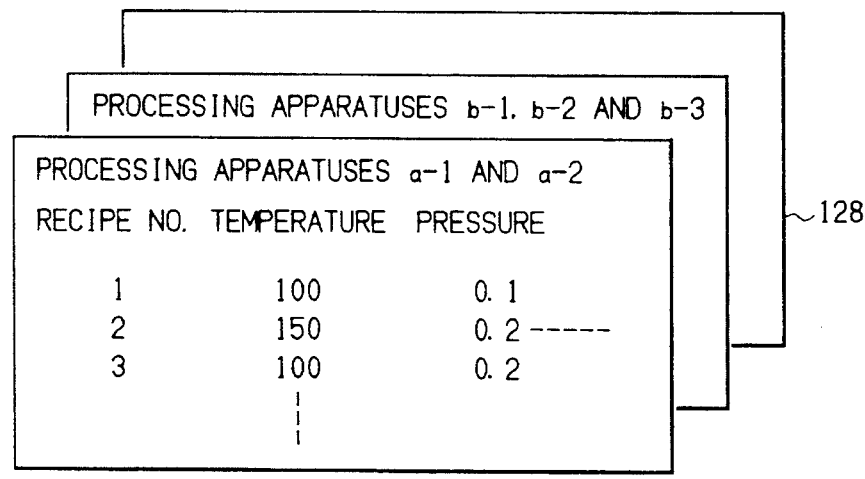
FIG. 22 is a view showing recipe data.

The processing apparatus controller 114 has, as recipe data 128, information representative of the processing condition of the processing apparatus corresponding to the recipe No. in which the processing condition (recipe) is coded, as shown in FIG. 22.

Data will be described in detail.

The process flow data 120 shown in FIG. 14 has a recipe No. representative of the recipe which is the process order and processing condition in accordance with the processing order by product.

The product group process flow data shown in FIG. 15 is prepared from the process flow data 120, and is the process flow by the product groups A, B, . . . in which products $a_1$, $a_2$, . . . having a process order and recipe of the same category are grouped.

The inventory data 122 by product group shown in FIG. 16 has, as data, the number of all wafers by product group of wafers and processing records.

The standard inventory data 123 shown in FIG. 17 shows the standard inventory quantity for the processes by product group.

The host controller 110 selects the product group and process to be processed by these product group process flow data 121, inventory data 122 by product group and standard inventory data 123.

The inventory data 124, arranged by device as shown in FIG. 18, has, as data, the product group of wafers stored in the storage box by the processing apparatus, processing records and the number of wafers. The host controller 110 issues a start command to the processing apparatus in accordance with the data.

The carriage data 125 shown in FIG. 19 has, as data, the product group of wafers stored by the carriage, processing records and the number of wafers. The host controller 110 issues a command of the transfer from the carriage to the storage box in accordance with the data.

The storage box data 126 shown in FIG. 20 correlates a wafer number of a wafer stored, processing records and an arrival turn showing a turn stored in the storage box, with a storage box number attached by one holding portion of the storage box. The wafer delivery controller 113 specifies a wafer to be processed among the wafers of the same product group and processing record in accordance with the data.

The carriage box data 127 shown in FIG. 21 attaches a wafer number of a wafer being carried, processing record and an arrival turn showing a turn loaded on the carriage, to a carriage box number attached by one holding portion of the carriage box of each carriage. The carriage controller 115 specifies a wafer to be transferred into the storage box among wafers of the same product group and processing record.

(2. Operation of controller)

(2.1 Data processing of identifier device)

Figure 23:
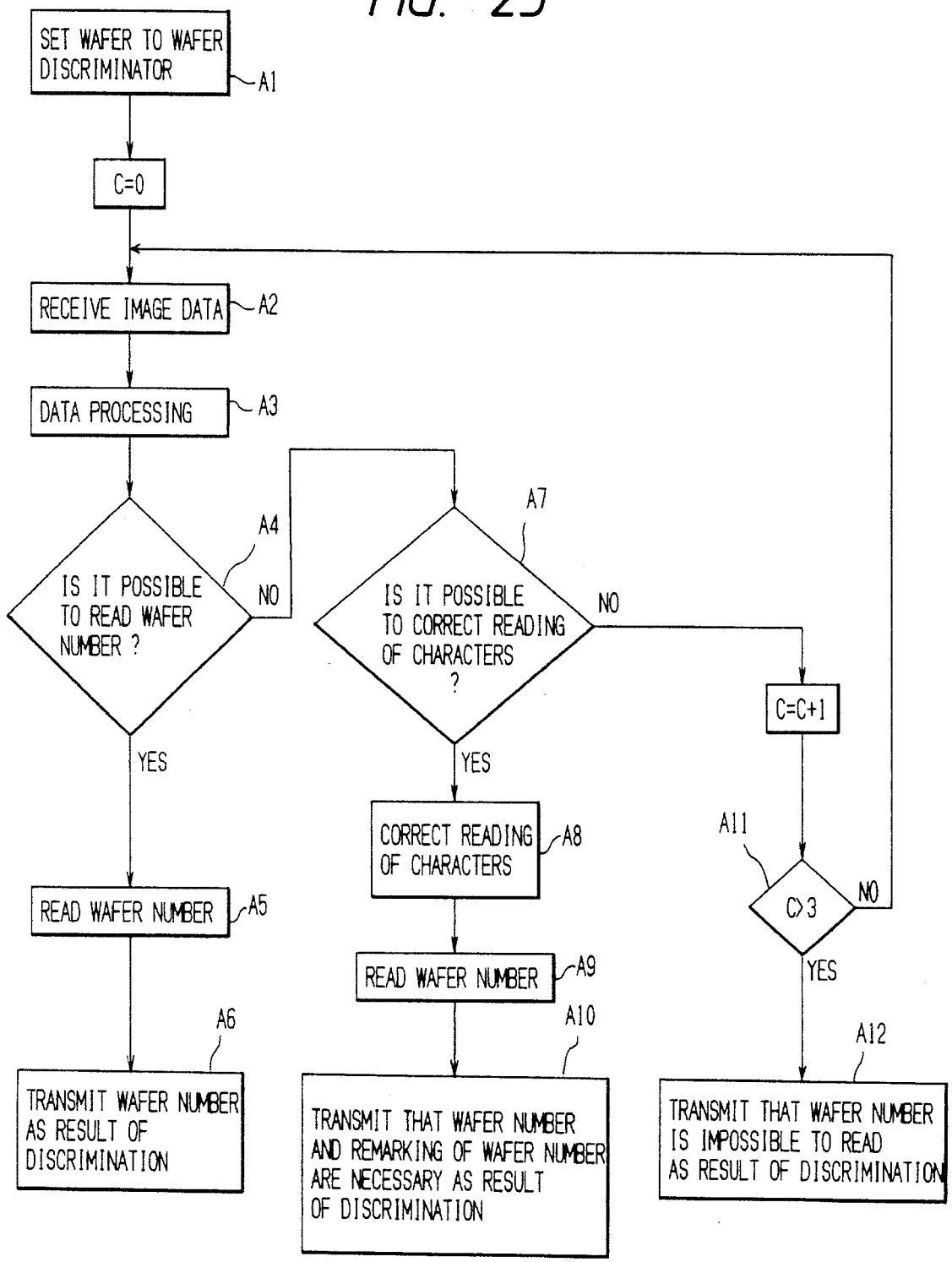
FIG. 23 is a data processing flow chart of a discriminator.

FIG. 23 shows a data processing flow chart of the discriminator controller 111, which processing flow will be described.

At step A1, a wafer is presented to a wafer discriminator of discriminator controller 111. Then, a variable C representing read attempts is set to zero. The identifier device controller 111 attempts to read, as image data, a wafer number from a wafer set to the identifier device 40 (step A2), effects data processing (step A3), and judges whether or not the wafer number can be read (step A4). If readable, a wafer number is read (step A5). As a result of the read, a wafer number is transmitted to the wafer delivery unit controller 113 (step A6). However, if a wafer number is not read, an error in reading a character can be corrected. In other words, even if a wafer number is not completely read, it can be read to some extent. Whether or not the wafer number can be discriminated with high probability is judged (step A7). If an error in reading a character can be corrected, correction of the error is carried out (step A8). Then, a wafer number is read (step A9), and a wafer number and the necessity of re-marking as the result of reading are transmitted to the wafer delivery unit controller 113 (step A10). If correction of an error in reading a character is impossible, processing is restarted from the state where a wafer is set to the wafer discriminator 40. If a wafer number cannot be discriminated even though processing is repeated three times, the fact that a character cannot be read as the result of identification is transmitted to the wafer delivery unit controller 113 (step A12).

(2.2 Communication procedure between controllers)

The operation of devices and the communication procedure between controllers will be described hereinafter with reference to FIGS. 2, 13, 18–21 and 24–26.

The wafer transfer operation of the transfer robot 21 has four steps, that is, (1) carriage box 5→storage box 30, (2) storage box 30→loader portion 61 of processing apparatus 60, (3) unloader portion 62 of processing apparatus 60→discriminator 40→storage box 30, and (4) storage box 30→carriage box 5. In order to effectively move the transfer robot 21, the wafer transfer operations of the carriage box 5→storage box 30 and storage box 30→carriage box 5 are simultaneously carried out.

Figure 24:
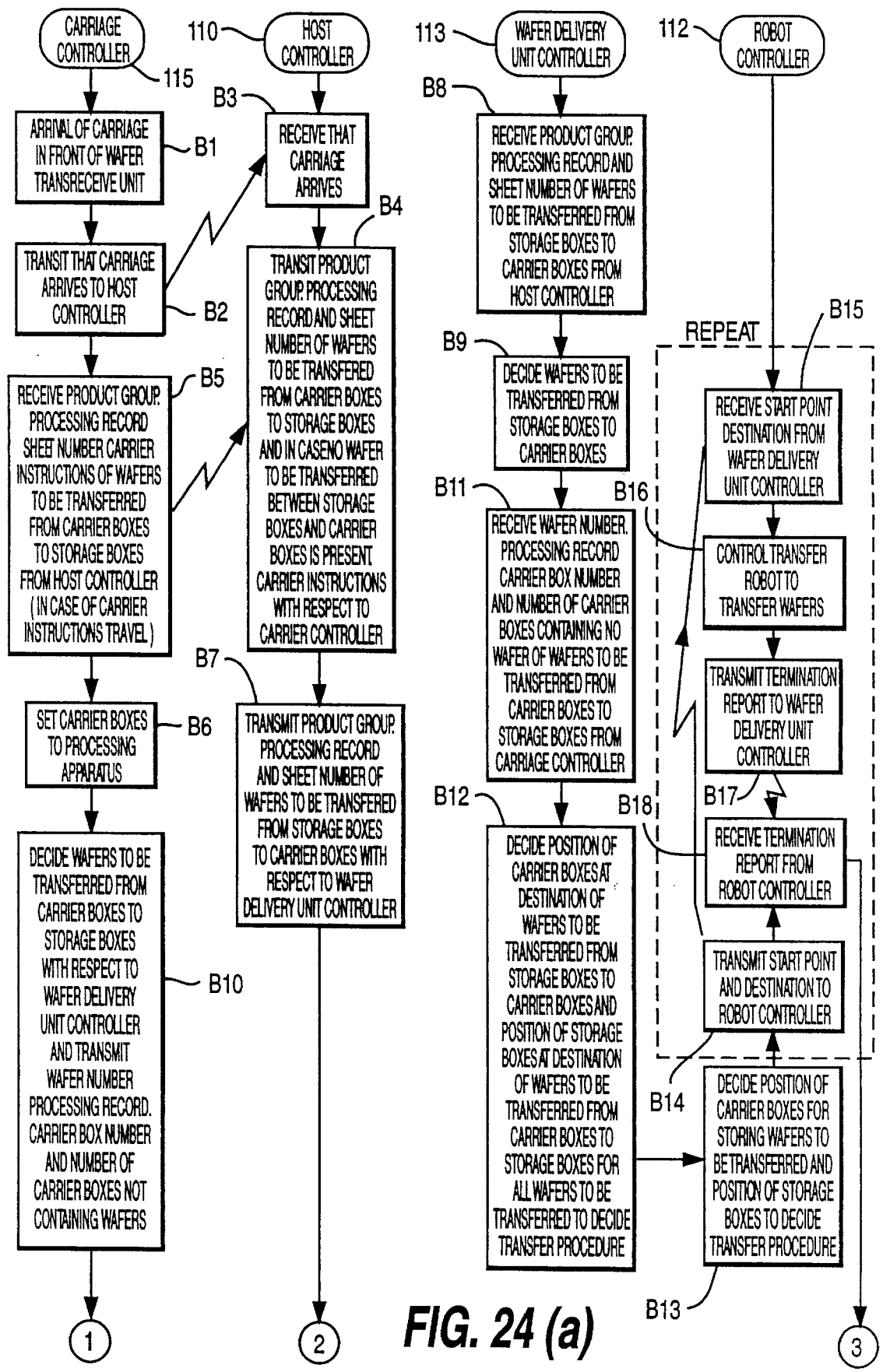
FIGS. 24(a) and (b) are flow charts showing the communication procedure between controllers when wafers are transferred between the carriage and storage boxes.
Figure 24:
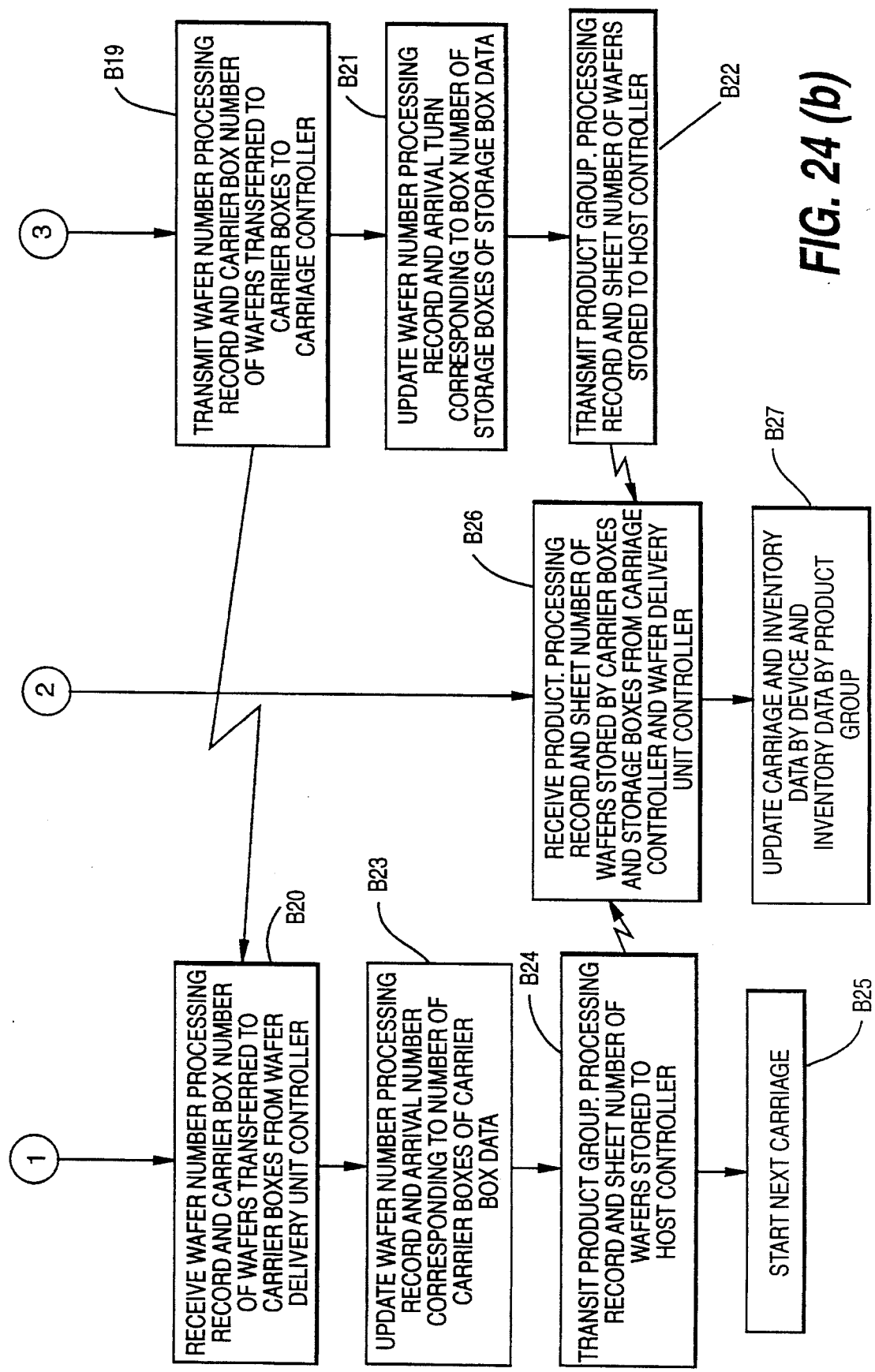

FIG. 24 shows the processing procedure of controllers and the communication procedure between controllers when a wafer is transferred between the carriage box 5 and the storage box 30, which will be described hereinafter.

When the carriage 2 arrives in front of the wafer delivery unit 20 (step B1), the carriage controller 115 transmits the arrival of the carriage 2 to the host controller 110 (step B2). When the host controller 110 receives such information (step B3), the host controller 110 transmits to the carriage controller 115 the product group, processing record and number of wafers to be transferred from the carriage box 5 to the storage box 30. However, if no wafer to be transferred between the storage box 30 and the carriage box 5 is present, the host controller 110 transmits a command (carriage command) for the carriage to travel without stopping to the carriage controller 115 (steps B4 and B5).

The host controller 110 further decides the product group, processing record and number of wafers to be transferred from the storage box 30 to the carriage box 5 and transmits the information to the wafer delivery unit controller 113 (steps B7 and B8). Then, the carriage 2 causes the elevating device 3 to lower the vertically moving guide 9 to advance the lateral moving guide 11 and set the carriage box 5 containing a wafer to the clean box door 51. The clean box door 51 is opened and the carriage box door 12 is then opened. In this way, the wafer in the carriage box 5 can be freely moved in and out by the transfer robot 21 within the clean box 50 (step B6).

The wafer delivery unit controller 113 decides a wafer to be transferred in accordance with the storage box data 126 shown in FIG. 20 (step B9). The carriage controller 115 decides a wafer to be transferred in accordance with the carriage box data 127 and transmits a wafer number of the wafer, processing record, carriage box number and a carriage box number of a box not containing a wafer to the wafer delivery unit controller 113 (steps B10 and B11). The wafer delivery unit controller 113 decides a position of the carriage box which is a destination of a wafer to be transferred from the storage box 30 to the carriage box 5, a position of the storage box which is a destination of a wafer to be transferred from the carriage box 5 to the storage box 30, and a position of a carriage box for storing wafers to be transferred and a position of storage boxes 30 with respect to all wafers to be transferred and decides the transfer procedure (steps B12 and B13).

A start point and destination are transmitted to the robot controller 112 in accordance with the thus decided procedure (steps B14 and B15). The transfer robot 21 carries out the work in accordance with the aforesaid command (step B16), and the termination of work is transmitted to the wafer delivery unit controller 113 (steps B17 and B18). This work is repeated till the transfer of all wafers commanded by the host controller 110 is terminated. However, if a demand for the transfer of a wafer is received from the processing apparatus controller 114 during the transfer processing, the transfer processing is discontinued, and processing is restarted thereafter in response to the demand of the processing apparatus controller 114.

Upon termination, the wafer delivery unit controller 113 transmits a wafer number of a wafer transferred into the carriage box 5, the processing record and a carriage box number to the carriage controller 115 (steps B19 and B20). A wafer number, processing record and arrival turn corresponding to a box number of the storage box of the storage box data 126 are updated (step B21). The product group and processing record of a wafer stored in the storage box 30 are transmitted to the host controller 110 (steps B22 and B26). The carriage controller 115 updates a wafer number, processing record and arrival turn corresponding to the carriage box number of the carriage box data 127 (step B23). The product group and processing record of a wafer stored in the carriage box 5 are transmitted to the host controller 110 (steps B24 and B26). The carriage 2 starts the next carriage (step B25). The host controller 110 receives the product group of a wafer and the processing record transmitted from the wafer delivery unit controller 113 and carriage controller 115 and the product group of a wafer and the processing record stored in the storage box 30 (step B26). The host controller 110 updates the inventory data 124 by device, the inventory data 122 by product group, and the carriage data 125 (step B27).

Figure 25:
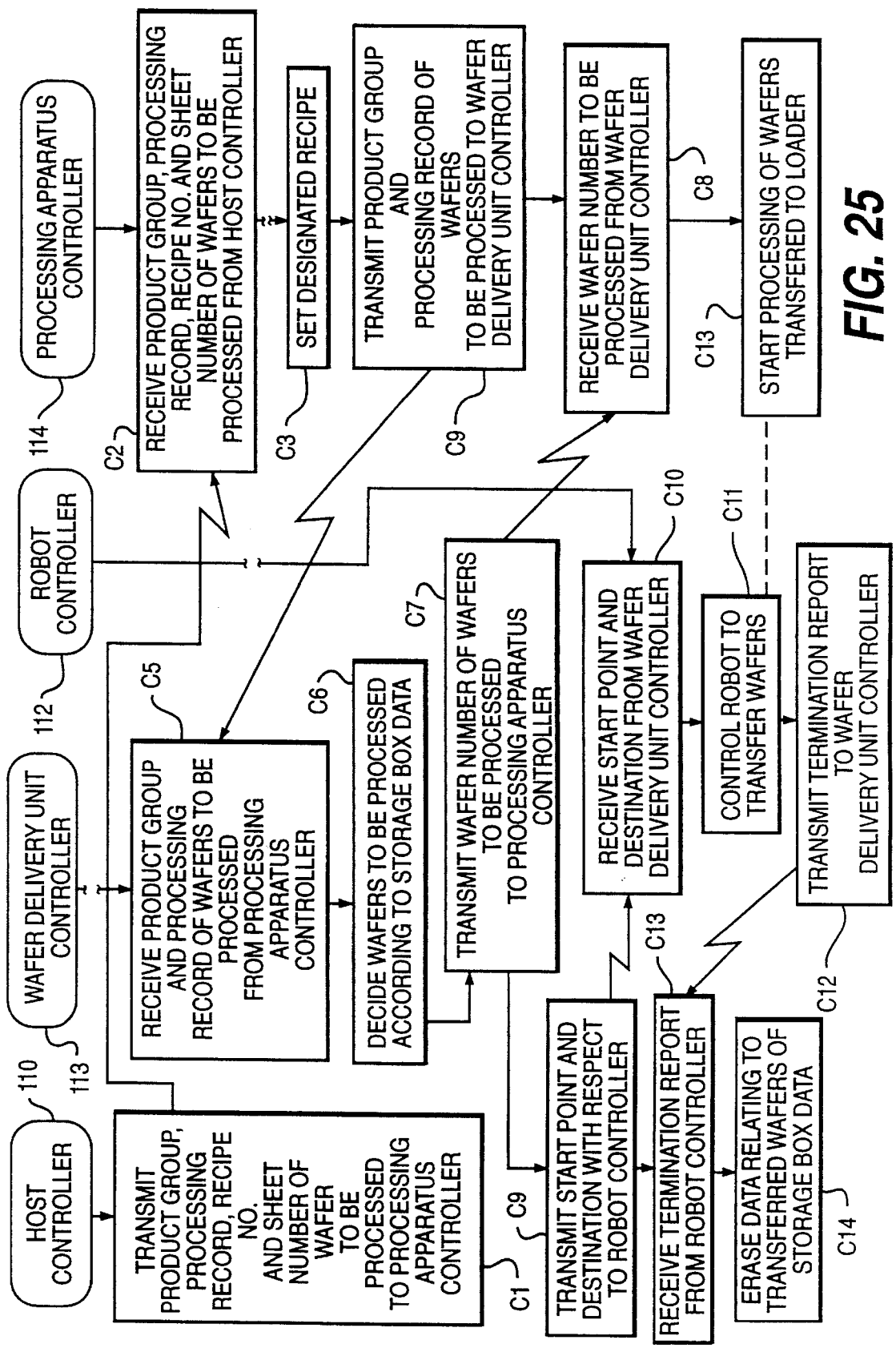
FIG. 25 is a flow chart showing the communication procedure between controllers when wafers are transferred between the storage box and the processing apparatus.

The processing procedure of controllers and the communication procedure between controllers when a wafer is transferred from the storage box 30 to the loader portion 61 of the processing apparatus will be described with reference to FIG. 25.

The host controller 110 issues a start command to the processing apparatus controller 114 and transmits the product group to be processed, processing record, recipe No. and number of wafers (steps C1 and C2). The processing apparatus controller 114 sets the recipe in accordance with the command (step C3). When the processing apparatus 60 assumes a state capable of processing a wafer, the processing apparatus controller 114 transmits the product group and processing record of a wafer to be processed to the wafer delivery unit controller 113 (steps C4 and C5).

The wafer delivery unit controller 113 then retrieves a wafer first stored in the storage box 30 among the wafers of the corresponding product group and processing record to select it (step C6). A wafer number is transmitted to the processing apparatus controller 114 (step C8) and a position of the storage box containing the wafer is transmitted to the robot controller 112 to instruct the transfer of the wafer from the storage box 30 to the loader portion 61 of the processing apparatus (steps C9 and C10). In accordance with this instruction, the transfer robot 21 removes the wafer from the storage box 30 to set it to the loader portion 61 of the processing apparatus 60 (step C11).

Upon termination, the termination of work by the robot controller 112 is transmitted to the wafer delivery unit controller 113 (steps C12 and C13). The wafer delivery unit controller 113 erases the storage box data 126 of the corresponding wafer (step C14). The processing apparatus 60 starts the processing of the wafer (step C15).

Figure 26:
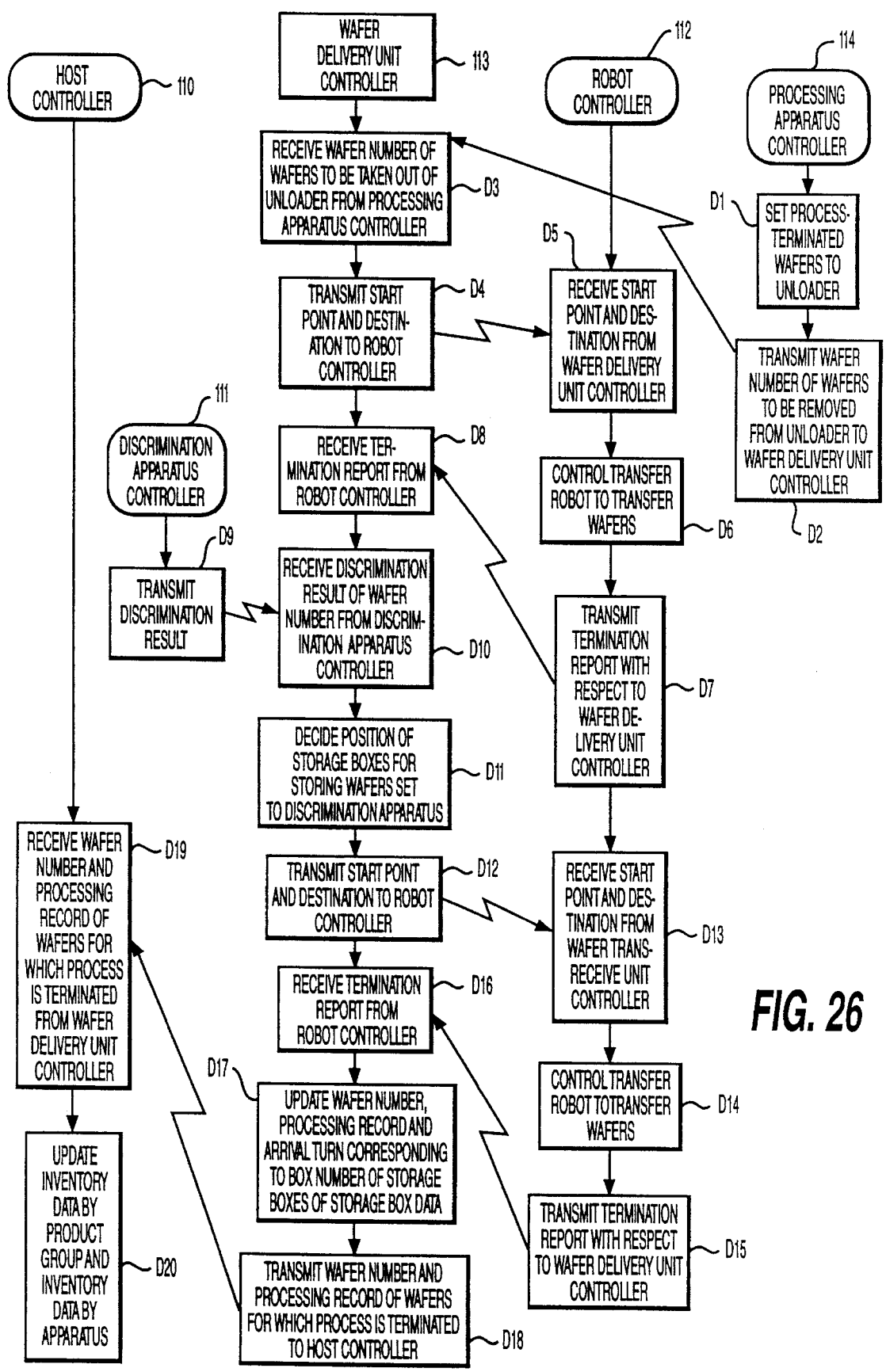
FIG. 26 is a flow chart showing the communication procedure between controllers when wafers are transferred between the processing apparatus, discriminator and storage box.

The processing procedure of controllers and the communication procedure between controllers when a wafer is transferred from the unloader portion 62 of the processing apparatus to the discriminator 40 to store the wafer in the storage box after termination of processing by the processing apparatus 60 will be described with reference to FIG. 26.

The processing apparatus 60 carries the processed wafer to the unloader portion 62 (step D1). The processing apparatus controller 114 transmits a wafer number of a wafer in the unloader portion 62 to the wafer delivery unit controller 113 to demand a removal thereof (steps D2 and D3). The wafer delivery unit controller 113 then instructs the robot controller 112 to transfer a wafer from the unloader portion 62 to the discriminator 40 (steps D4 and D5). In accordance with this instruction, the transfer robot 21 removes the wafer from the unloader portion 62 to set it to the discriminator 40 (step D6).

Upon termination, the termination of work by the robot controller 112 is transmitted to the wafer delivery unit controller 113 (steps D7 and D8). The discriminator controller 111 performs identification and processing as shown in FIG. 23 to transmit the result of identification to the wafer delivery unit controller 113 (steps D9 and D10). When the wafer delivery unit controller 113 receives the result of identification from the discriminator controller 111 (step D10), the controller 113 determines the position of the storage box 30 storing a wafer (step D11) and transmits the position to the robot controller 112 to instruct the transfer thereof (steps D12 and D13). The transfer robot 21 removes a wafer from the discriminator 40 to store it in the storage box 30 (step D14).

Upon termination (steps D15 and D16), the wafer delivery unit controller 113 stores as the storage box data 126 a wafer number corresponding to a number of a storage box storing a wafer and processing record (step D17). The controller 113 further transmits a wafer number and processing record of the processed wafer to the host controller 110 (step D18). The host controller 110 receives the wafer number and processing record (step D19) to update the inventory data 122 by product group and the inventory data 124 by devices (step D20).

(3. Production System)

(3.1 Charge-order deciding system)

Figure 27:
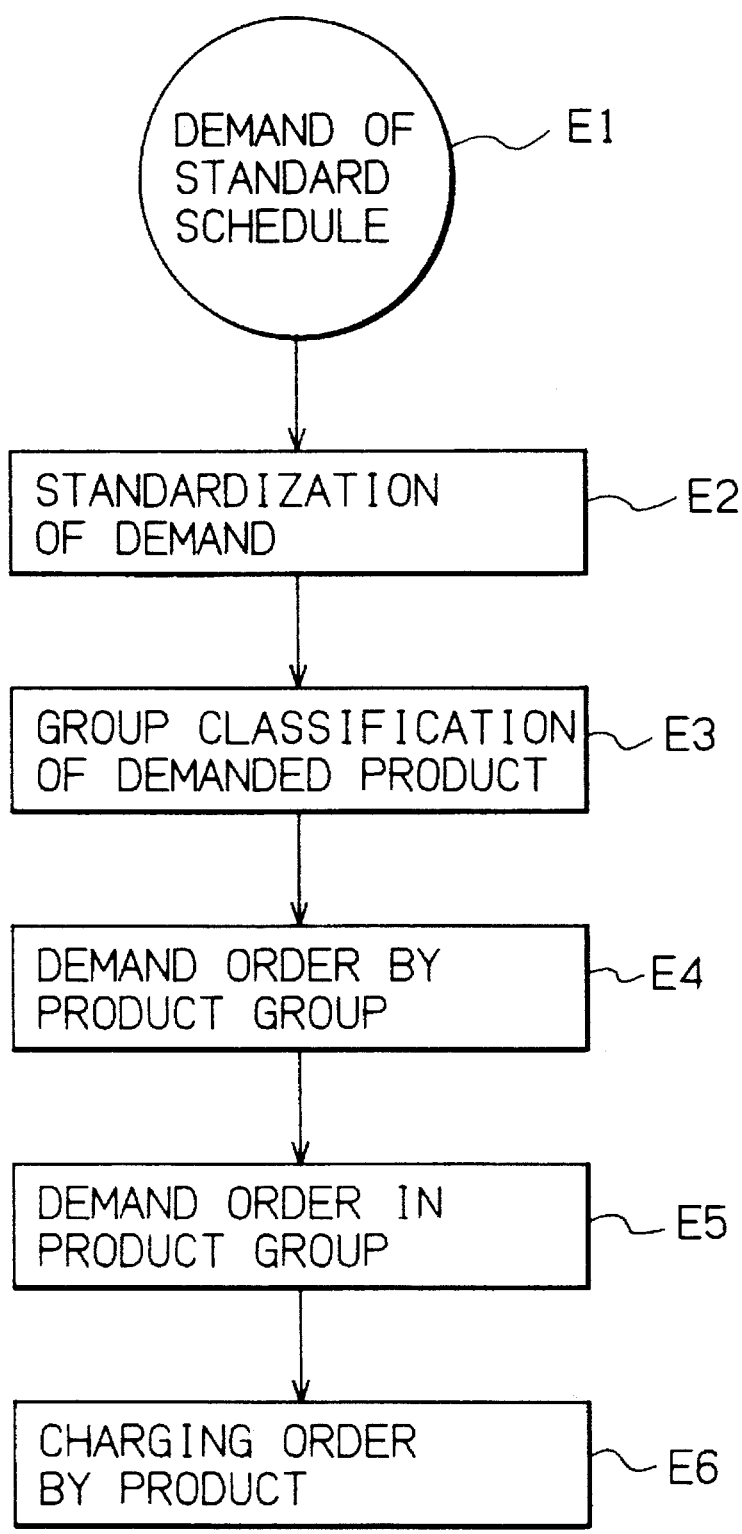
FIG. 27 is a flow chart of a charging plan.

FIG. 27 shows a charge plan flow to decide in what order wafers are charged into the production system shown in FIG. 1. A standard schedule demand capable of being realized is obtained by predetermining a manufacturing term necessary for procurement of parts and processing, with respect to the amount of work accomplished daily by a factory process and device unit (step E1). Daily demand and delivery, in which the number of products for which delivery is requested by clients is determined by a product and delivery unit, are satisfied with respect to the value obtained, and the work amount is standardized so that the work is produced on an average by the process and device unit, and the demand is standardized on the basis thereof (step E2). Products corresponding to the thus-standardized production amount demanded are classified into a group (in which the process is of the same category), that is, the product group (step 3).

Next, the demand order of the product group with the demand rate by the product group maintained such that the work is produced on an average at every process and device unit is decided (step E4). Further, the demand order of product with the rate of product within the product group maintained is decided (step E5). The demand order of products is orderly applied to the demand order of product groups in accordance with the decided demand order to thereby decide the demand order by product, that is, by unit of a single wafer, and this demand order is decided as the charge order (step E6). The processing procedure will be described hereinafter.

Figure 28:
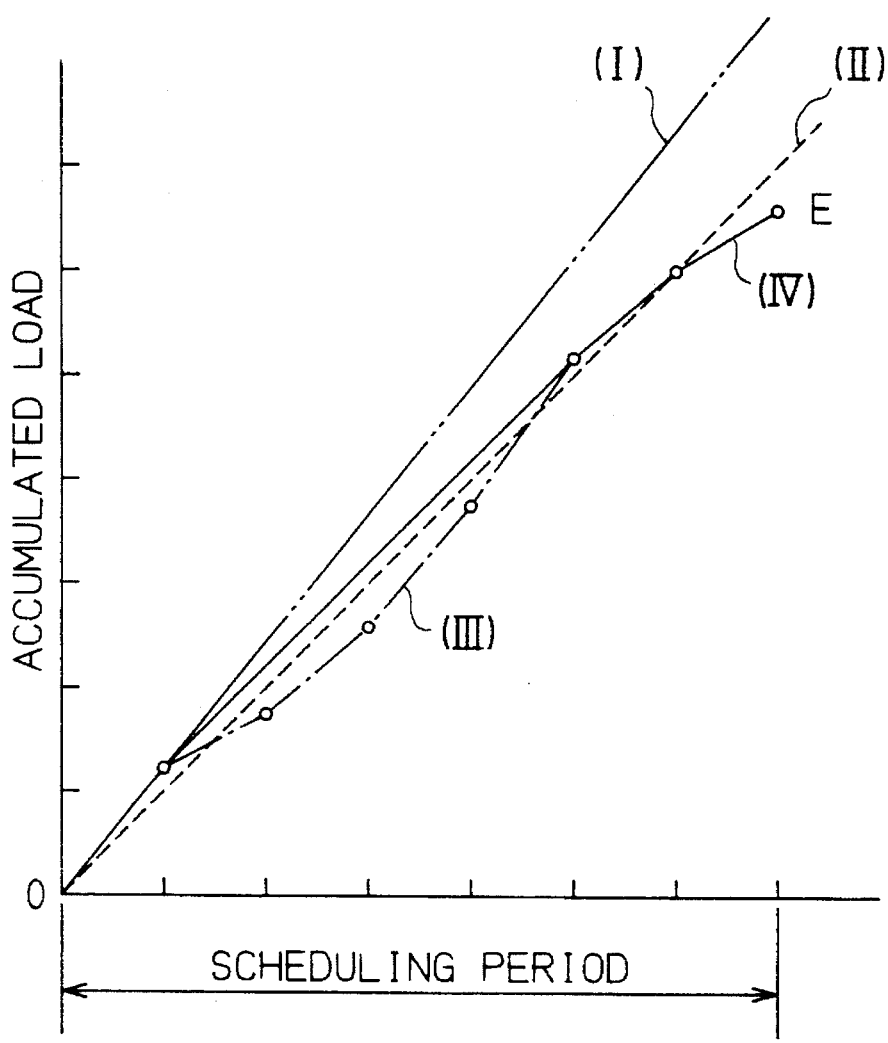
FIG. 28 is view showing a standardized load graph.

FIG. 28 shows a method for standardizing a demand amount in which a standard schedule demand is obtained to adjust and provide the work amount for standardizing the work caused by a change of recipe or the like of the apparatus in consideration of the capability of process and apparatus.

In FIG. 28, O is an original point, E is an end point indicating the work amount which is the total daily production amount during a scheduling period, and III is an accumulated most delayed load which is an accumulation of the work amount with respect to the production amount determined by observing the delivery at a most delayed term calculated from the delivery of the daily demand production amount and the production amount capable of being realized and observed. I is an accumulated limit load which is the work amount with respect to the realizable production amount capable of producing at the earliest. Imagining pins along load line III and at O and E, a rubber string stretched between the accumulated limit load I and the accumulated most delayed load, which is the work amount with respect to the minimum production amount (as indicated by circles) which has observed the delivery, gives the averaged work amount at a certain term of the object process and apparatus so that a polygonal line formed by the rubber string is satisfied with the demand and delivery when both O and E are tensioned, resulting in an averaged load IV. The daily demand is obtained from the load curve.

When a fraction occurs in the daily demand, adjustment is made so that the standardized demand, which is the accumulated demand standardized by the object process and apparatus unit, coincides with the total demand, which is the accumulated demand by the object process and apparatus within the scheduling period. When the daily work amount is very small, the work amount is adjusted to be the work amount until the minimum daily work amount can be secured. In this manner, the work amount can be standardized without delay of delivery with the realizable work amount, and the demand can also be standardized accordingly.

Next, the method for calculation of charge-order will be described. Terms shown in FIG. 29 will be defined. The total demanded production X is given by $$X = \sum_{j=1}^{M} \sum_{i=1}^{N(j)} Pji \ (j=1,2,\ldots,M; i=1,2,\ldots,N(j))$$

where M is the number of product groups for the kth day, N(j) is the number of products in the product group j, and Pji is the standardization factor. The interval reference loj of the product group j is given by $$loj = \frac{X}{\sum_{i=1}^{N(j)} Pji} \ (j=1,2,\ldots,M)$$

The interval reference loji of the product i of the product group j is given by $$loji = \frac{\sum_{i=1}^{N(j)} Pji}{Pji} \ (j=1,2,\ldots,M; i=1,2,\ldots,N(j))$$

The interval reference is obtained by product group and product.

The normalized interval Zoj is obtained from the interval reference loj and interval lj. Then, larger normalized interval Zoj is first processed by product group, and likewise, the normalized interval Zoji is obtained with respect to the product group, and processing is made by product. In this manner, the demand order by product unit is known. By charging in accordance with the order, the rate by product group and rate by product with respect to the demand are always maintained so that the production adjusted to the demand can be carried out.

The method for deciding the charge-order shown in FIGS. 27 to 29 will be described with reference to FIGS. 30 to 35 by way of specific examples.

Figures 30, 31:
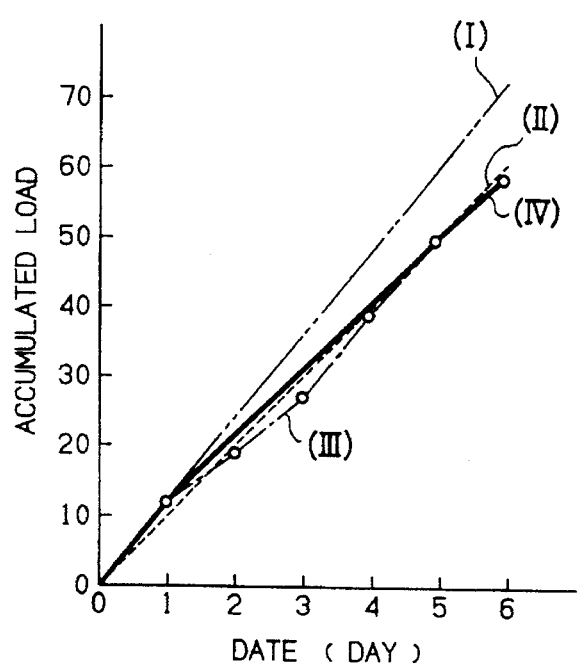
FIG. 30 is a view showing a standard schedule demand for an exemplary embodiment.
FIG. 31 is a view showing a standardized load graph for an exemplary embodiment.

FIG. 30 shows the demand amount with the scheduling period being 6 days. FIG. 31 shows an accumulated load graph prepared in accordance with the aforesaid demand. FIG. 32 shows the demand amount per standardized day from the standardized load of the graph. In FIG. 30, A, B and C indicate the product groups, and $a_1$–$a_4$, $b_1$–$b_4$ and $c_1$–$c_3$ indicate the products.

The method for calculation of demand order based on the aforesaid demand will be described. The first demand order by product group is calculated as follows:

Product group A loA=12/5=2.4
Product group B loB=12/5=2.4
Product group C loC=12/2=6

Since the initial values of the interval lj are all 1 according to the definition of FIG. 29, the normalized interval Zoj is:

Product group A ZoA=1/2.4=0.41
Product group B ZoB=1/2.4=0.41
Product group C ZoC=1/6=0.16

When two normalized intervals have the same value, the earlier product group is first charged, so the product group A is calculated as the demand order 1. Next, the demand order 2 is obtained. The interval lj is as follows:

Product group A $l_A$=1
Product group B $l_B$=2
Product group C $l_C$=2
The normalized intervals are as follows:
Product group A ZoA=1/2.4=0.41
Product group B ZoB=2/2.4=0.83
Product group C ZoC=2/6=0.33

The product group B is outputted as the demand order 2. The demand order 3 is obtained. The interval lj is as follows:

Product group A $l_A$=2
Product group B $l_B$=1
Product group C $l_C$=3
The normalized intervals are as follows:
Product group A ZoA=2/2.4=0.83
Product group B ZoB=1/2.4=0.41
Product group C ZoC=3/6=0.5

The product group A is outputted as the demand order 3. When obtained sequentially in a similar manner, 12 charge orders are as follows:

A, B, A, B, A, C, B, A, B, A, B, C.

Next, the first demand order for the 2nd day is obtained. The interval reference loj is as follows:

Product group A $l_{oA}$=7/2=3.5
Product group B $l_{oB}$=7/2=3.5
Product group C $l_{oC}$=7/3=2.3

Since the interval lj measures the interval continuously from the previous day, the following results:

Product group A $l_A$=3
Product group B $l_B$=2
Product group C $l_C$=1
The normalized intervals are as follows:
Product group A $Z_{oA}$=3/3.5=0.85
Product group B $Z_{oB}$=2/3.5=0.57
Product group C $Z_{oC}$=1/2.3=0.43

The product group A is outputted as the demand order 1. FIG. 33 shows the result of demand orders between the product groups.

FIGS. 34 and 35 show graphs of the demand amount prior to standardization and the demand amount after standardization, respectively. It will be understood from these graphs that the whole load amount is standardized, and the product groups are standardized.

The method for deciding the demand-order by product within the product group will be described hereinafter.

The interval reference loji within the product group A follows for each product:

Product $a_1$ loAa$_1$=5/2=2.5
Product $a_2$ loAa$_2$=5/1=5
Product $a_3$ loAa$_3$=5/1=5
Product $a_4$ loAa$_4$=5/1=5

Since the interval lli is 1, the normalized intervals Zoli follow:

Product $a_1$ ZoAa$_1$=1/2.5=0.4
Product $a_2$ ZoAa$_2$=1/5=0.2
Product $a_3$ ZoAa$_3$=1/5=0.2
Product $a_4$ ZoAa$_4$=1/5=0.2

The product $a_1$ is calculated as the demand order 1.

The following demand orders by product are decided similarly to the aforementioned method for deciding the demand order of the product groups. FIG. 36 shows the result in which the demand order by product is applied to the demand order by product group to decide the charge order. By charging in accordance with the demand order, a smooth flow of wafers is achieved.

(3.2 Circle line system)

Figure 37:
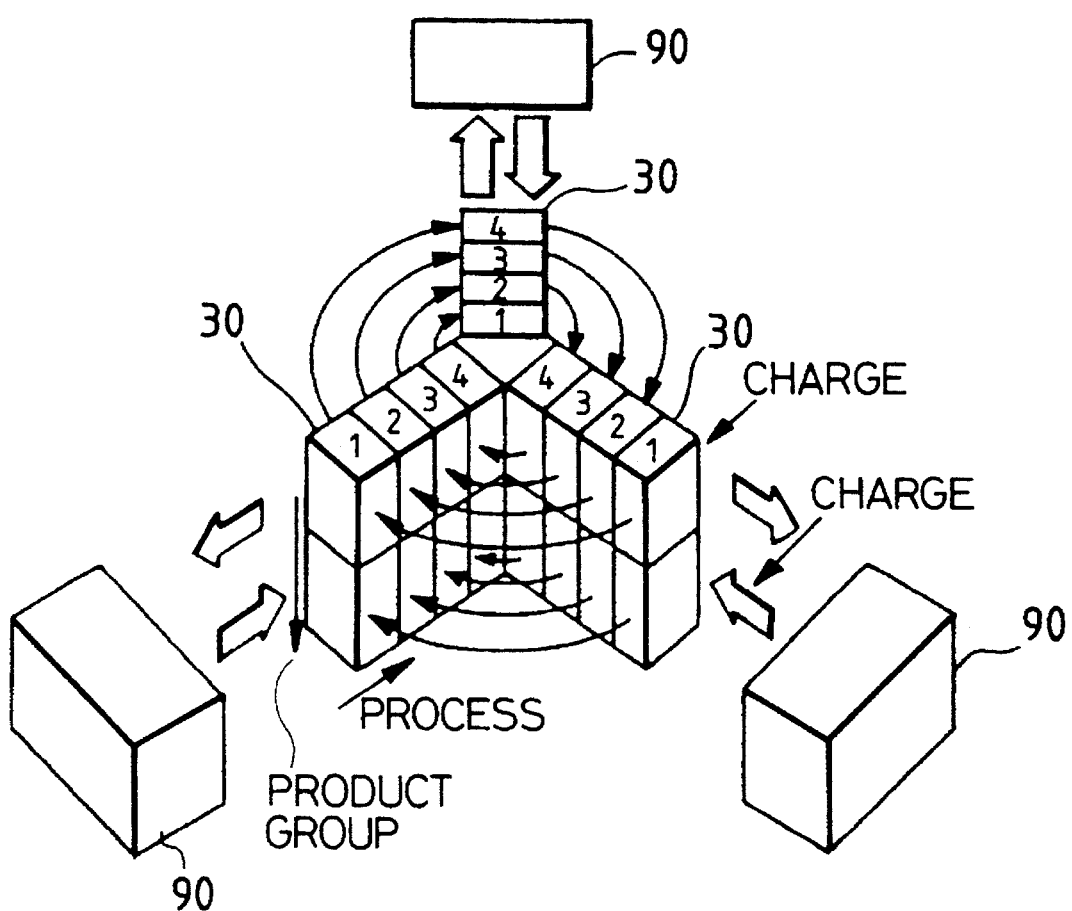
FIG. 37 is a view showing a concept of a progress control system.

FIG. 37 shows how to flow a wafer, that is, the progress control, in the apparatus shown in FIG. 1. Some equipment modules 90 are formed. Management is made by product group in which products of the same category of processing order are collected, and by process in a process flow to provide a securement of synchronization of production and a smooth flow of wafer for which is intended an improvement in availability of apparatus. Wafers of a variety of products and a variety of processes are prepared in front of the storage box 30, and the flow can be controlled by what wafer is charged. The standard inventory quantity which is the optimum inventory quantity is set by product group process, and an increase or decrease thereof is checked to allow wafers to flow in an orderly manner.

(3.3 Progress control)

Next, a method is shown which smoothly moves forward a wafer as if on an exclusive line by product group, as shown in FIG. 37. FIGS. 14 to 17 show data required for progress control of wafers of a variety of kinds and a variety of processes. The method for the progress control will be described.

Product groups A, B, . . . obtained by grouping products $a_1$, $a_2$ . . . of which process and recipe are of the same category as shown in FIG. 15 are prepared from the process flow data 120 by products $a_1$, $b_1$, . . . shown in FIG. 14 to decide the product group process flow data 121. FIG. 16 shows the inventory data 122 by product group in which the quantities are physically and actually inventoried. FIG. 17 shows the standard inventory data 123 in which the standard inventory quantity inventoried on the processes by product group is calculated. FIG. 18 shows the inventory data 124 by device in which actual inventory quantity by device is stored.

The progress control will be described hereinafter. Wafers of product group and process order of which inventory quantity of the inventory data 122 by product group is smallest with respect to the standard inventory quantity by processes shown in the standard inventory data 123 by sampling time are extracted. If there are some wafers corresponding to the minimum product group and process order, a process of early product group and early process order is extracted, and the pre-process is selected from the product group process flow data 121 to instruct starting of a wafer in that process. For example, assuming that the actual inventory quantity in the process order 3 of the product group B with respect to the standard inventory quantity is 2, which is smallest among the standard inventory data 124, a shortage of 3 is requested in the pre-process. The process order 2 which is the pre-process of the process order 3 of the product group B is extracted from the product group process flow data 121, and the product group and the processing apparatus with a wafer inventoried in the process are retrieved by the inventory data 124 by device to initiate the processing apparatus 60.

Thereafter, in this manner, a shortage is extracted by sampling to effect the progress control of wafer.

(4. Flow of wafer and operation of apparatuses)

FIG. 38 shows a flow of wafer in the structure shown in FIG. 1. The flow of wafer will be described by way of a flow chart shown in FIG. 39. When a wafer is charged (step G1), the wafer is carried to the processing apparatus corresponding to the first process by the carriage (step G2). The wafer is temporarily stored in the storage box (step G3). When a charge demand is received from the wafer processing apparatus, the wafer is charged into the processing apparatus (step G4). Upon termination of processing, a wafer number having data such as products is identified by the discriminator (step G5). Upon confirmation of the termination of the above process, the wafer is again temporarily stored in the storage box (step G6) and then carried by the carriage (step G7). Whether or not a series of processings has been completed is checked (step G8). If not terminated, the wafer is carried to the next process where this loop is repeated until a series of processings is terminated, and when terminated, the wafer is moved out (step G9).

Figure 40B:
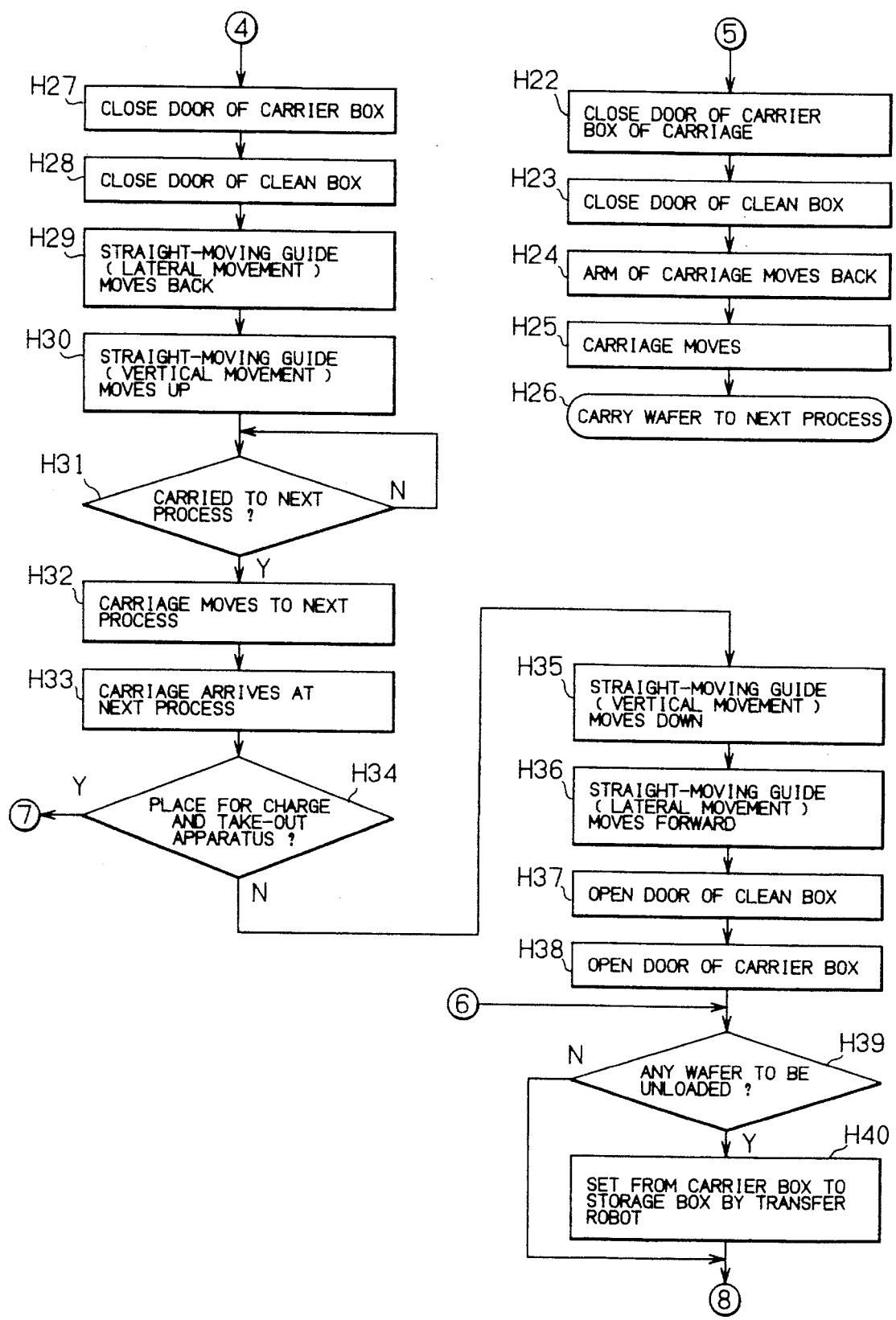
FIG. 40(a), (b) and (c) are flow charts of operation of an apparatus.
Figure 40C:
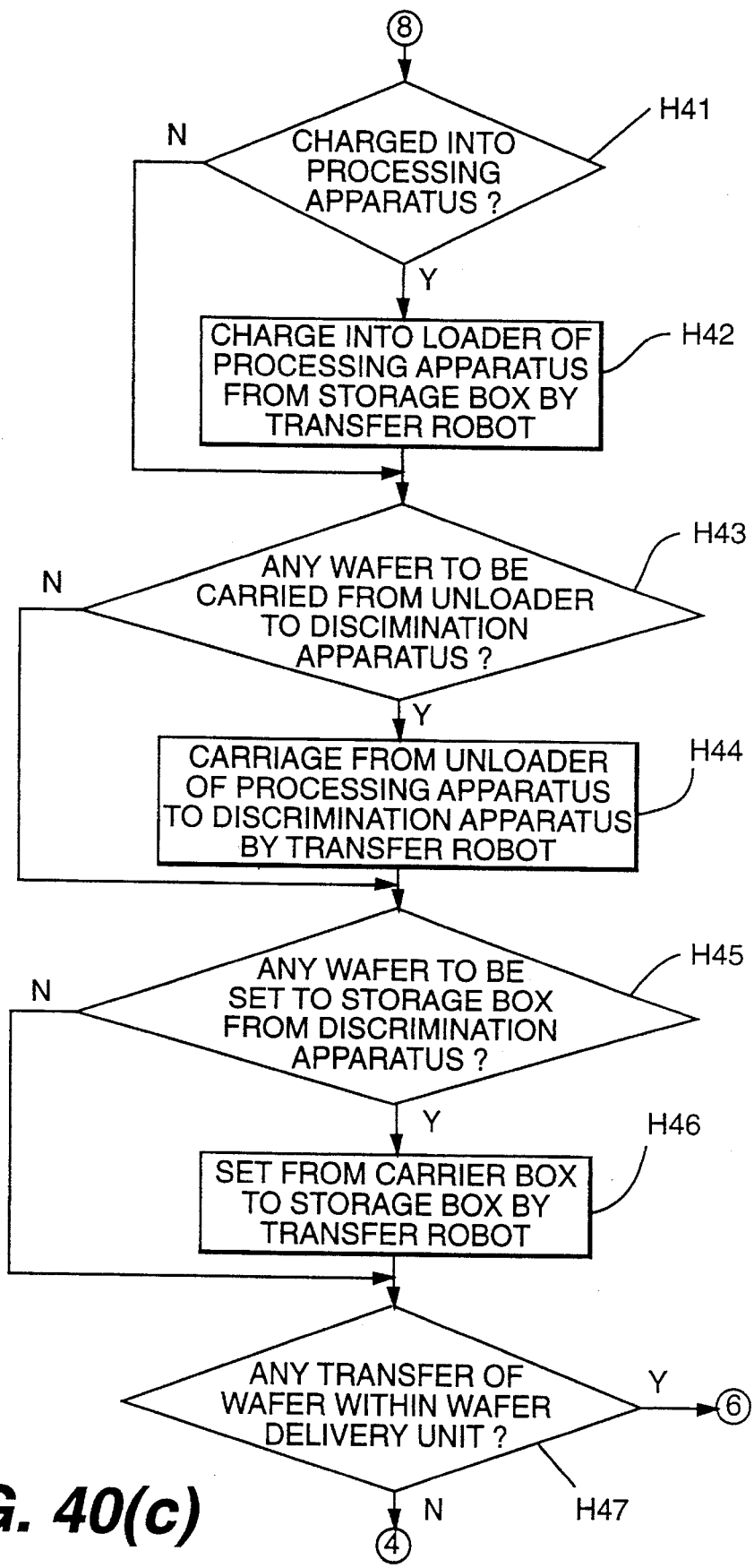

FIG. 40 shows a flow chart showing in detail the movement of a series of apparatuses from the charge of wafer to discharge thereof, in the apparatus structure shown in FIG. 1.

When a wafer is charged into the production system in FIG. 1, a wafer to be charged into the carriage box 101 of the vehicle 100 is set (step H1). Judgment is made whether or not the vehicle 100 arrives (step H2). If not arrived, the execution proceeds to step H11, and if arrived, the vehicle 100 moves on the floor to a predetermined location of the charge-removal device 80 (step H3). The vehicle stops at a predetermined position, and the arm 103 with the carriage box 101 loaded thereon moves forward to place the clean box door 84 in close contact with the carriage box door 104 (step H4). The clean box door 84 is opened (step H5), and the carriage box door 104 is opened (step H6).

Judgment is made whether or not a wafer to be set to the storage box 82 of the charge-removal device 80 is present (step H7). If present, the wafer is set from the carriage box 101 to the storage box 82 by the transfer robot 81 (step H8). If not present, the execution proceeds to the step H9. Judgment is made whether or not a wafer to be set to the carriage box 101 is present (step H9). If present, the wafer is set from the storage box 82 to the carriage box 101 by the transfer robot 81 (step H10), and if not present, the execution proceeds to the step H11. Judgment is made whether or not the carriage 2 arrives (step H11). If not arrived, the execution proceeds to the step H20, and if arrived, judgment is made whether or not a wafer to be unloaded from the carriage 2 to the charge-removal device 80 is present (step H12). If not present, the execution proceeds to the step H18, and if present, the vertically moving guide 9 is moved down (step H13) and the laterally moving guide 11 is moved forward (step H14) to place the carriage box door 12 in close contact with the clean box door 51.

The clean box door 51 is opened (step H15), and the carriage box door 12 is opened (step H16). The wafer is set from the carriage box 5 to the storage box 82 by the transfer robot 81 (step H17). Further, judgment is made whether or not a wafer to be loaded on the carriage 2 is present (step H18). If not present, the execution proceeds to the step H19, and if present, the wafer is set from the storage box 82 to the carriage box 5 by the transfer robot 81 (step H19).

Judgment is then made whether or not the transfer of wafer in the charge-removal device 80 has occurred (step H20). If so, the execution again returns to the step H2, and the steps H2 to H20 are repeated. If not, judgment is made whether or not the wafer is set to the carriage box 101 of the vehicle 100 (step H21). If not set, the execution proceeds to the step H27, and if set, the carriage box 101 door of the vehicle 100 is closed (step H22), and the clean box door 84 is closed j(step H23).

When the arm 103 of the vehicle 100 moves backward (step H24), the vehicle 100 starts to move (step H25) to carry the wafer to the next process (step H26). On the carriage 2 side, the carriage box 5 is closed (step H27) and the clean box door 84 is closed (step H28). The laterally moving guide 11 moves backward (step H29) and the vertically moving guide moves upward (step H30), returning to the carrying state.

Next, the execution waits until the next demand of carriage arrives (step H31). If arrived, the carriage 2 moves to the next process (step H32) and the carriage 2 arrives (step H33). When arrived, judgment is made as to whether it is at the location of the charge-removal device 80. If so, the execution returns to the step H2, and if not, the vertically moving guide 9 moves down (step H35) to cause the laterally moving guide 11 to move forward (step H36) to place the carriage box door 12 in close contact with the clean box door 84.

The clean box door is then opened (step H37) and the carriage box door 12 is opened (step H38). Judgment is made whether or not a wafer to be unloaded from the carriage box 5 is present (step H39). If not present, the execution proceeds to the step H41, and if present, the wafer is set from the carriage box 5 to the storage box 30 (step H40).

Next, judgment is made whether or not a wafer to be charged into the processing apparatus 60 is present (step H41), and if not present, the execution proceeds to the step H43 and if present, the wafer is charged from the storage box 30 to the loader portion 61 of the processing apparatus by the transfer robot 21 (step H42).

Next, judgment is made whether or not a wafer to be carried from the unloader portion 62 of the processing apparatus 60 to the discriminator 40 is present (step H43). If not present, the execution proceeds to the step H45, and if present, the wafer is carried from the unloader portion 62 of the processing apparatus to the discriminator apparatus 40 (step H44). Judgment is made whether or not a wafer to be returned from the discriminator apparatus 40 to the storage box 30 is present (step H45). If not present, the execution proceeds to the step H47, and if present, the wafer is set from the carriage box 5 to the storage box 30 by the transfer robot 21 (step H46).

Judgment is then made whether or not the transfer of wafer is present between the carriage 2—storage box 30, storage box 30—processing apparatus 60, processing apparatus 60—discriminator apparatus 40 and discriminator apparatus 40—storage box 30 within the wafer delivery unit 20. If present, the execution returns to the step H39 and the step H39 to step H47 are repeated, and if not present, the carriage box door 12 is closed (step H27), the clean box door 51 is closed (step H28), the laterally moving guide 11 is moved backward (step H29) and the vertically moving guide 9 is moved upward (step H30), returning to the carriage state. The carriage 2 is caused to proceed to the next process. In this manner, the processing of a wafer progresses as the wafer is carried by the carriage 2.

(5. Modified embodiments)

(5.1 Modified embodiment 1)

Figure 41:
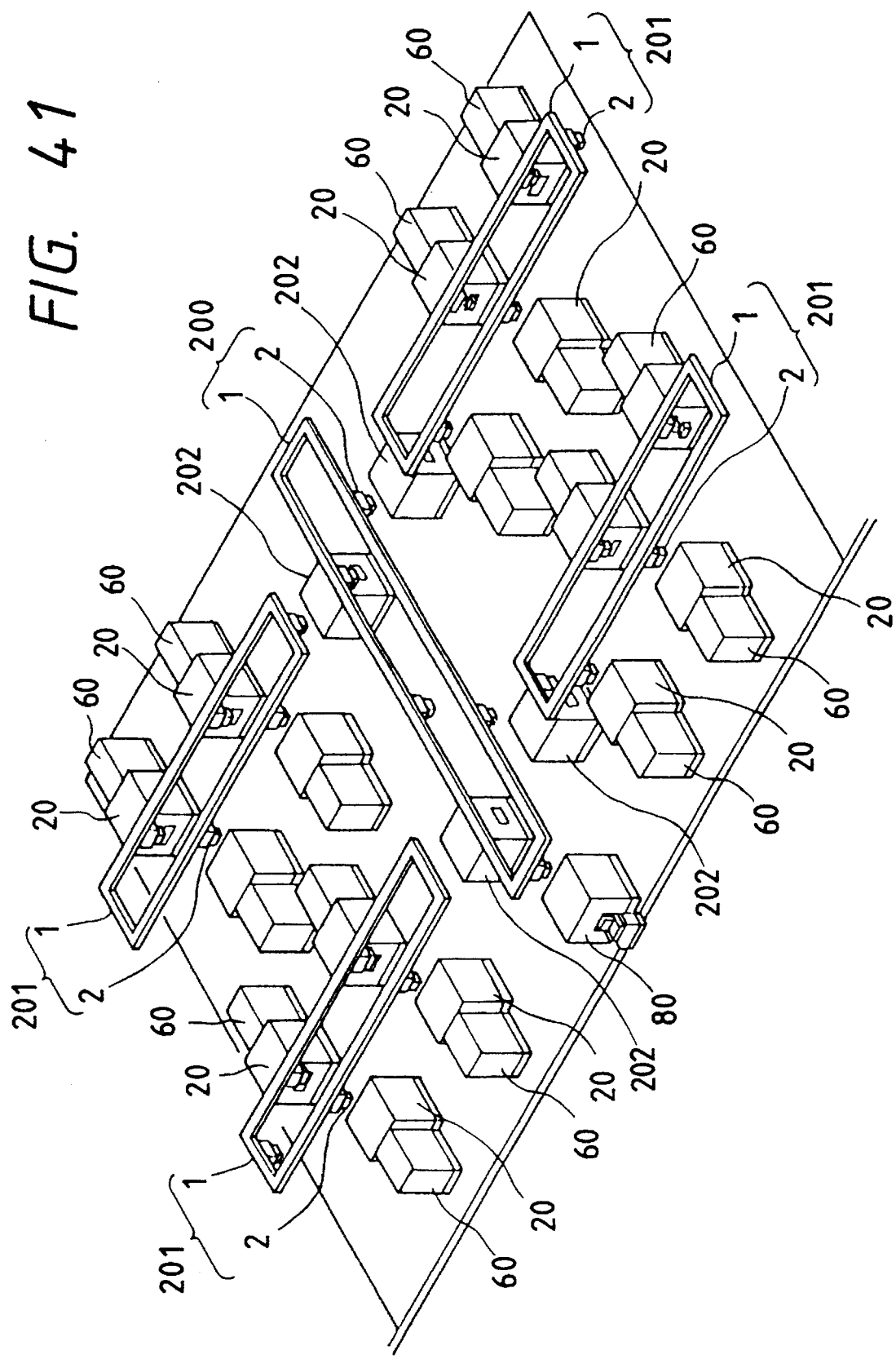
FIG. 41 is an entire structural view of a modified embodiment 1.

FIG. 41 shows an embodiment in which carriage rails are provided in the central portion and on the side thereof, unlike the structure shown in FIG. 1. On the ceiling in the central portion is provided a central carriage equipment 200 comprising a track-like carriage rail 1 and a carriage 2 traveling on the carriage rail 1 as a track. A station 202 is made to correspond to a side carriage equipment 201 in order to effect a delivery of a wafer between the carriage 2 of the central carriage equipment 200 and the carriage 2 of the side carriage equipment 201 in a clean atmosphere. Around the side carriage equipment 201 are provided some equipment modules 90 as fundamental units which comprise a wafer delivery unit 20, which is an apparatus for the delivery with respect to the carriage 2 in a clean atmosphere, and a processing apparatus 60. The carriage 2 is provided with a carriage box for storing and holding a wafer in a clean atmosphere similarly to the above-described embodiment.

At the end of the central carriage equipment 200 is provided a charge-removal device 80 for charging a wafer from the exterior to the production system and removing the wafer upon termination of a series of processes. When the wafer is charged from the charge-removal device 80, the wafer is carried by the carriage 2 of the central carriage equipment 200 to a position at which a suitable processing apparatus is provided of a station 202 of the side carriage equipment 201, and the wafer is transferred from the carriage box of the carriage 2 to the storage box of the station 202 by the transfer robot in the station 202. Next, when the carriage 2 in the side carriage equipment 201 arrives at the station 202, the wafer is transferred from the storage box to the carriage box of the carriage 2 in the side carriage equipment 201 by the transfer robot in the station 202. Upon termination of the transfer, the wafer is carried to the wafer delivery unit 20 of the suitable equipment module 90 and transferred from the carriage box of the carriage 2 to the storage box by the transfer robot in the wafer delivery unit 20. Upon termination of processing by the processing apparatus 60 of the side carriage equipment 201, the wafer is carried again to the original station 202 by the carriage 2 and transferred from the carriage box to the storage box by the transfer robot. When the carriage 2 of the central carriage equipment 200 arrives, the wafer is transferred from the storage box to the carriage box by the transfer robot and carried to the station 202 of the side carriage equipment 201 corresponding to the next process by the carriage 2 for processing.

This operation is repeated until a series of processings is terminated. Upon termination of the processing, the wafer is carried to the charge-removal device 80 by the carriage 2 in the central carriage equipment 200 and transferred from the carriage box to the storage box and then removed.

(5.2 Modified embodiment 2)

While in the carriage equipment of the production system shown in FIG. 1, the track-like carriage rail has been installed on the ceiling in the central portion, the carriage rail is provided in a lattice-like structure on the ceiling in this embodiment.

The equipment module is provided along the lattice-like carriage rail. When a command is issued to move a wafer from one equipment module to the other, the stand-by carriage responds thereto to extract the shortest route and the carriage moves along said route. When the other carriage stops or is moving in the midst of the route, the carriage moves in the shortest route where no other carriage is present.

In this way, the moving distance between the processing apparatuses becomes shortened and the period of production can be shortened.

(5.3 Modified embodiment 3)

Figure 42:
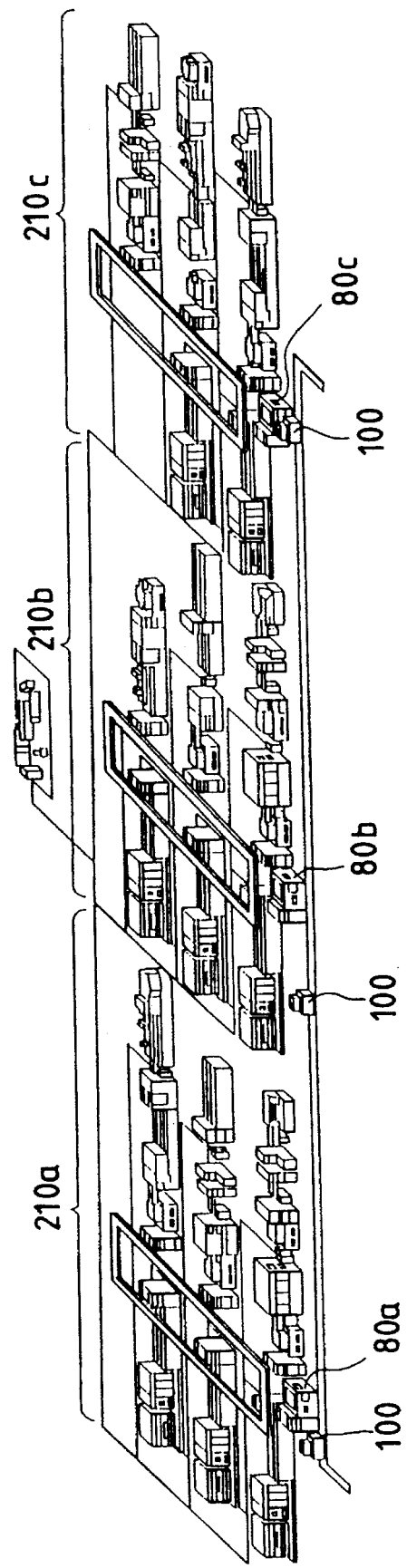
FIG. 42 is an entire structural view of a modified embodiment 3.

Another effective embodiment of the present invention will be described with reference to FIG. 42.

Three production lines (hereinafter referred to as production module 210) shown in FIG. 1 are linearly arranged. The charge-removal devices 80 of the production module 210 communicate with the vehicle as shown in FIG. 11 in order to carry a wafer between the production modules 210.

Figure 43:
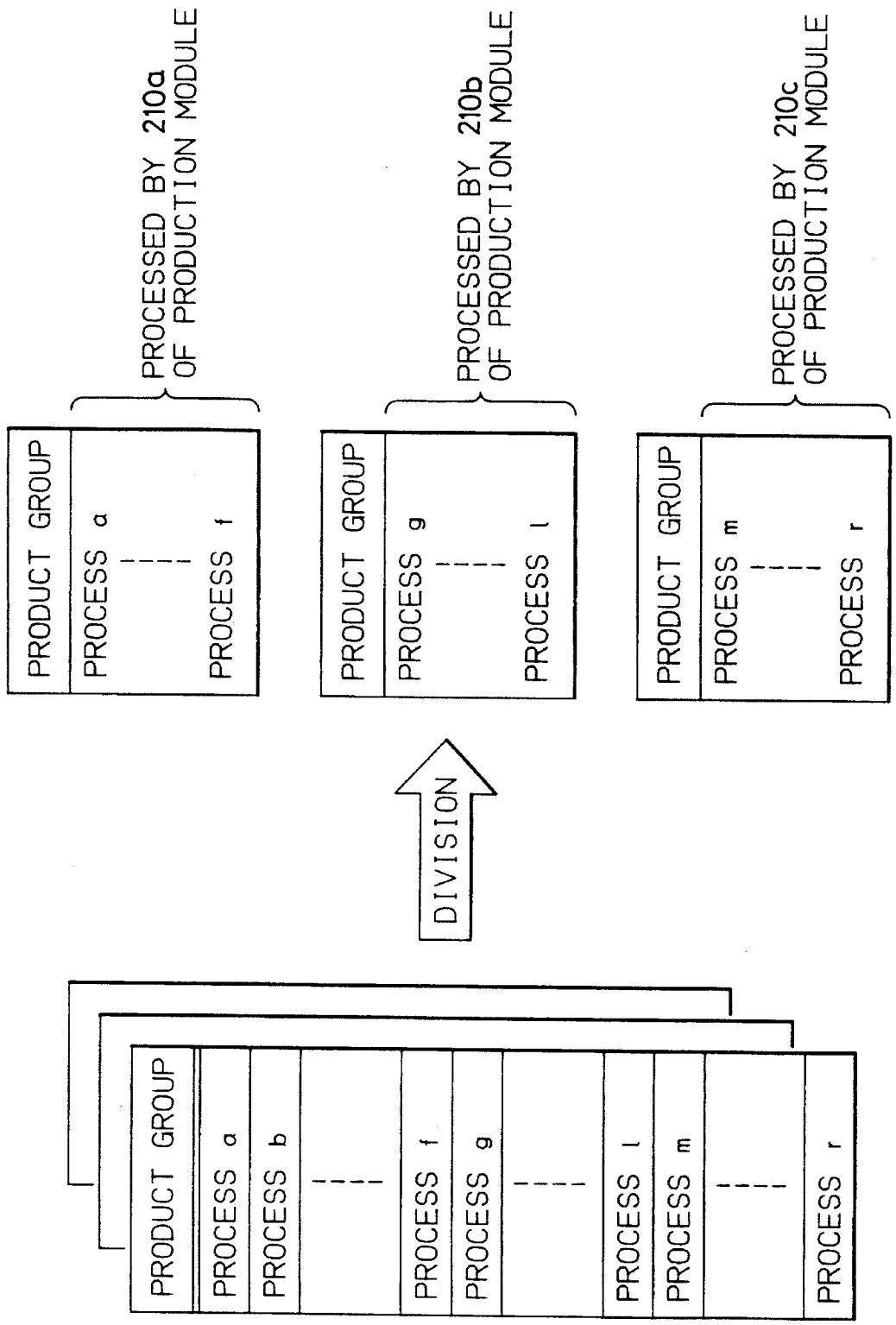
FIG. 43 is a conceptual view of a control system of a modified embodiment 3.

In the progress control, a process flow is divided into three parts, and one production module 210 responds to each divided process flow. That is, processing corresponding to the divided process flow is carried out for each production module 210. When the wafer processing has been terminated by the production module 210, the vehicle 100 carries a wafer to the next production module 210, and wafers are successively processed by the production module 210. For example, in case of the process flow as shown in FIG. 43, the entirety is divided into three parts as shown so that processes a to f are processed by a production module 210a, and the processed wafer is transferred to the vehicle 100 by a charge-removal device 80a and carried to a next production module 210b. A charge-removal device 80b receives a wafer from the vehicle 100 to charge it into the production module 210b. Processing from processes g to l is carried out by the production module 210b. Processes m to z are likewise processed by a production module 210c. In this manner, the whole process is shared by three production modules 210a to 210c.

Since the process flow is divided to form a product group by process flow, products in which only a part of the whole process flow has the same process flow are intensified into the same product group by each production module, and the product groups are reduced to facilitate the progress control. Furthermore, the number of processing apparatuses in each production module are reduced whereby the production module becomes small and the carriage distance of wafer becomes shortened.

(5.4 Modified embodiment 4)

Figure 44:
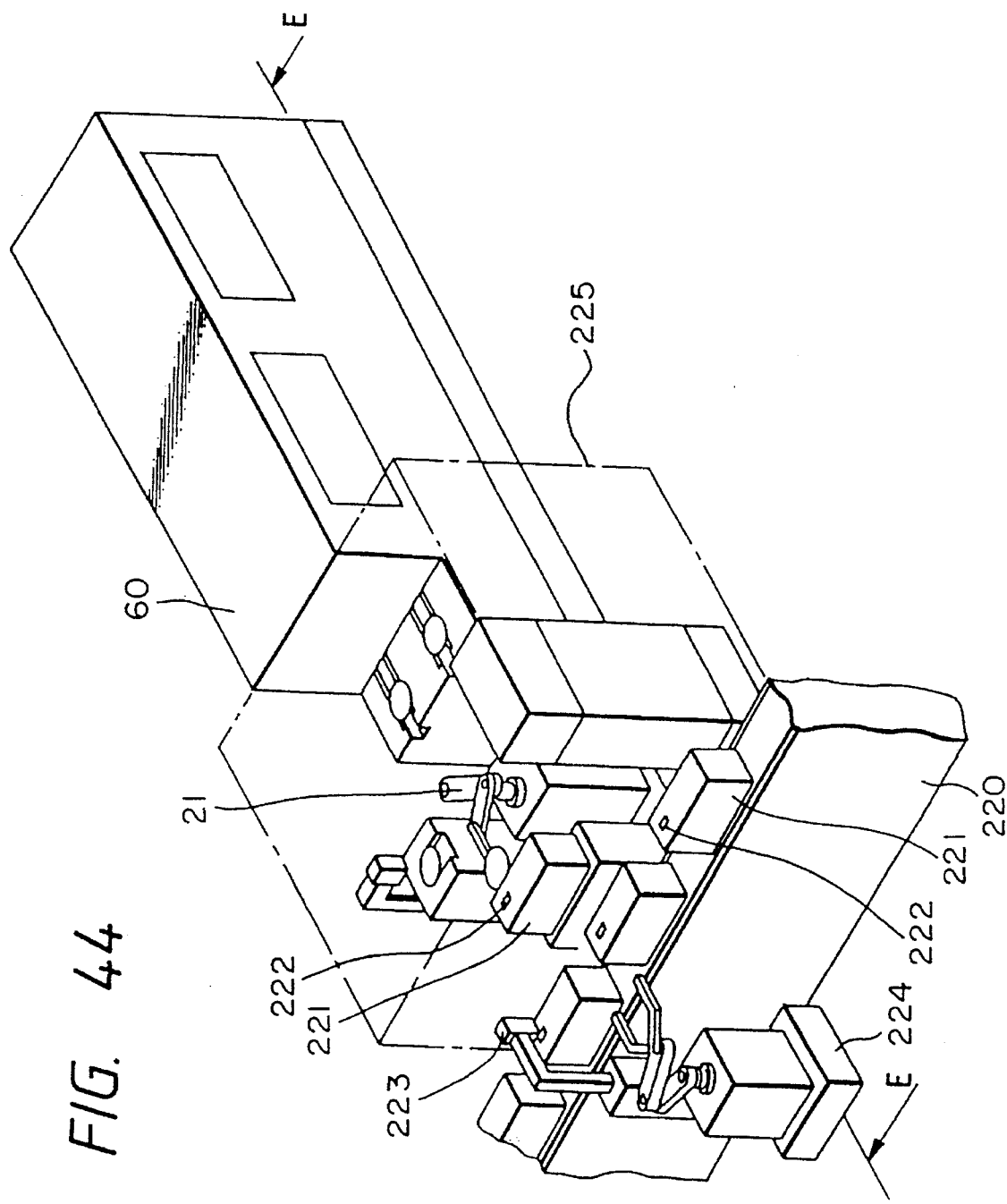
FIG. 44 is a structural view of a wafer delivery unit of a modified embodiment 4.
Figure 45:
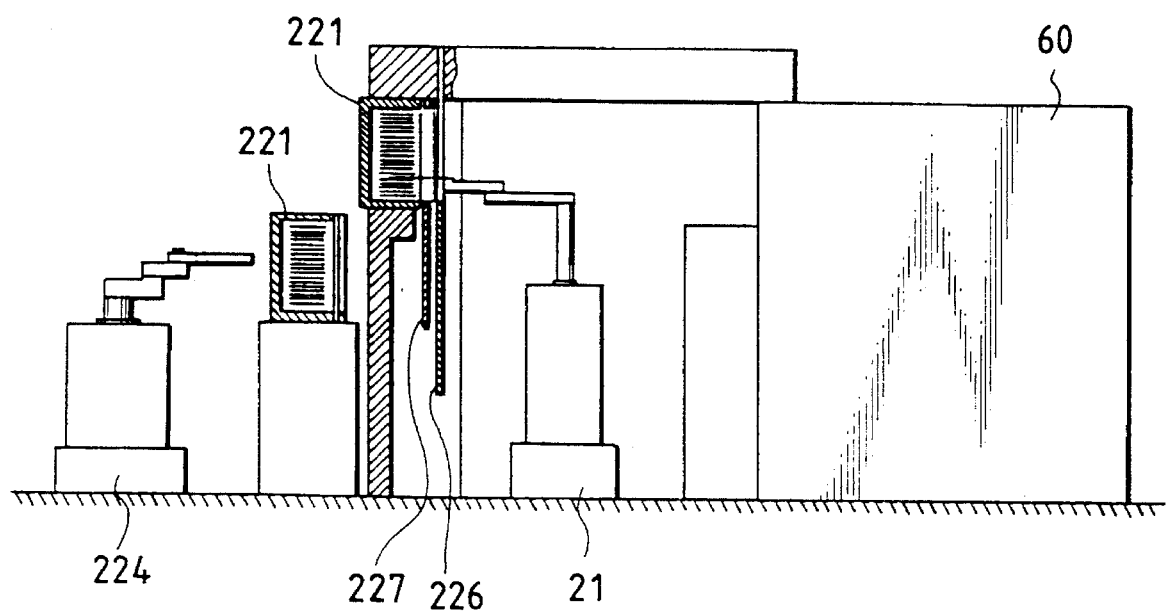
FIG. 45 is a sectional view taken on line E—E of FIG. 44 of a modified embodiment 4.

An embodiment in which a carriage travels along the track-like rail, in the carriage equipment having the structure shown in FIG. 1, is in the form of a belt conveyor. FIG. 44 shows a wafer delivery unit portion, and FIG. 45 shows a sectional view taken on line E—E.

A conveyor 220 which rotates in a single direction is provided in the central portion, and a cassette box 221 with a wafer stored therein is loaded on the conveyor 220. Wafers in the cassette box 221 are held one by one in the box, and a cassette box door 227 is provided frontwardly of the cassette box 221. The cassette box door 227 is closed during carriage, and the cassette box door 227 is opened when the wafer is removed and stored. A marking with a serial number of the cassette box 221 coded is applied to the upper surface of the cassette box 221. A code reader 223 for identifying a number of the cassette box 221 is installed in front of the wafer delivery unit.

One or more wafers whose destination is the same are put into the cassette box 221 and are carried in a clean state. When the cassette box 221 placed on the conveyor 220 is carried to the wafer delivery unit, a number of the cassette box 221 is read by the code reader 223. At this time, when the cassette box 221 to be received is present, this cassette box 221 is removed from the conveyor 220 by the robot 224 to set it to the clean box door 226 of the clean box 225. In the thus set condition, the wafer is transferred.

This transfer is carried out by opening the clean box door 226 of the clean box 225, opening the cassette box door 227 of the cassette box 221 and setting the wafer to the storage box by the transfer robot 21 in a manner similar to the case where the carriage box 5 of the carriage 2 is set as shown in FIGS. 3 and 4. The wafers having a common destination among wafers having been processed are set to the cassette box 221. In this manner, when the exchange of a wafer in the cassette box 221 is terminated, the cassette box door 227 and clean box door 226 are closed, and the wafer is again returned to the conveyor 220 by the robot 224 and is carried to the next process.

In this manner, processing is successively progressed to terminate a series of wafer processings.

(5.5 Modified embodiment 5)

While in the structure of the carriage equipment shown in FIG. 41, a system in which the station 202 is used in the interface portion between the central carriage equipment 200 and the side carriage equipment 201 has been described, an embodiment in which the interface portion is connected by the carriage rail and a branch device is provided on the connection portion will be described hereinafter.

When the carriage traveling along the central carriage equipment 200 moves to the branch device (not shown) and where the carriage 2 moves toward the side carriage equipment 201, when the branch device is changed in point, the carriage 2 moves toward the side carriage equipment 201. When necessary movement and carriage work are terminated in the side carriage equipment 201, the point is again changed at the branch device, and the carriage moves toward the central carriage equipment 200. Thereafter, the operation is likewise repeated until the processing is terminated.

(5.6 Modified embodiment 6)

While in the above-described embodiment, an example has been illustrated in which a rail carriage with wheel guides was used for the carriage of wafers between the equipment modules, an embodiment in which a railless carriage is used will be described hereinafter.

In the present invention, a railless carriage is provided in place of the carriage rail and the carriage in the structure as shown in FIG. 1. In this case, it is possible for the carriage to carry a wafer from one suitable equipment module to another in the shortest distance. To this end, the carriage normally moves around the equipment modules to transfer and carry the wafer in a manner similar to the aforementioned embodiment, but the following arrangement can be provided. That is, when wafers stored in the storage box within the wafer delivery unit of the equipment module are reduced to a level less than a predetermined quantity of inventory, the wafer delivery unit issues a command to the carriage to carry the wafers of that product and process from the wafer delivery unit of the processing apparatus corresponding to the previous process. Then, the carriage is deviated from the carriage passage along which the carriage normally travels and travels to the processing apparatus to carry the wafer corresponding to the processing apparatus demanded by the first mentioned processing apparatus. In this manner, it is possible to freely carry a wafer from one processing apparatus to the other as needed.

In addition, by the use of the railless carriage, flexible response can be made to the change in layout resulting from an increase in number of equipment and a change in process.

(5.7 Modified embodiment 7)

Figure 46:
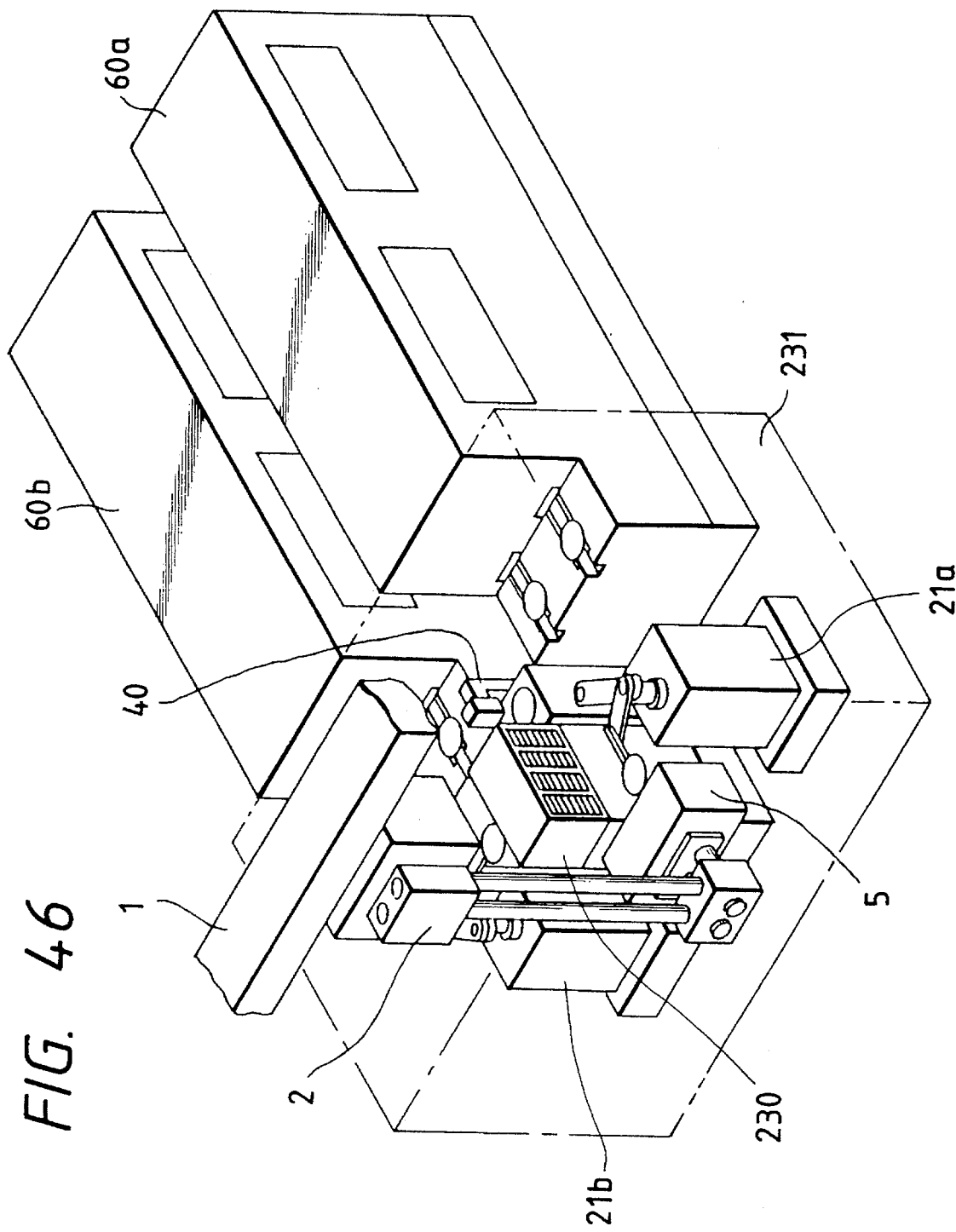
FIG. 46 is a structural view of a wafer delivery unit of a modified embodiment 7.

FIG. 46 shows an embodiment of the present invention in which in continuous processing by different processing apparatuses, a wafer can be delivered between the processing apparatuses without a carriage.

There are provided a storage box 230 in which a wafer can be moved in and out from both sides between two processing apparatuses in order to deliver a wafer between two processing apparatuses, and a discriminator 40 for reading a wafer number described on a wafer. A transfer robot 21 for handling a wafer is provide on each processing apparatus 60. These devices are enclosed in a clean box 231 together with a loader portion and an unloader portion of the processing apparatus in order to maintain an atmosphere surrounding the wafer clean. This clean box 231 is designed to set the carriage box 5 for the delivery of wafer with respect to the carriage 2 similarly to FIG. 2.

Where a wafer is continuously processed by two apparatuses, the wafer is transferred in order of the carriage box 5→storage box 230→processing apparatus 60a→discriminator 40→storage box 230 in the similar procedure to that of the above-described embodiment. In order to process the wafer in the processing apparatus 60b, the wafer having been processed by the processing apparatus 60b is transferred from the storage box 230 to the processing apparatus 60b by the transfer robot 21b. Upon termination of processing, the wafer is transferred in order of the processing apparatus 60b→discriminator 40→storage box 230. The wafer having been subjected to predetermined processing is transferred to the carriage by the transfer robot 21a and carried to the next process. Where such a continuous processing is done by two processing apparatuses 60a and 60b, a storage box 230 and a clean box 231 common to two processing apparatuses 60 are provided whereby a wafer can be delivered between the processing apparatuses 60 without the carriage, thus bringing forth the effect that the carriage time is short and handling time is reduced.

(5.8 Modified embodiment 8)

The storage boxes 30 for storing wafers are provided for every wafer delivery unit 20 and distributed as shown in FIG. 2 of the embodiment. However, in this embodiment, a storage box for concentratedly storing wafers is provided in the central portion of the carriage equipment, which will be described.

In the periphery of the storage box located in the central portion is provided carriage equipment for carrying wafers to the processing apparatuses and again returning wafers processed by the processing apparatuses to the storage box.

By the concentrated storage of wafers, a quantity of inventory of boxes corresponding to suitable products and processes can be checked. The state of progress of wafers, for example, at what process the operation is delayed or whether or not the wafer flows while maintaining the rate between products are easily grasped and the management becomes easy.

(5.9 Modified embodiment 9)

In the structure shown in FIG. 41, the station 202 is provided in the interface between the central carriage equipment 200 and the side carriage equipment 201, and the wafer delivery unit 20 and the processing apparatus 60 are combined around the side carriage equipment 201 to provide the equipment module 90. In this embodiment, however, an embodiment will be described in which the storage box 30 is not provided in the wafer delivery unit 20 but wafers are stored only by a storage box of the station 202.

A wafer is transferred from the carriage 2 of the central carriage equipment 200 to the station 202 and temporarily stored in the storage box. The wafer is placed from the station 202 to the carriage 2 of the side carriage equipment 201 to carry it frontwardly of the wafer delivery unit 20. The transfer robot removes the necessary wafer from the carriage 2 and after the wafer has been processed by the processing apparatus 60, the wafer is placed on the carriage 2. At this time, the carriage 2 is controlled while adjusting to timing at which wafer is moved out of the processing apparatus 60 and timing at which wafer is charged into the processing apparatus 60.

In this way, a system can be realized in which the storage box 30 for storing the wafer is not provided on the wafer delivery unit 20 but the wafer is merely stored in the storage box of the station 202 which is the interface portion between the central carriage equipment 200 and the side carriage equipment 201. It is effective to provide the station 202 the same kind of processing apparatus to store and manage the wafer.

In this manner, it is possible to supply wafers from a single storage box to a plurality of processing apparatuses, thus flexibly selecting the processing apparatuses.

(5.10 Modified embodiment 10)

An effective embodiment of the present invention will be described hereinafter.

In this embodiment, a storage box is not provided in a wafer delivery unit but the carriage means has a storage function.

The operation of the present embodiment will be described.

The processing apparatus receives a start command from the host controller. When processing is ready, the carriage is requested to charge a wafer. The carriage travels to a position frontwardly of the wafer delivery unit of the processing apparatus in response to the demand of the processing apparatus to set the carriage box to the wafer delivery unit. Then, the transfer robot transfers a wafer from the carriage box to the loader portion of the processing apparatus.

When processing of a wafer has been terminated, the carriage is requested to remove a wafer. Then the carriage travels to a position frontwardly of the wafer delivery unit of the processing apparatus in response to the demand to set the carriage box to the wafer delivery unit. The transfer robot removes a wafer having been processed from the unloader portion to set it to the discriminator. The discriminator identifies a wafer number of the wafer. The wafer is then received into the carriage box.

In this manner, the wafer is carried adjusting to timing of the processing apparatus whereby the wafer is not required to be stored every processing apparatus but in processing, the wafer can be freely selected. When the processing apparatus fails, the processing apparatus is merely disconnected from the production system. It is not necessary to once again carry the wafer in the storage box to another processing apparatus and wait for processing until the trouble is restored.

(5.11 Modified embodiment 11)

Another effective embodiment of the present invention will be described hereinafter.

In the previous modified embodiment, a wafer number is attached to a wafer against the trouble of controllers or processing apparatus. The wafer number has been identified for the purposes of confirming that processing was properly carried out and that the wafer number was positively read. However, if the processing is carried out without fail by the processing apparatus and the wafer number is positively read without being erased during the processing of the processing apparatus, it is not necessary to read the wafer number after all the processing has been completed.

For the reason above, if the identification of wafer need not be made, it is not always necessary to provide a wafer discriminator on the wafer delivery unit. This gives rise to an effect that the wafer delivery unit can be simplified and the transfer work of wafer can be reduced.

(5.12 Modified embodiment 12)

The embodiment in which the storage box is not provided in the wafer delivery unit but the carriage has the storage function and the embodiment in which the identification of wafer is not carried out after processing have been previously shown. An embodiment in which these two elements are combined can also be constructed. That is, a wafer is directly charged into the processing apparatus from the carriage box of the carriage by the transfer robot, and after processing, the wafer is stored in the carriage box.

The function of the wafer delivery unit is simplified as mentioned above whereby in addition to the effects mentioned above, there is a further effect that the waiting time of the carriage becomes shortened since the processed wafer can be transferred directly to the carriage box from the processing apparatus.

(5.13 Modified embodiment 13)

The structure shown in FIG. 1 has employed a system in which a wafer is put in and closed by the carriage box during carriage, and a wafer is temporarily stored in the storage box of the wafer delivery unit or transferred, only the area required for carriage and storage so as to maintain a clean atmosphere by the clean box is placed in a clean atmosphere. An embodiment in which the whole building is cleaned may be provided.

If the whole building is made clean, even when a wafer is carried or temporarily stored, the wafer may be left exposed, and therefore, closing is not necessary. Therefore, operation of moving in and out of the closed state is eliminated, thus facilitating management, carriage and transfer of wafer.

(5.14 Modified embodiment 14)

Figure 47:
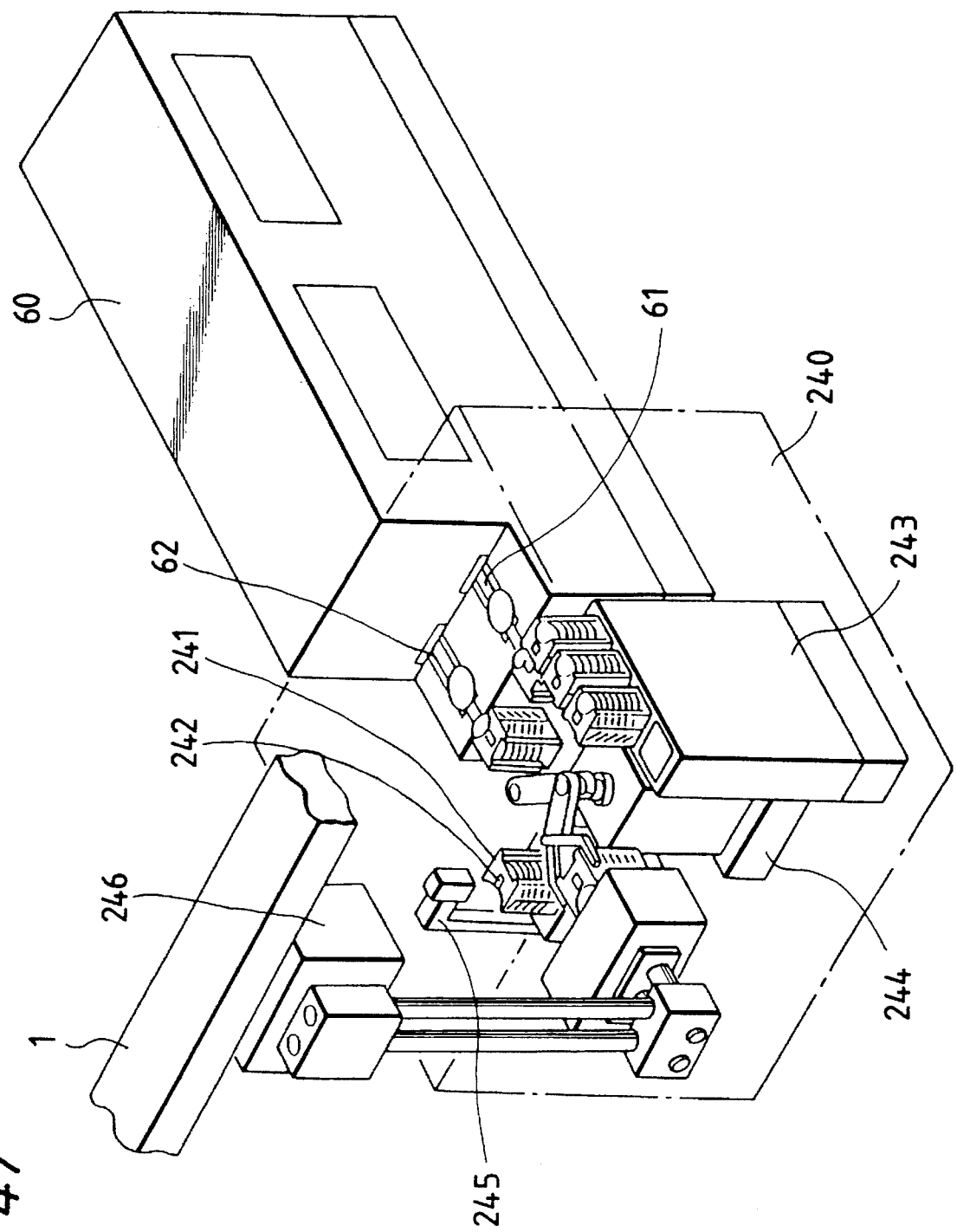
FIG. 47 is a structural view of a cassette delivery unit of a modified embodiment 14.

Still another effective embodiment of the present invention is shown in FIG. 47.

The charge of wafer into and removal thereof from the processing apparatus 60 often rely upon a cassette-to-cassette system (C—C system). As one embodiment of the present invention, an embodiment will be described in which a cassette containing a wafer is charged into or removed from the processing apparatus.

In this case, an IC card 242 capable of writing and reading information is provided on the cassette, and a product of a wafer in the cassette 241 and a serial number by product group are stored in the IC card 242.

A cassette delivery unit has a function to deliver the cassette 241 between the cassette carriage 246 and the processing apparatus 60 and has the structure as follows: The cassette delivery unit 240 comprises a cassette storage box 243 for storing the cassette 241, a cassette transfer robot 244 for handling the cassette 241, a data write/read device 245 for writing information of the IC card 242 provided on the cassette 241 and reading it as needed, and a clean box (not shown) for maintaining these devices and a loader portion 61 and an unloader portion 62 of the processing apparatus 60 in a clean atmosphere.

A cassette carriage 246 carries the cassette 241 between equipment modules.

The delivery of cassette 241 is carried out by a procedure substantially similar to that of the delivery of a wafer except for the following described below.

The processing apparatus 60 successively processes wafers within the cassette set from the cassette storage box 243 to the loader portion 61. Upon termination of processing, a wafer is received into the cassette 241, which has been set in advance to the unloader portion 62. When processing for one cassette is terminated, the cassette 241 of the unloader portion 62 is set to the data write/read device 245. A wafer number of a newly received wafer is written in the IC card 242. The cassette 241 of the emptied loader 61 is transferred to the unloader portion 62, and a wafer in a next cassette is received.

The wafer number of the wafer received is written on the IC card 242 to update it, whereby the management, carriage and charge by the cassette 241 become possible. Thereby, this can be easily integrated into the processing apparatus of the existing cassette-to-cassette system, and 25 wafers can be collectively transferred to thereby reduce the transfer operation of the robot.

(5.15 Modified embodiment 15)

If the following arrangement can be provided in the entire structure shown in FIG. 1, the progress of a wafer can be managed without describing a wafer number (a serial number by product and product group) into a wafer. That is, if information of a wafer can be positively managed by means of the provision of a controller for a backup so that a locus of a wafer can be properly traced by the processing apparatus or the like and data is not erased, the necessity of describing and managing a wafer number on a wafer is eliminated.

(5.16 Modified embodiment 16)

Instead of a system in which a wafer number (a serial number by product and product group) is merely first impressed on a wafer as shown in FIG. 6 so that the wafer has data, a symbol indicative of termination of process is written in the wafer itself when suitable processing is terminated.

If the wafer itself is identified by the aforesaid method, it is possible to positively determine what step is terminated. The processing state is not traced and managed for each wafer, but data can be managed from the actual result. Therefore, erroneous management of wafers can be eliminated.

Further, data such as processing conditions, results and the like are coded and added whereby the state of a processing record and processing results can be confirmed.

(5.17 Modified embodiment 17)

The exchange of a wafer between the carriage box and the storage box is generally often carried out continuously with respect to a plurality of wafers of the same product and process. One embodiment of a gripper will be described with reference to FIGS. 48 to 51 in which a plurality of wafers are collectively exchanged to reduce the exchanging time.

Figure 48:
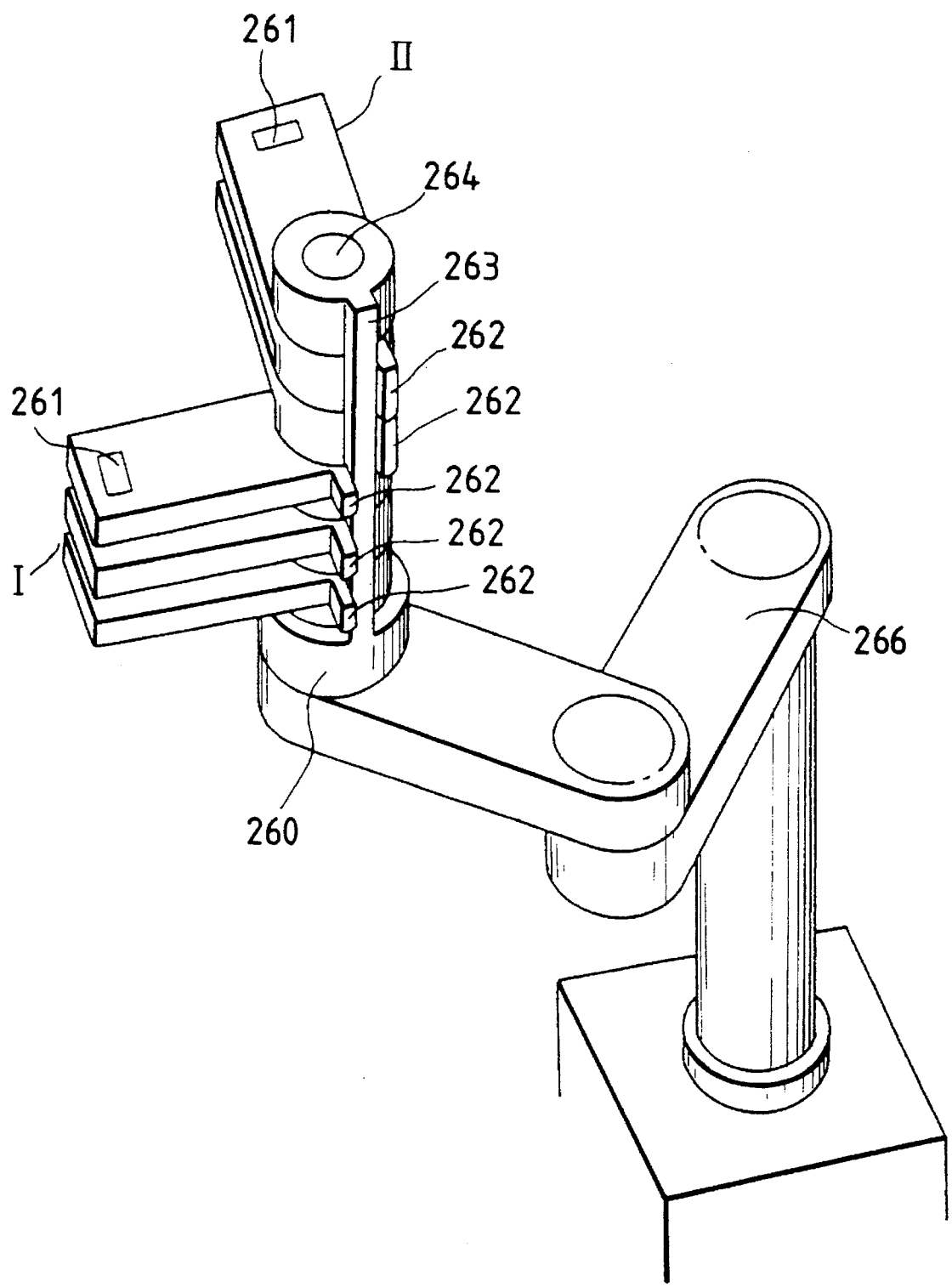
FIG. 48 is a structural view of a gripper of a modified embodiment 17.

FIG. 48 shows a gripper 260 provided with five wafer attraction portions 261. The wafer attraction portion 261 can be switched between the using position (indicated at I) and the stand-by position (indicated at II), and one to five wafers are collectively exchanged.

When the wafer attraction portion 261 is in the using position, a pawl 262 is attracted by a magnet 263 to lock that position.

Figure 49:
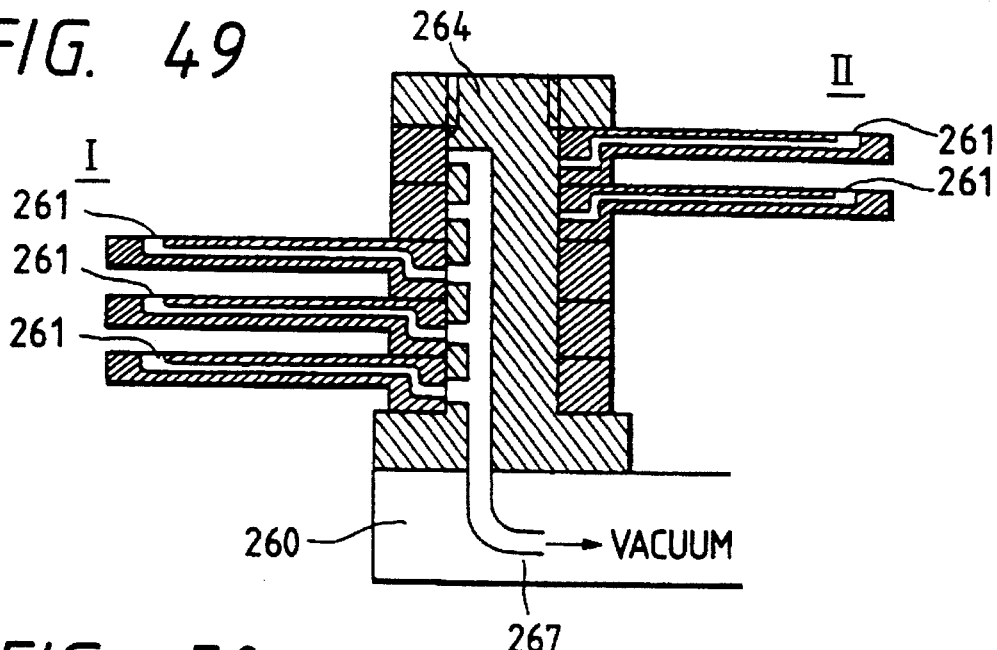
FIG. 49 is a view showing a switching mechanism of a pipe of a modified embodiment 17.

FIG. 49 shows a switching mechanism of a pipe 267 for attracting a wafer under vacuum. The pipe 267 is opened only at one side of a shaft 264. The wafer attraction portion 261 in the stand-by position is cutoff from a vacuum passage so as not to impair an attraction force of the wafer attraction portion 261.

Figure 50:
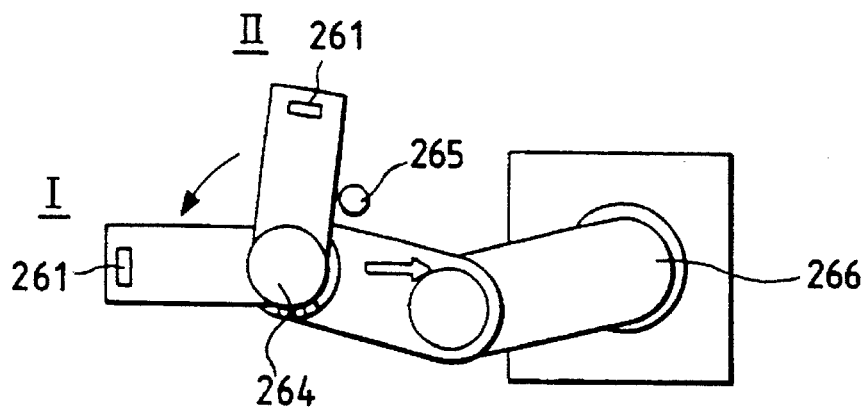
FIGS. 50 and 51 are explanatory views for operation of a transfer robot of a modified embodiment 17.
Figure 51:
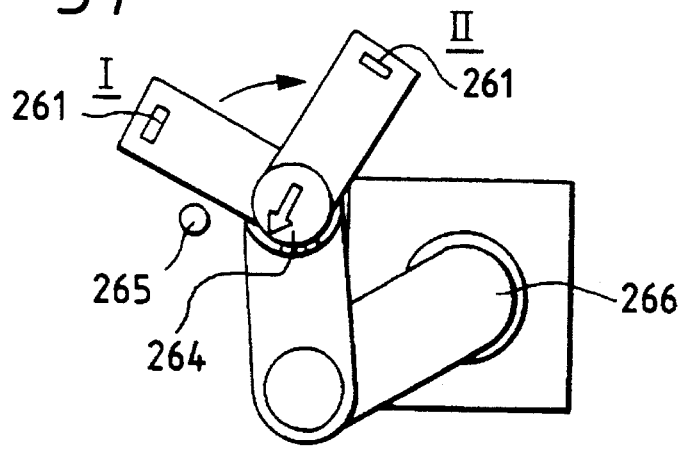

FIGS. 50 and 51 show the operation of an arm of a robot for switching. As shown in FIG. 50, a post 265 is fixed near the robot so that the wafer attraction portion 261 in the stand-by position II is engaged outwardly of the post 265 with the shaft 264 of the robot as a reference, and the robot arm 266 is contracted in a direction toward the robot shaft whereby the wafer attraction portion 261 can be switched to the using position I. At this time, a height of the robot is changed to adjust the height of the end of the post 265 relative to the height of the wafer attraction portions to be switched. As shown in FIG. 51, the shaft 264 is set internally of the post 265 with the robot shaft as a reference to engage the wafer attraction portion 261 with the post 265 to move the robot arm 266 in a direction as indicated by the arrow whereby the wafer attraction portion 261 can be switched to the stand-by position II. During the carriage of a wafer, the robot arm is rotated upwardly so as not to engage the wafer attraction portion 261 with the post 265.

(5.18 Modified embodiment 18)

Figure 52:
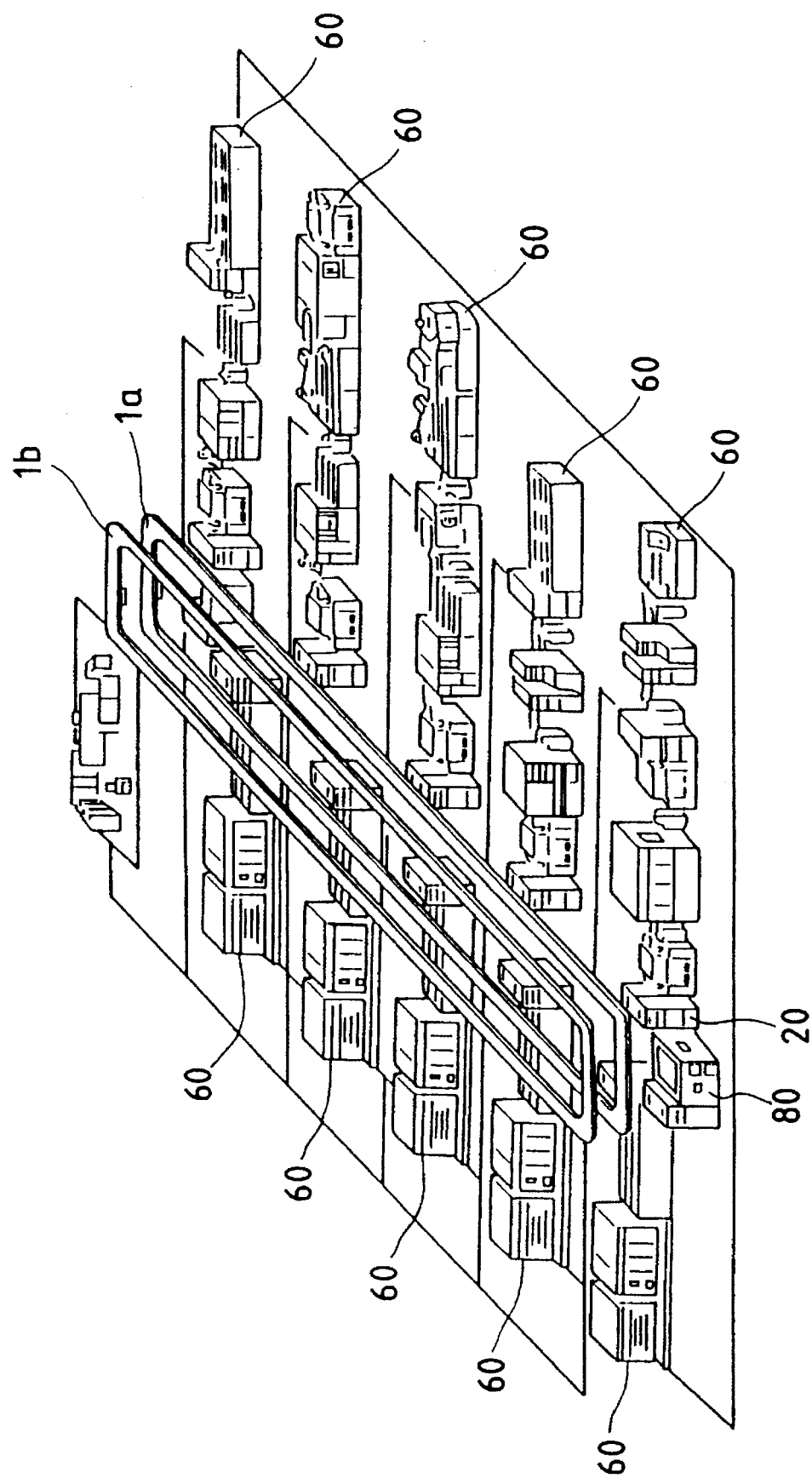
FIG. 52 is an entire structural view of a modified embodiment 18.
Figure 53:
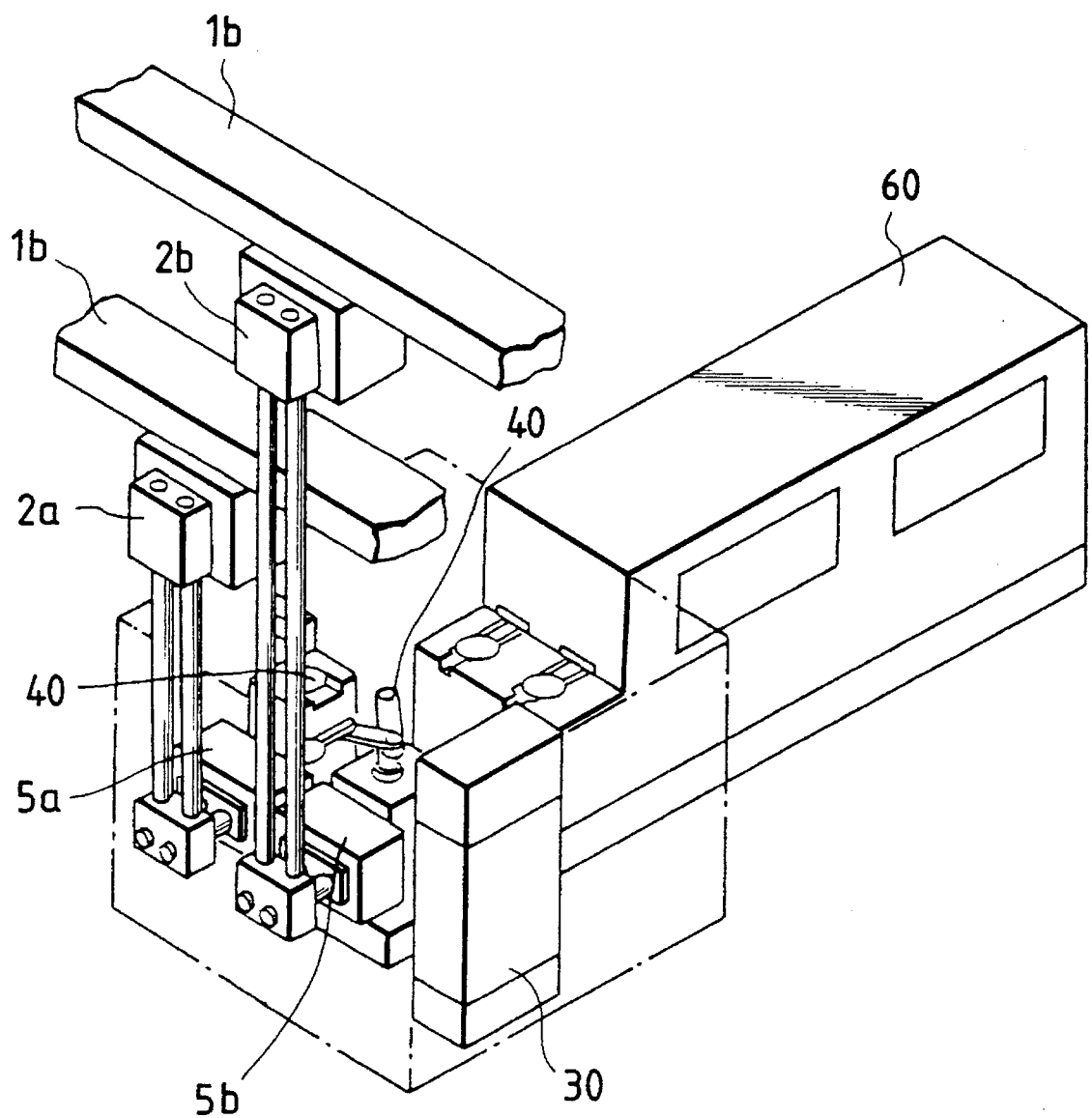
FIG. 53 is a structural view of a wafer delivery unit of a modified embodiment 18.

While in the FIG. 1 embodiment, only one track-like rail 1 is provided in the central portion, an embodiment provided with a plurality of carriage rails is shown in FIGS. 52 and 53.

In this embodiment, a further track-like carriage rail 1b is provided in parallel with the carriage rail 1a shown in FIG. 1 so that several carriages 2 are made to travel. The number of wafers are determined according to the urgency of carriage of wafers. At this time, the number of carriages 2 provided on the carriage rail 1 is such that fewer carriages for carrying wafers with high urgency are provided.

With this arrangement, a wafer with high urgency can be immediately carried without affecting other wafers. The processing apparatus 60 thus need not wait so long until the wafer is carried.

It is noted that a plurality of track-like carriage rails 1 can be provided so that the carriage rails are made to correspond to product groups, respectively, to thereby limit the wafer delivery units 20 at which a respective carriage 2 in the rail 1 stops.

(5.19 Modified embodiment 19)

Instead of the cassette-to-cassette system shown in FIG. 47, an embodiment in which wafers are carried in a cassette unit normally specified without using an IC card, and the processing apparatus in which the cassette and single wafer are employed for production will be described.

In the structure not provided with the data write/read device 245, when the carriage 246 carries a wafer to a suitable cassette delivery unit 240, the cassette transfer robot removes a cassette from the cassette carriage box of the carriage 246 to set it to the cassette storage box 243. Where the loader portion 61 of the processing apparatus 60 corresponds to the cassette, the cassette is set to the loader portion 61 by the cassette transfer robot 244 and wafers within the cassette are successively processed by the processing apparatus 60. Upon termination of processing, wafers are received into the cassette set in advance to the unloader portion 62, and when a predetermined number of wafers corresponding to one cassette have been processed, the cassette is set from the unloader portion 62 to the cassette storage box 243 by the cassette transfer robot 244.

In the case of the processing apparatus 60 in which the loader portion 61 corresponds to a single wafer, a gripper of the cassette transfer robot 244 is automatically changed to a gripper for wafer from a gripper for cassette in order to remove a wafer from the cassette set to the cassette storage box 243. When the wafer is set to the loader portion 61 and processing is terminated, the wafer is received into the cassette set to the cassette storage box 243 from the unloader portion 62 by the wafer gripper of the cassette transfer robot until a predetermined number is reached. When the carriage 246 arrives, the cassette transfer robot 244 changes to the cassette gripper, which is put on the carriage 246 and carried to the next process.

With this arrangement, the existing cassette can be advantageously used.

The line construction is provided with a wafer delivery unit comprising a carriage with a wafer loaded thereon which is carried between processing apparatuses on a track-like carriage rail, a transfer robot for transferring a wafer between the carriage and the processing apparatus, a storage box for temporarily storing wafers one by one by product group and process, and a discriminator for identifying a wafer number of a wafer, whereby wafers can be managed one by one, a variety of products can be simultaneously produced, the flow of a wafer can be controlled by management of inventory wafers in the storage box, and availability of the processing apparatus can be improved. As a further effect, the quantity of inventory can be reduced so that production to meet demand can be achieved in a short lead time.

A wafer number is described on the wafer itself, and the wafer that is moved out of the processing apparatus is identified by the discriminator, whereby the progress of wafers one by one can be confirmed. Therefore, the progress management of a wafer can be easily made, and a variety of wafers can be produced in the order according to the demand.

In the structure of the processing apparatuses, processing apparatuses for several processes are connected in a hard manner to form an integrated processing apparatus whereby the amount of management from the charge to termination of processing is reduced to reduce the amount of control. Furthermore, since the number of carriage processes of the processing apparatus is reduced, the distance of carriage and lead times thereof are reduced to shorten the period of production.

Wafers can be stored by the storage box for storing wafers according to demand, and later charged into the processing apparatus by product group and process for each wafer. Therefore, the availability of the processing apparatus can be improved, and wafers can be managed one by one. The discriminator can grasp the actual state of progress of wafers in real time, and therefore production with less lead time and less quantity of inventory can be achieved.

In the clean structure, a wafer is put into the carriage box and closed during carriage, and after termination of charge or processing by the processing apparatus, it is loaded on the carriage. Therefore, when the wafer is temporarily stored, it is put into the clean box whereby the atmosphere of the operator can be separated from that of the wafer to thereby enhance the yield, and the clean portion can be minimized to save cost and facilitate maintenance. Moreover, since the work area of the operator can be secured, the maintenance of the processing apparatus is easily accomplished.

In the carriage unit, even when a wafer is carried, or even when a wafer having been charged or processed by the processing apparatus is loaded on the carriage, wafers are stored in a single unit. Thus, where the wafer can be always grasped in a single unit. Therefore, management of a single wafer which is faithful to real time can be performed. In addition, production for a variety of products in small quantity can be carried out.

Wafers may be loaded on or unloaded from the carriage when necessary by a predetermined wafer delivery unit while moving around and on the track-like rail. Therefore, the total carriage distance becomes reduced to render the control of the carriage easy.

Since wafers are managed and carried in a single unit, it is possible to flexibly respond to a change in product.

In the flow of a wafer, products of which the process order is of the same category are grouped, the standard quantity of inventory by product group and process is calculated with respect to wafers to be inventoried on the storage box and the wafers are charged from the storage box to the processing apparatus so that the actual quantity of inventory of wafers coincides with the standard quantity of inventory, and the wafers are carried to the next process by the carriage, whereby the order of flowing the wafers can be easily controlled. Therefore, production which is faithful to the production plan can be achieved.

Furthermore, since the control of flow of wafers one by one can be made, a variety of products, and even products which involve many repeated processes and are complex can be easily managed and a variety of products can be simultaneously produced. Moreover, since the progress between processes can be controlled in real time, the minimum quantity of inventory with a deviation between processes anticipated results, thus reducing the quantity of inventory.

In the charging order, the charging order in a single unit is determined in accordance with the demand, and this order is controlled to be observed whereby the production in the demanded order can be achieved. Therefore, the production plan need not be corrected to proceed with the plan, thus satisfying cost, quality and lead time requirements.

(5.20 Modified embodiment 20)

One embodiment of the present invention will be described with reference to FIGS. 54 to 64.

Figure 54:
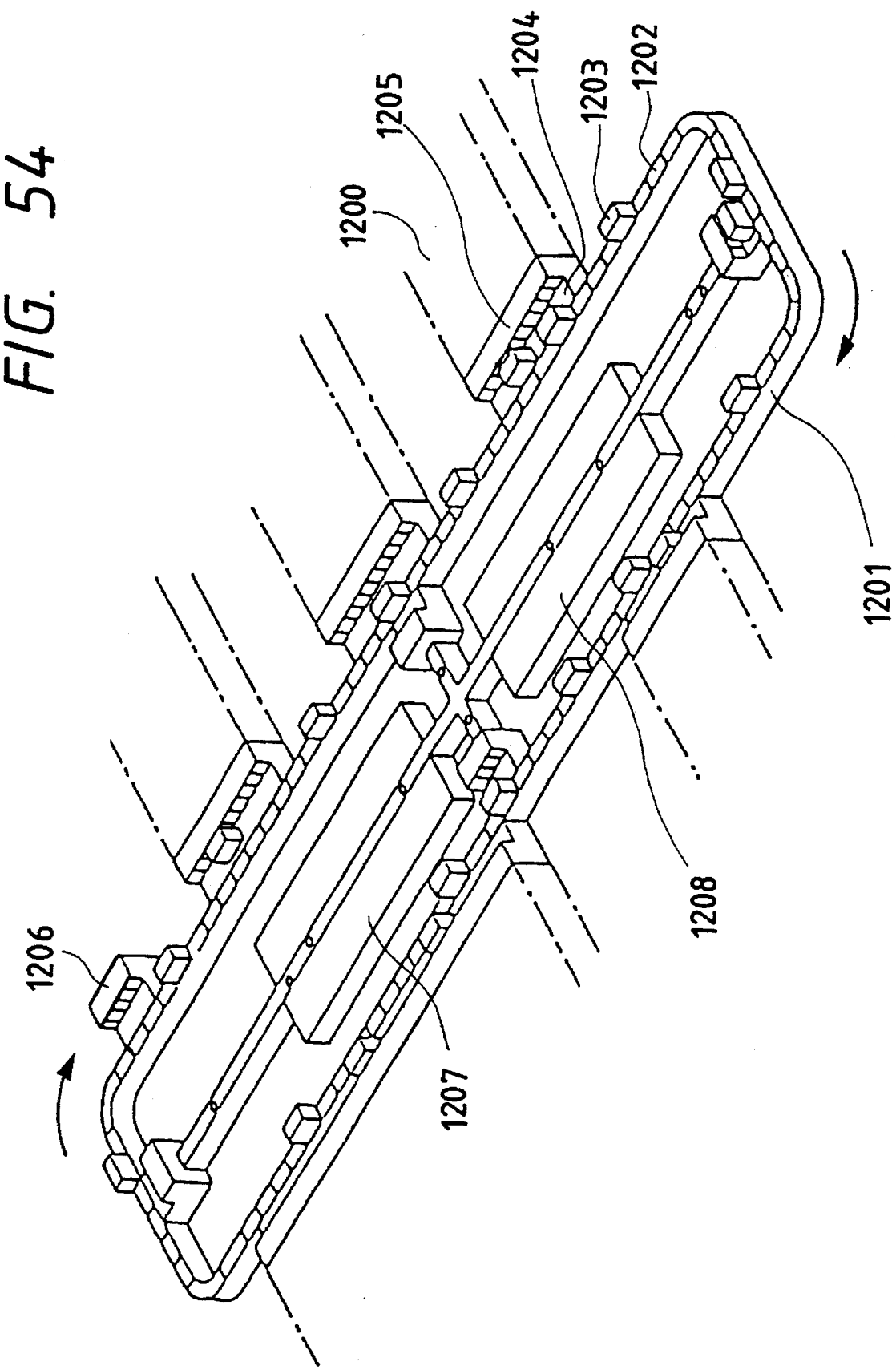
FIGS. 54 to 56 are views showing the entire structure of a concentrated type carriage of a variety of products.
Figure 55:
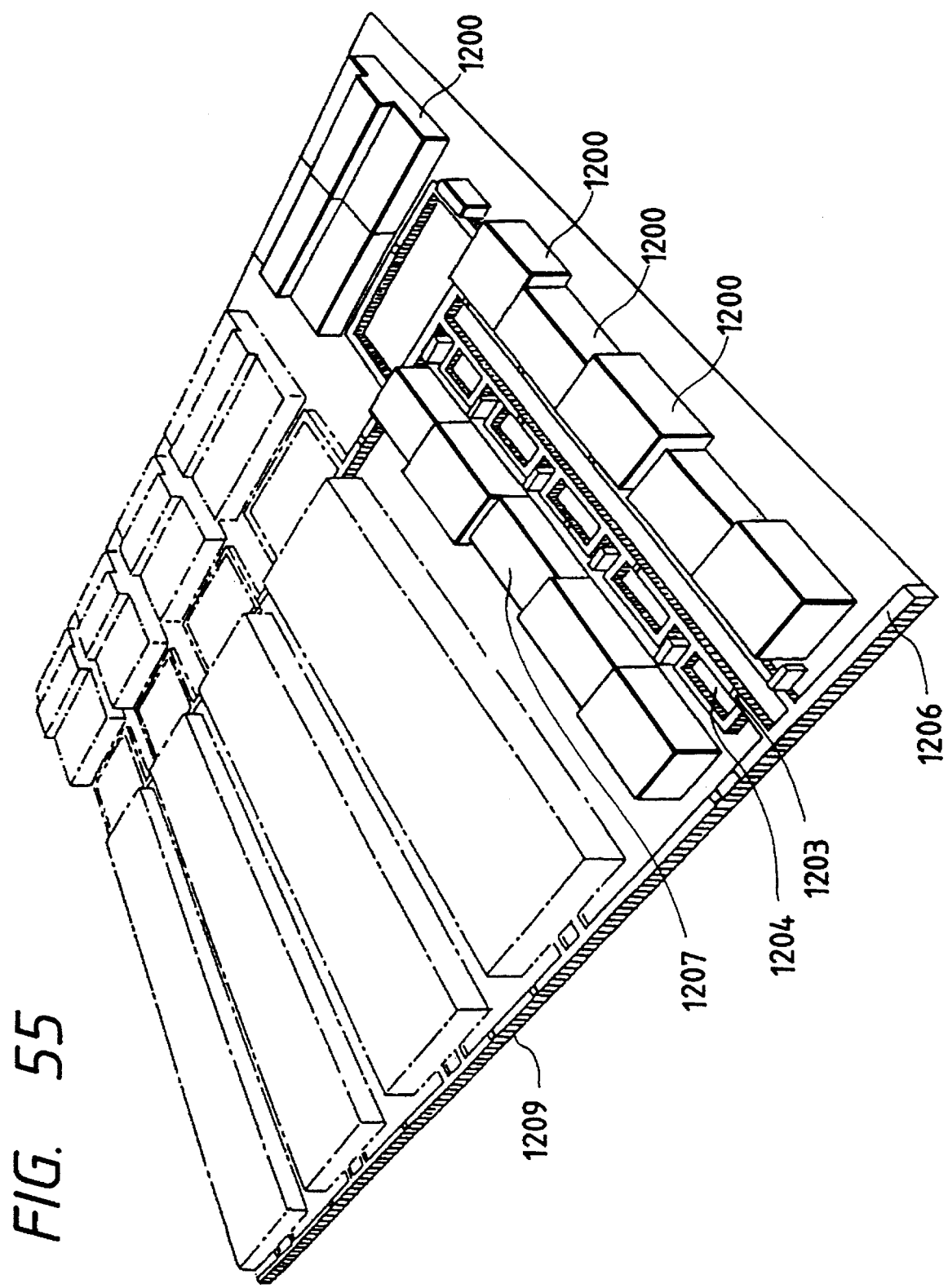
Figure 56:
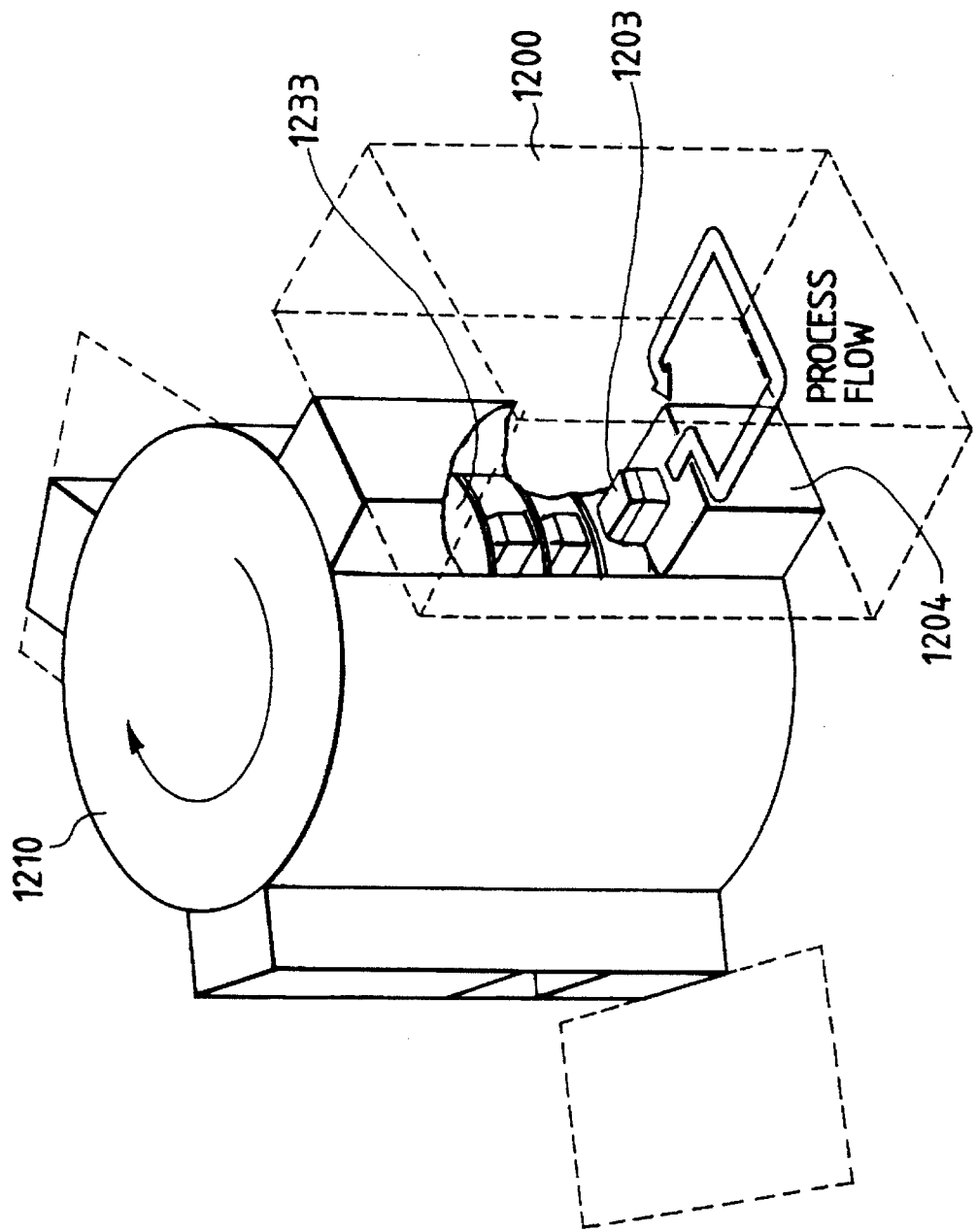

FIGS. 54, 55, and 56 show an example of the entire structure of a concentrated carriage system for a variety of products. In FIG. 54, a duct conveyor concentrated type varied-product carriage system 1201 rotating at constant continuous speed is provided in the form of a loop. In the periphery of the carriage system 1201 arranged in the form of a loop is arranged a group of processing apparatuses 1200 for such processes as photoresist, film formation, implant, etching, etc. There are further provided a temporary storage warehouse 1208 for storing products when abnormal conditions occur in product or equipment, and a product inspection/analyzing chamber 1207 for clearing up the cause of the abnormality.

When a cassette (product) 1203 containing material (wafers) is charged from a charge-outlet 1206, it is set to an incorporated type carriage jig 1202 of the carriage system 1201. When the cassette arrives immediately before the processing apparatus 1200, it is branched from the carriage system 1201 by a merging and branching device 1204 which can simultaneously respond to one or more units. The branched cassette 1203 is set to the processing apparatus by a cassette delivery mechanism 1205. The speed of the carriage system is determined according to an average charging interval of the number of cassettes (products) to be processed per day, for example. The cassette 1203 is placed on the empty carriage jig of the carriage system 1201 by the merging and branching apparatus 1204 so that the cassette may be carried by the cassette delivery mechanism 1205 to the next process, and is carried to the processing equipment in the next process.

FIG. 55 shows an example in which the processing method is classified into a plurality of processes, and the processing apparatuses are arranged in the classified unit according to the necessary number of the classified processes. This is the case of using a belt conveyor concentrated type varied-product carriage system 1209 which likewise rotates at a constant speed as compared with the duct conveyor concentrated type varied-product carriage system 1201 which rotates at a constant speed without being accelerated. The processing apparatuses are arranged in the order of processes, and the apparatuses are merely moved several times to complete the process in a unit, and the cassette (product) 1203 is prevented from being moved backward in the classified unit whereby the distance of carriage and repeated times can be reduced.

FIG. 56 shows an example in which the belt conveyor concentrated type varied-product carriage system 1209 shown in FIG. 55 is modified to be an automatic warehouse concentrated type varied-product carriage system 1210, in which system 1210, a plurality of managing boxes 1233 are provided rotatably and vertically whereby the inventory can be concentratedly managed. This is suitable in the case where the apparatus is small-sized and integrated.

Figure 57:
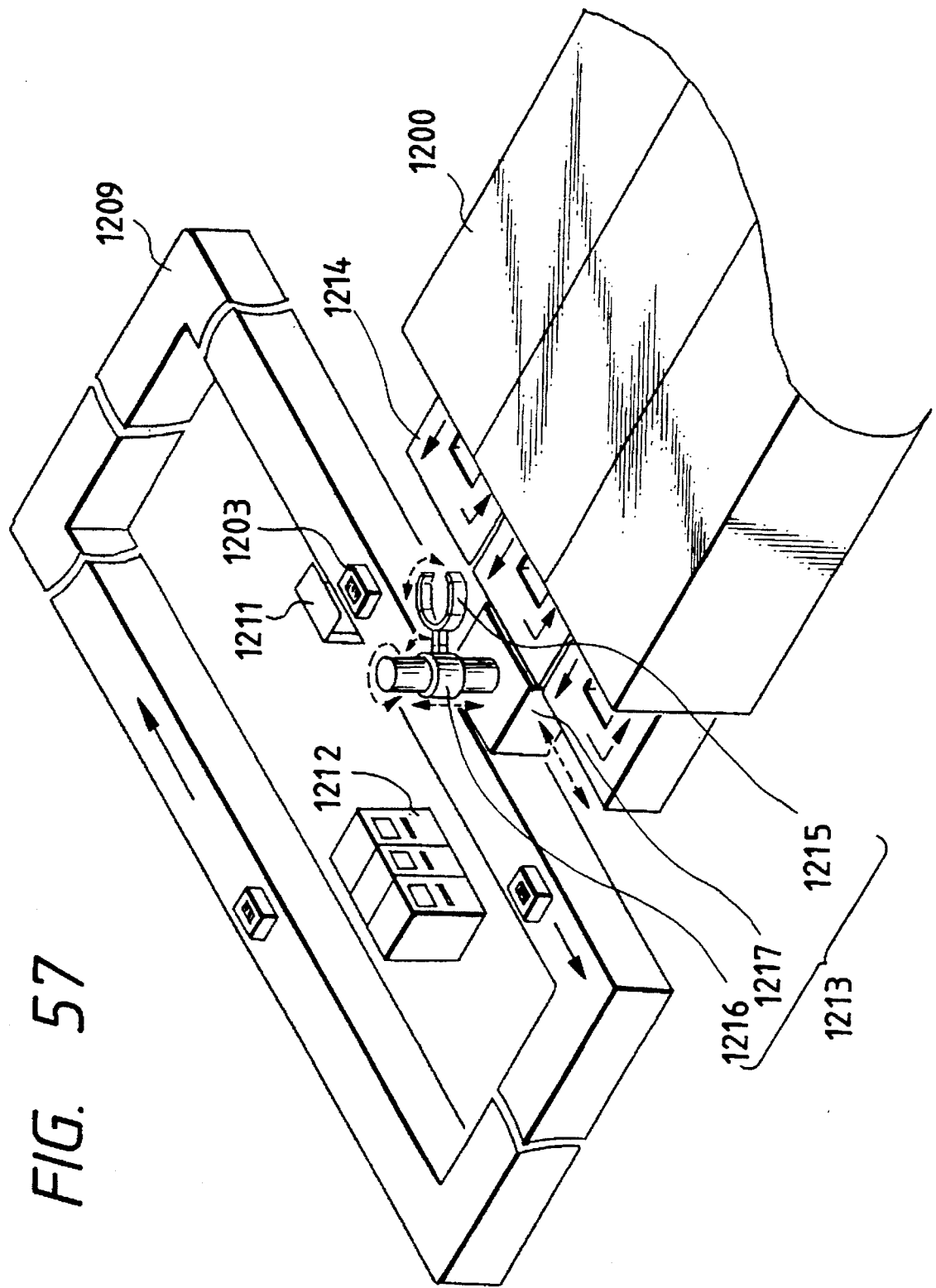
FIG. 57 is a view showing a synchronized carriage mechanism with a robot.

FIG. 57 shows a non-stop varied-product carriage method (hereinafter referred to as the non-stop carriage example) in which a cassette delivery device 1203 exclusive of a device 200 such as photoresist is provided on the belt conveyor concentrated type varied-product carriage system 1209 using a robot. The cassette (product) 1203 on the belt conveyor concentrated type varied-product carriage system 1209 which rotates while maintaining constant and continuous speed is read by a cassette identifier device 1211, and in case of equipment for said process, a line controller 1212 issues a process start command to a synchronous type cassette delivery robot 1213. The robot 1213 which has received the command grips the cassette (product) 1203 while maintaining the same speed as that of the varied-product carriage system 1209 to deliver it to the cassette delivery device 1204.

Upon completion of processing the cassette (product) 1203, the cassette on the cassette delivery device 1214 is delivered to the varied-product carriage system 1213 by the synchronous type cassette delivery robot 1213 while maintaining the speed of the varied-product carriage system 1213 and sent to the next process. Where the cassette (product) 1213 is removed while adjusting to the speed of the varied-product carriage system 1209, a position at which the cassette can be gripped by an elevating portion 1216 of the robot 1213 is adjusted, and the cassette is gripped and removed while maintaining the carriage speed of the varied-product carriage system 1209 by a hand portion 1215 having a mechanism of more than two shafts. A moving portion 1217 is moved laterally to send the cassette (product) 1203 to the cassette delivery device 1214 frontwardly of the apparatus capable of being processed.

Figure 58:
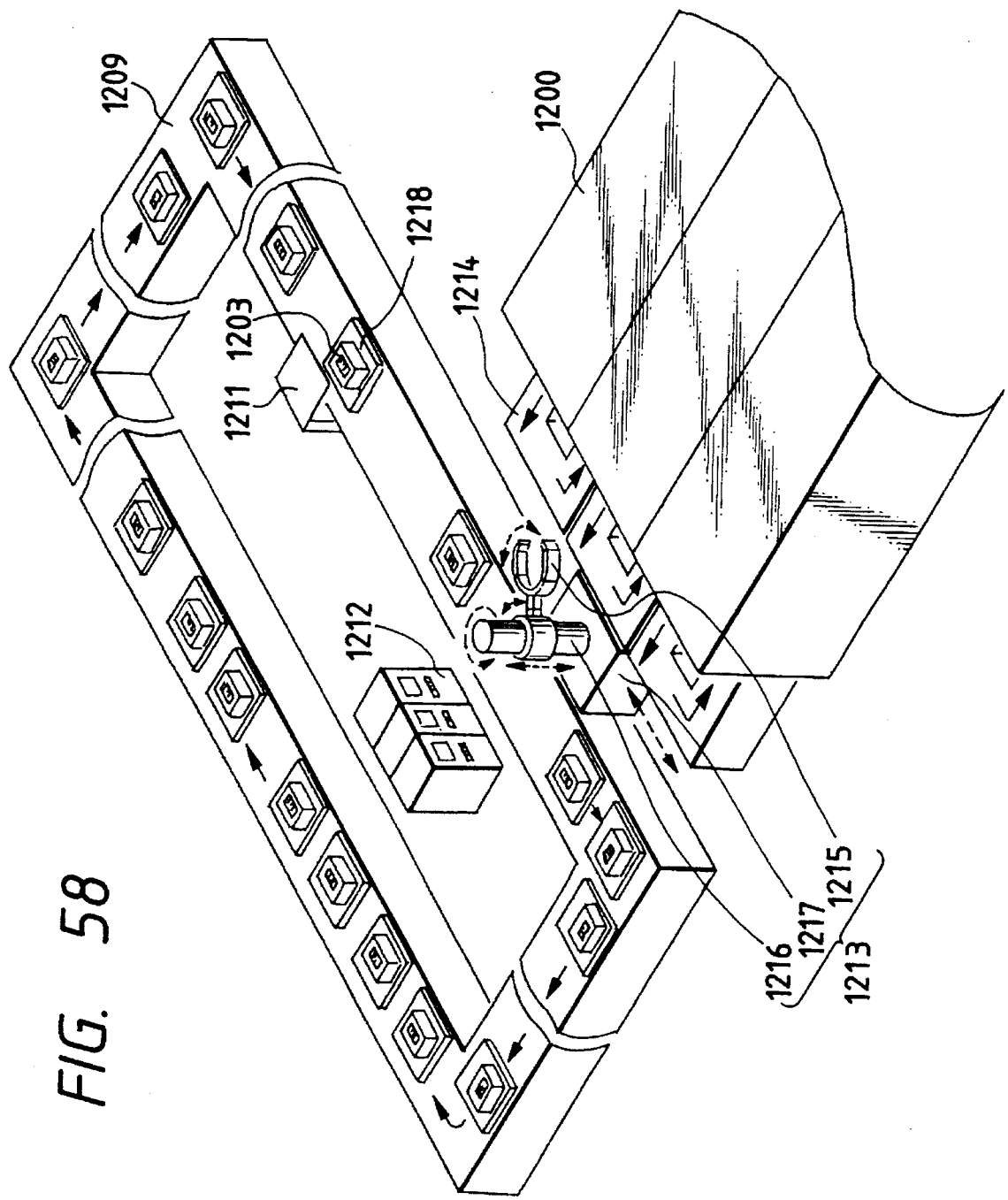
FIG. 58 is a view showing a synchronized carriage mechanism with a carriage jig and a robot.

FIG. 58 shows an example in which a carriage jig 1218 is utilized. In this case, cassettes may be of circular, square, polygonal or the like, and this is suitable for the case where wafers in number corresponding to the number of processes of equipment are prepared.

Figure 59:
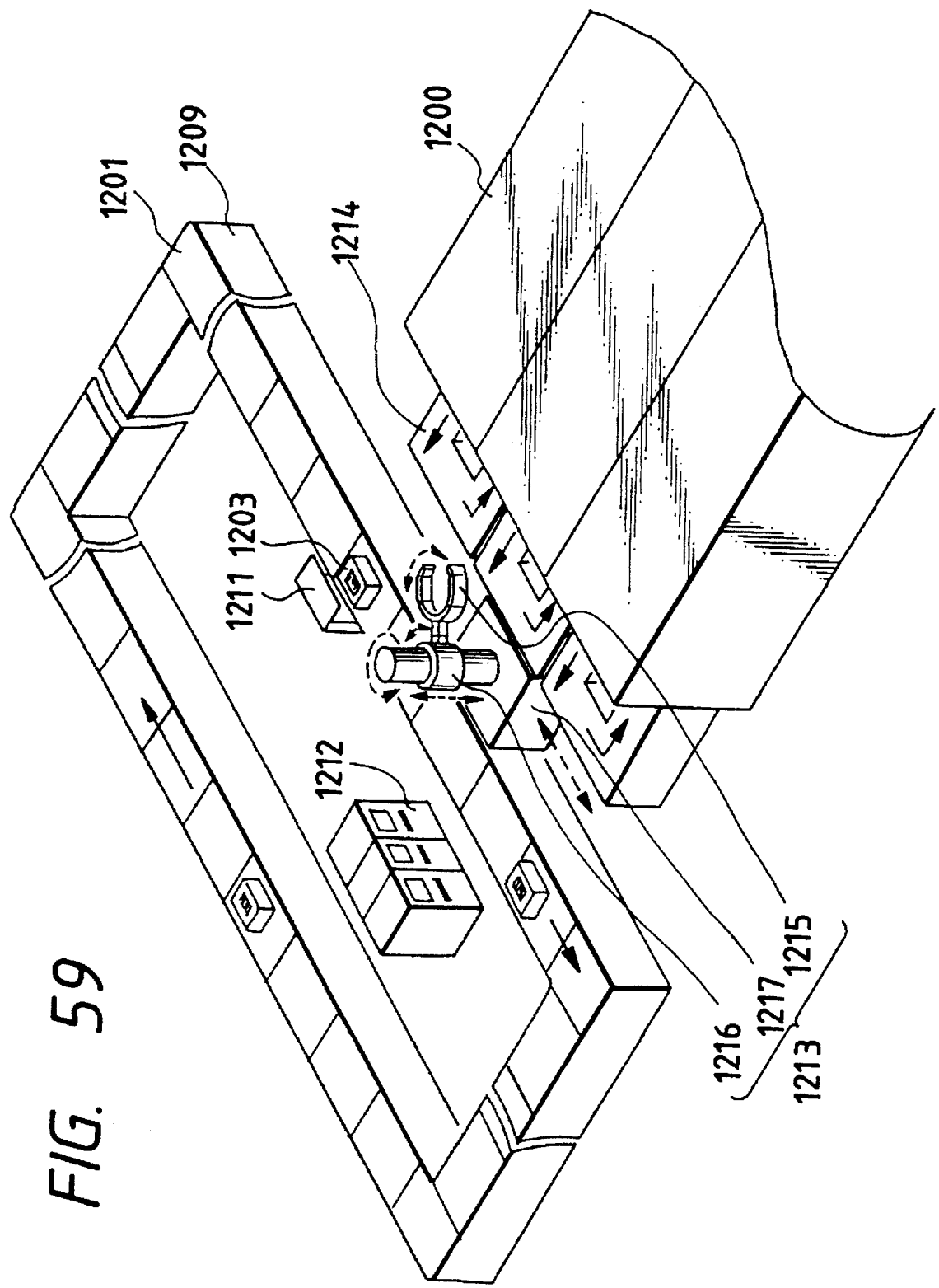
FIG. 59 is a view showing a synchronized carriage mechanism with an incorporated type carriage jig.

FIG. 59 shows an example of a duct conveyor varied-product carriage system. In this case, management of the carriage jig 1218 as shown in FIG. 58 is not necessary.

Figure 60:
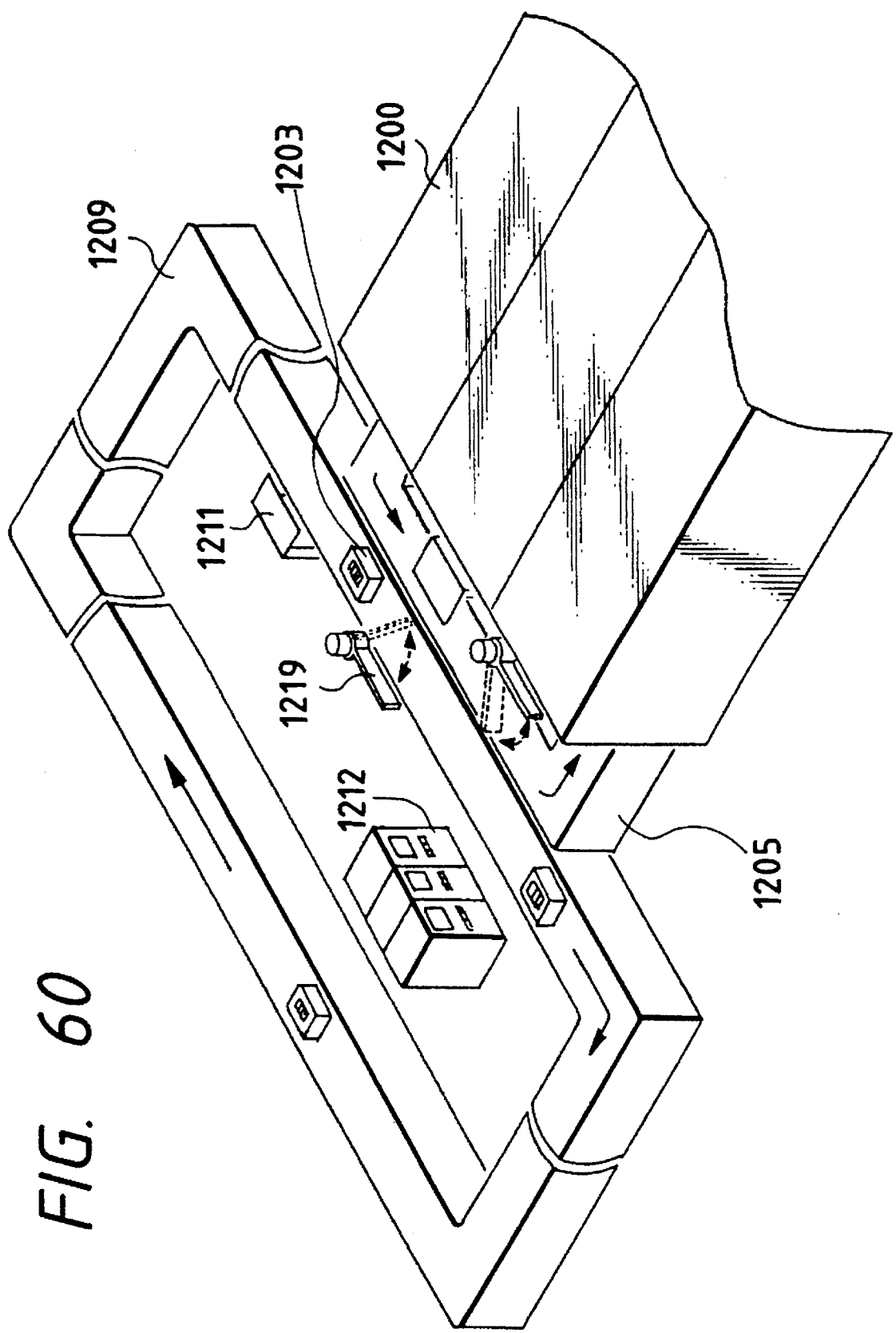
FIG. 60 is a view showing a synchronized carriage system with a branch guide.

FIG. 60 shows an example which has a branch and merging mechanism 1219 in which the cassette (product) 1203 is slidably moved on the varied-product carriage system 1209 and fed to the cassette delivery mechanism 1205 which can distribute cassettes (products) to a group of equipment. This branch and merging mechanism 1219 may be of the pusher type in addition to the slide type as shown.

Figure 61:
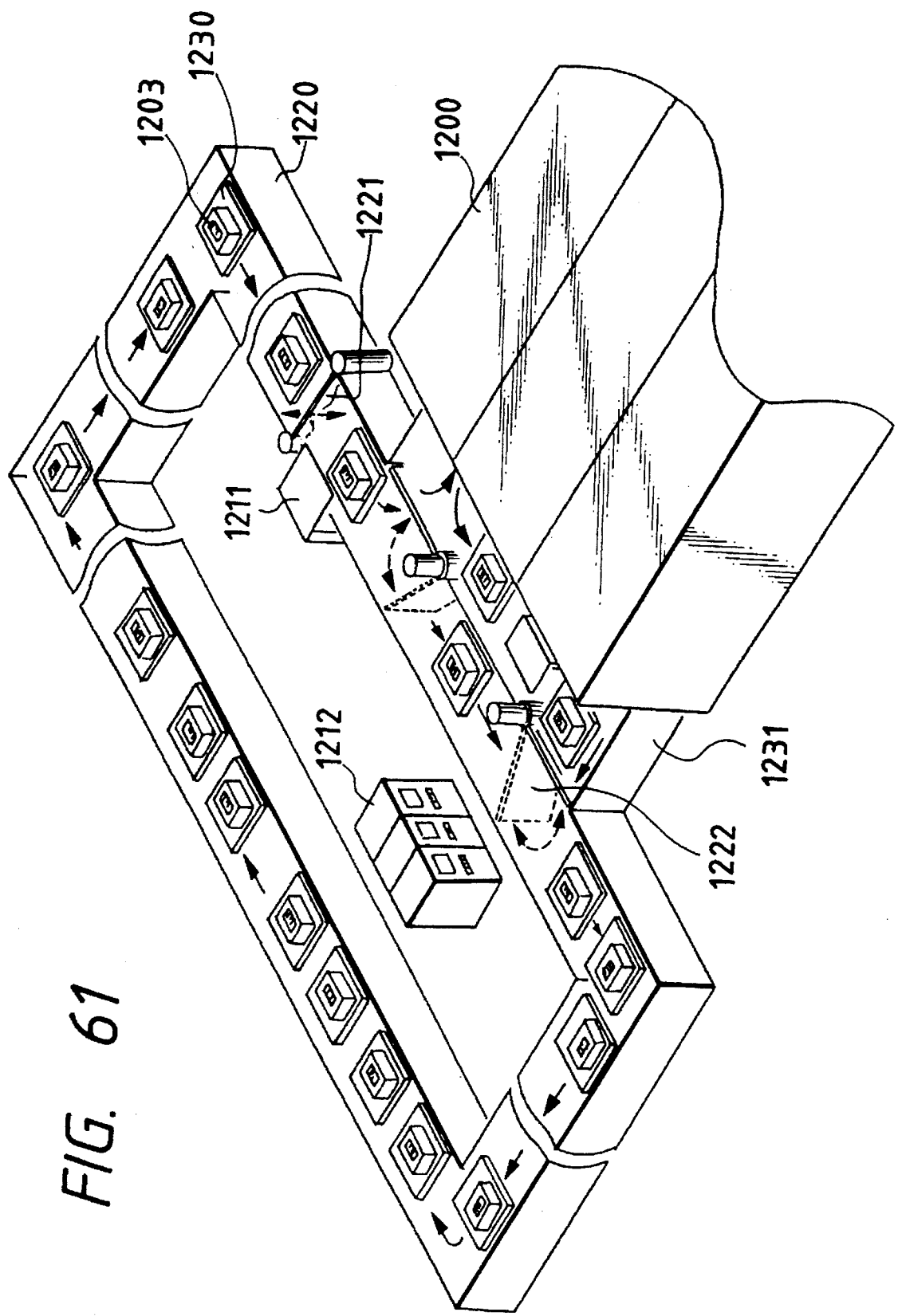
FIG. 61 is a view showing a synchronized carriage mechanism making use of a liquid.

FIG. 61 shows a synchronized carriage mechanism 1220 making use of fluid. The cassette (product) 1203 on the floating type carriage jig 1230 floating on water or the like is read by the cassette identifier device 1211, and in case of equipment for said process, a flow of a group of cassettes (products) being carried is stopped by a stopper 1211. A flow cutoff device 1222 for branch and merging changes direction to guide the cassette in a direction having a liquid type cassette delivery mechanism 1231. The processed cassette is merged with the synchronized carriage mechanism 1220 by the cutoff device 1222 as shown. The synchronized carriage mechanism 1220 is to move a floating type carriage jig 1230 by flowing liquid such as water or mercury at a constant speed in a constant direction, and a liquid type cassette delivery mechanism 1231 also causes the cassette to flow in the same direction.

Figure 62:
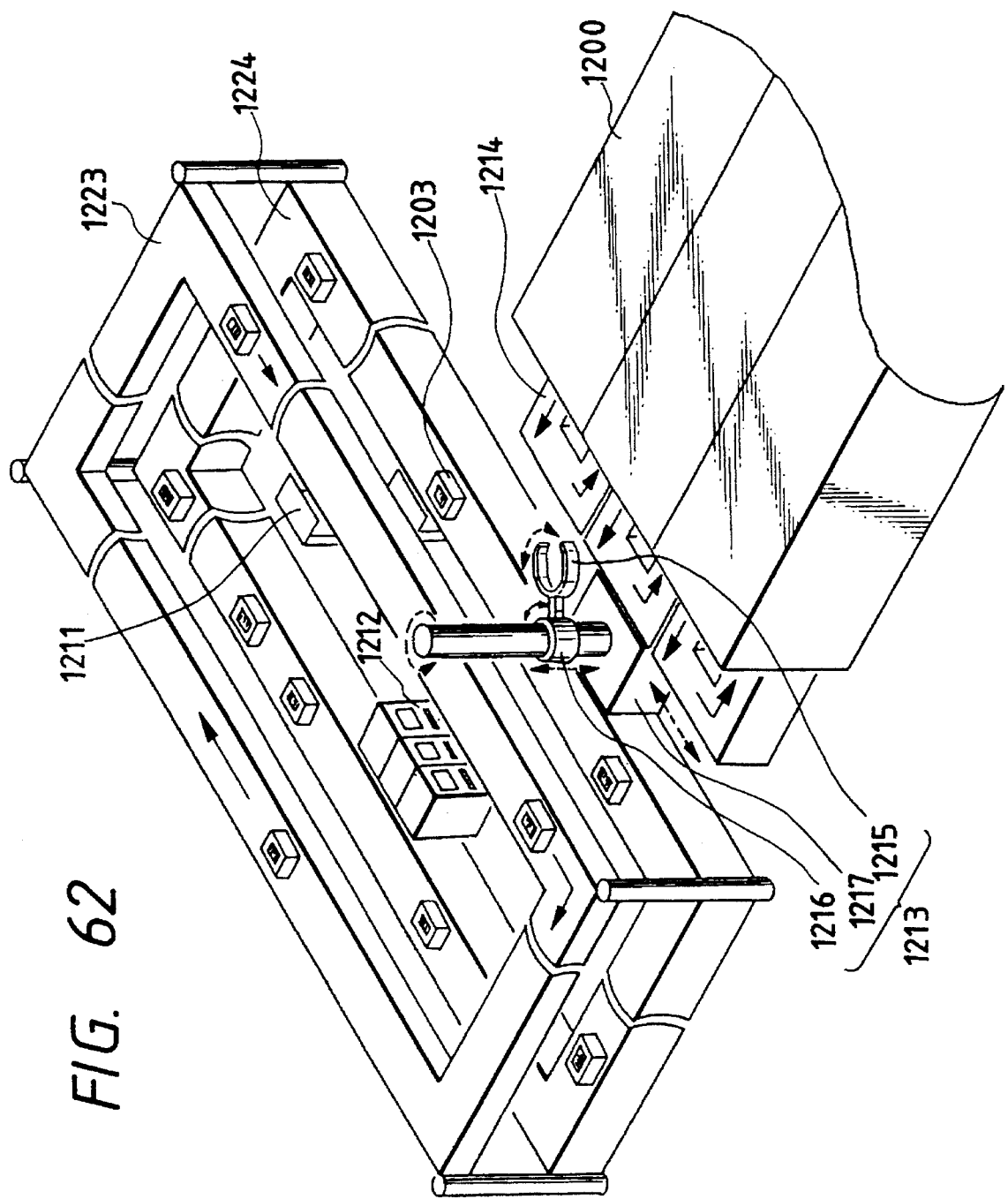
FIG. 62 is a view showing a synchronized carriage mechanism of a laminated type.

FIG. 62 shows an example of a laminated type synchronized carriage mechanism which comprises an upper laminated type concentrated type varied-product carriage system 1223 and a lower laminated concentrated type varied-product carriage system 1224 provided directly below the upper system 1223. This case is effective in that concentrated type varied product carriage systems laminated from second-story layer to n-layer are classified according to whether they correspond to an urgent product, normal product, trial product or volume product, and a base process or a wiring process area to divide the cassette (product) 1203 for management.

Figure 63:
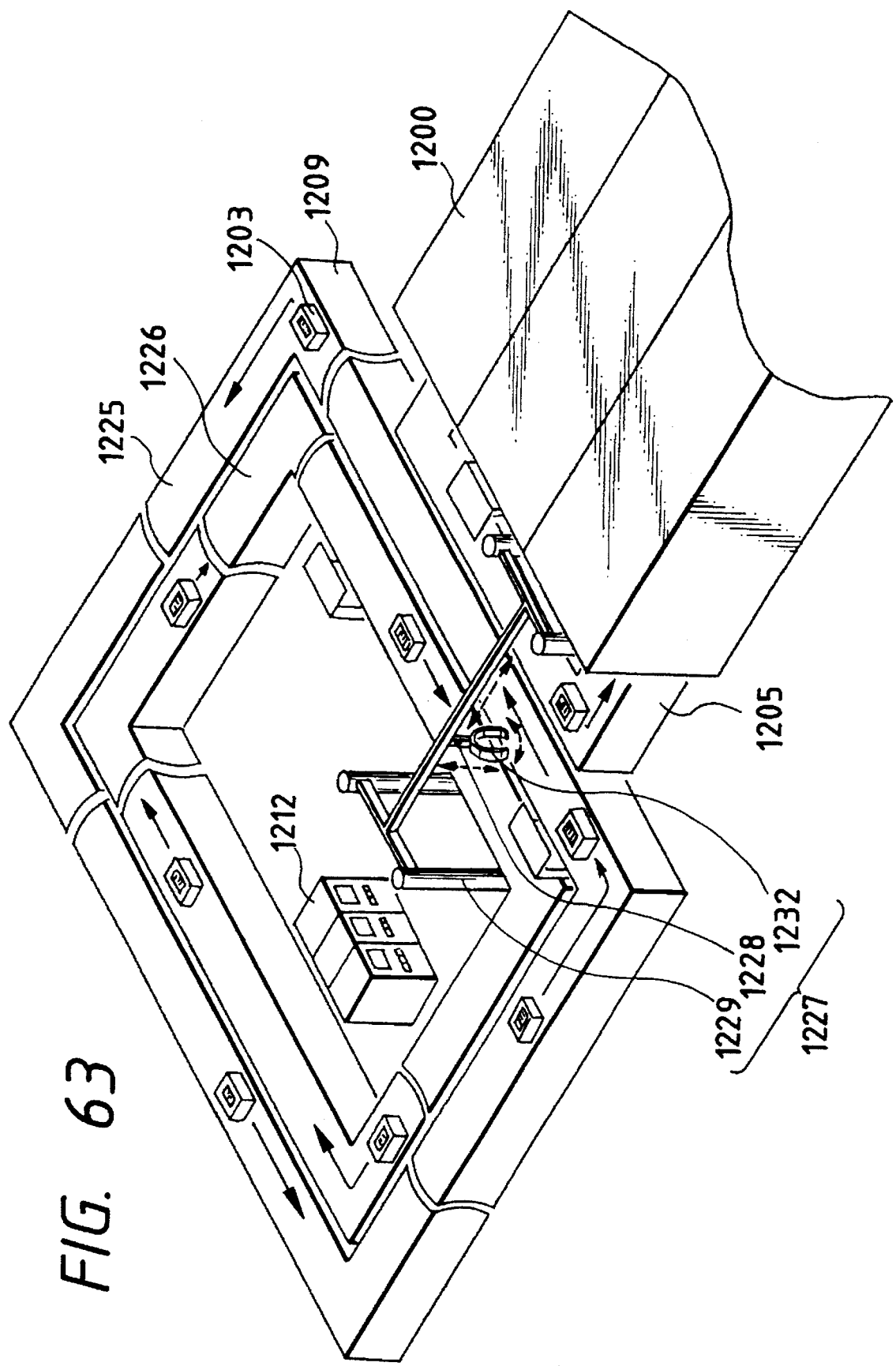
FIG. 63 is a view showing a synchronized carriage mechanism of a bidirectional type.

FIG. 63 shows an example of a bidirectional concentrated type varied-product carriage system, which is effective in case of shortening the carriage time in addition of the method of utilization shown in FIG. 62. The system in FIG. 63 comprises a clockwise conveyor concentrated varied-product carriage system 1225 and a counterclockwise conveyor carriage system 1226. When the cassette (product) is carried, it is gripped by a suspended type cassette hand 1227 to supply it toward the apparatus. In this mechanism, a moving portion 1228 and a hand portion 1232 are supported by a support column 1229 to grip the cassette while confirming the place and position thereof.

Figure 64:
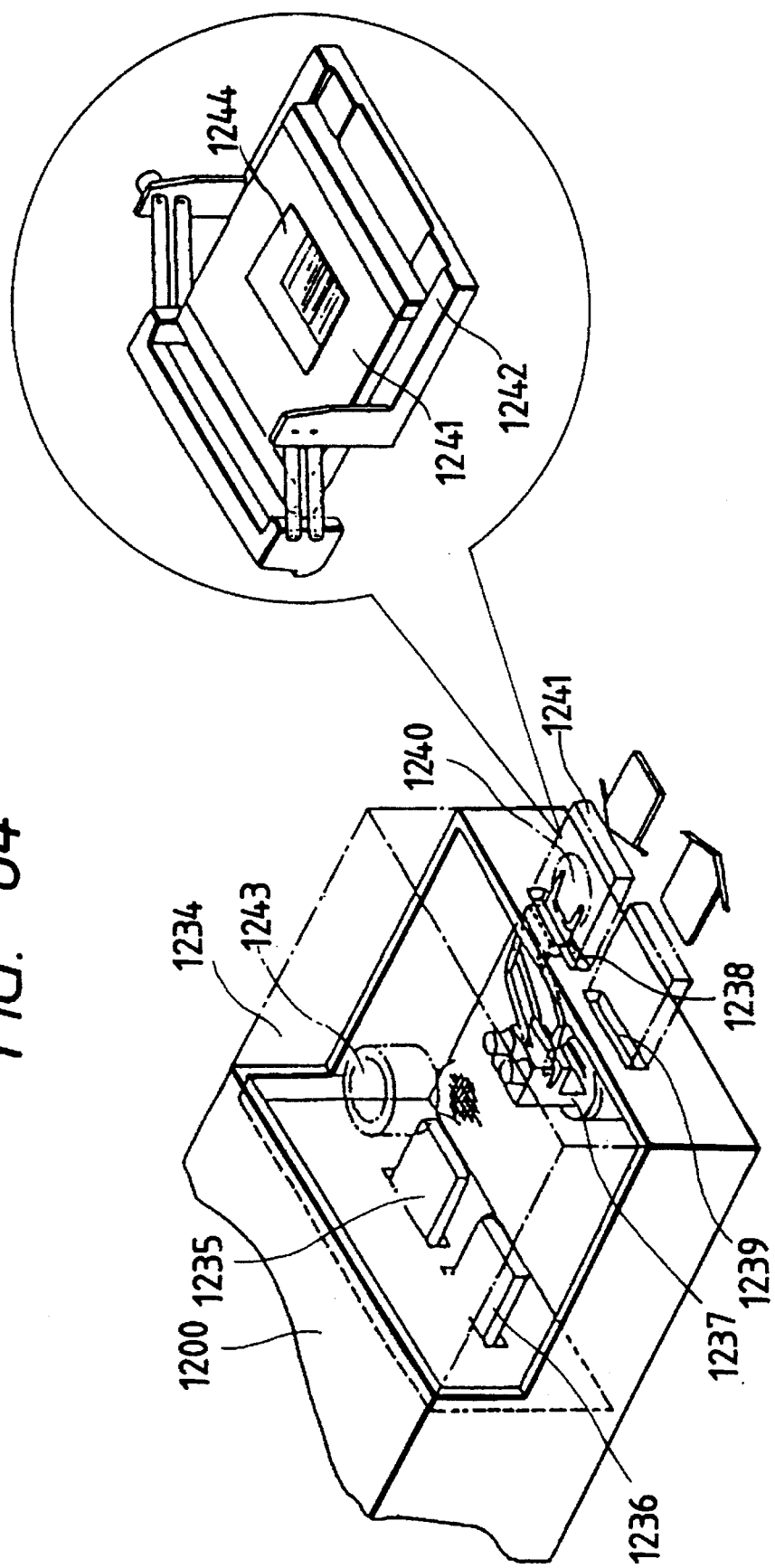
FIG. 64 is a view showing a wafer attach/detach mechanism.

FIG. 64 shows an example of a mechanism for attaching and detaching a wafer to the apparatus. The cassette fed by the varied-product carriage system is carried to the processing apparatus. For example, a bar code type IC card 1244 with a lot identifier indicated by a bar code is embedded in and set to a slide type cassette 1241 having an opening. When the cassette 1241 arrives at a predetermined position, it is forced into a slide guide 1242 by means of a pusher or the like. The thus forced cassette 1241 is automatically opened at its opening and locked to a wafer receiving opening 1238 of a clean box 1234. Wafers 1240 within the cassette 1241 are orderly removed by a wafer charger 1237 and sent to a loader 1235 of the apparatus 1200. On the other hand, the emptied cassette 1241 is removed from the clean box 1234 by means of a pusher or the like and stored in the vicinity of the apparatus 1200.

Upon termination of processing the cassette 1241, it is locked to the wafer outlet 1239 of the clean box 1234. When the cassette 1241 is locked, the processed wafer is fed to the unloader 1236 of the apparatus 1200, and therefore, the wafers are successively stored into the cassette 1241 locked to the wafer outlet 1239 by the wafer charger 1237. When all the wafers have been stored, they are again removed from the clean box 1234 and fed to the next process.

Here, clean air being always applied with constant pressure is supplied into the clean box 1234 from the inlet 1243, in order to secure cleanliness on the surface of the wafer 1240, and to maintain the cleanliness of the clean box 1234. With respect to the lot record, actual results are written on the IC card in bar code format by making use of light, wireless or wire techniques, and tracking and actual results for the lot can be recorded to simultaneously move it to the next process.

According to the present invention, in the line having approximately 80 kinds and 150 units of equipment, in case of finely processed products which require long work times, the quantity of inventory in the line can be controlled in sum total. Therefore, the (work) waiting time can be considerably reduced to greatly reduce the lead time by (½ to ⅓, for example). With the considerable reduction in lead time, the yield can be also improved.

This system is preferably applied to shops peculiar to fine processing, and can be also applied to thin-walled products.

What is claimed is:

1. An apparatus for carrying a variety of products comprising:

carriages having carriage boxes for transferring plural kinds of wafers one by one and isolating the wafers to be transferred from an external atmosphere to carry the wafers;

a loop-like carrying rail on which said carriages travel; and a charge-removal device for charging raw wafers into said carriages and removing wafers transferred on said carriages and already subjected to all the processing processes;

an equipment module comprising:

a processing apparatus for processing one process or plural processing processes for wafers;

storage boxes for temporarily storing wafers by product groups and processes one by one;

a discriminator for discriminating a wafer number comprising at least a product number and a serial number of a wafer written on the wafer;

transfer devices for receiving and delivering the wafers among said carriage, said processing apparatus, storage box, and said discriminator; and a wafer delivery unit including said transfer device, said storage box and said discriminator, which are surrounded by clean boxes to maintain the interior at a clean atmosphere isolated from the external atmosphere, said wafer delivery unit being connected to said processing apparatus to mediate the delivery of wafers between said carriage and said processing apparatus;

a plurality of kinds and units of said equipment module serving as a fundamental unit being arranged to be connected to the circumference of said carrying rail; and a host controller for collectively controlling, through a communication network, controllers which hold a process flow data indicative of process numbers in accordance with a process order by product groups collectively including products in which the process order and the processing conditions belong to the same category to manage inventory data by product group showing the quantity of inventory by product group and process, standard inventory data showing the quantity of standard inventory by product group and process, inventory data by apparatus showing the quantity of inventory for said storage boxes every processing apparatus of each of said equipment modules, and carriage data comprising at least product group, processing record and number of sheets of wafers being carried by said carriage, so as to determine the product group, the processing record, the number of sheets of wafers being carried by said carriage, so as to determine the product group, the processing record, the number of sheets and the charging order of the wafers delivered between the carriage and the equipment module to individually control said carrying system and a group of said equipment modules.

2. An apparatus for carrying a variety of products according to claim 1, wherein said wafer delivery unit is constituted by a united common interface unit corresponding to different processing apparatuses.

3. An apparatus for carrying a variety of products comprising:

a carriage having a box for transferring a cassette which holds at least one wafer and isolating the cassette to be transferred from an external atmosphere to carry the cassette;

a loop-like carrying rail on which said carriage travels; and a charge-removal device for charging the cassette which holds the wafer into said carriage and removing the cassette which holds the wafer transferred on said carriage and already subjected to all the processing processes;

an equipment module comprising:

a processing apparatus for processing one process or plural processing processes for wafers;

a storage box for temporarily storing said cassettes by product group and process;

a discriminator for discriminating a wafer number comprising at least a product number and a serial number of a wafer written on the wafer or a data write/read device for writing and reading cassette information added to the cassette;

a transfer device for receiving and delivering the cassettes between said carriage, said processing apparatus, said storage box, and said discriminator; and a cassette delivery unit including as constituent elements, said transfer device, said storage box and said discriminator, which are surrounded by a clean box to maintain the interior at a clean atmosphere isolated from the external atmosphere, said wafer delivery unit being connected to said processing apparatus to mediate the delivery of cassettes and wafers between said carriage and said processing apparatus;

a plurality of kinds and units of said equipment module serving as a fundamental unit being arranged to be connected to the circumference of said carrying rail; and a host controller for collectively controlling, through a communication network, controllers which hold a process flow data indicative of process numbers in accordance with the process order by product groups collectively including products in which the process order and the processing conditions belong to the same category to manage inventory data by product group showing the quantity of inventory by product group and process, standard inventory data showing the quantity of standard inventory by product group and process, inventory data by apparatus showing the quantity of inventory for said storage boxes every processing apparatus of each of said equipment modules, and carriage data comprising at least product group, processing record and number of sheets of wafers being carried by said carriage, so as to determine the product group, the processing record, the number of sheets and the charging order of the wafers delivered between the carriage and the equipment module to individually control said carrying system and a group of said equipment modules.

4. An apparatus for carrying a variety of products according to claim 3, wherein said wafer delivery unit is constituted by a united common interface unit corresponding to different processing apparatuses.

* * * * *